US007279265B2

(12) United States Patent
Momota et al.

(10) Patent No.: US 7,279,265 B2
(45) Date of Patent: *Oct. 9, 2007

(54) POSITIVE RESIST COMPOSITION AND PATTERN FORMATION METHOD USING THE SAME

(75) Inventors: Makoto Momota, Shizuoka (JP); Hajime Nakao, Shizuoka (JP)

(73) Assignee: FujiFilm Corporation, Tokyo (JP)

( * ) Notice: Subject to any disclaimer, the term of this patent is extended or adjusted under 35 U.S.C. 154(b) by 111 days.

This patent is subject to a terminal disclaimer.

(21) Appl. No.: 10/802,808

(22) Filed: Mar. 18, 2004

(65) Prior Publication Data

US 2004/0202954 A1 Oct. 14, 2004

(30) Foreign Application Priority Data

Mar. 27, 2003 (JP) ......................... P. 2003-088357
Mar. 27, 2003 (JP) ......................... P. 2003-089020

(51) Int. Cl.
*G03F 7/039* (2006.01)

(52) U.S. Cl. .............................. 430/270.1; 430/286.1; 430/322; 430/905; 430/910

(58) Field of Classification Search ................ 430/170, 430/270.1, 286.1, 322, 905, 910
See application file for complete search history.

(56) References Cited

U.S. PATENT DOCUMENTS

| | | | | |
|---|---|---|---|---|
| 6,579,659 | B2 * | 6/2003 | Uetani et al. | 430/270.1 |
| 6,835,527 | B2 * | 12/2004 | Takata et al. | 430/270.1 |
| 6,858,370 | B2 * | 2/2005 | Kodama et al. | 430/270.1 |
| 2001/0044070 | A1 * | 11/2001 | Uetani et al. | 430/270.1 |
| 2003/0017415 | A1 * | 1/2003 | Kodama et al. | 430/287.1 |
| 2003/0039918 | A1 * | 2/2003 | Takata et al. | 430/270.1 |
| 2003/0180659 | A1 * | 9/2003 | Takata et al. | 430/270.1 |
| 2004/0191676 | A1 * | 9/2004 | Nakao et al. | 430/270.1 |

FOREIGN PATENT DOCUMENTS

| | | | |
|---|---|---|---|
| JP | 10-254139 | A | 9/1998 |
| JP | 2001-142212 | A | 5/2001 |
| JP | 2002-229192 | A | 8/2002 |

* cited by examiner

*Primary Examiner*—Barbara L. Gilliam
(74) *Attorney, Agent, or Firm*—Sughrue Mion Pllc.

(57) ABSTRACT

A positive resist composition comprising (A) a resin capable of increasing its solubility in an alkali developer under action of an acid, wherein the resin contains a repeating unit originated in an acrylic acid ester derivative in an amount of 50 to 100 mol % based on all repeating units and has a repeating unit having a specific lactone structure and a repeating unit having a monohydroxyadamantane or dihydroxyadamantane structure, (B) a compound of generating an acid upon irradiation with actinic rays or radiation, and (C) an organic solvent, and a pattern formation method using the composition.

15 Claims, No Drawings

POSITIVE RESIST COMPOSITION AND PATTERN FORMATION METHOD USING THE SAME

FIELD OF THE INVENTION

The present invention relates to a positive resist composition for use in the production process of a semi-conductor such as IC, in the production of a circuit substrate of liquid crystal, thermal head and the like, and in other photofabrication processes, and a pattern formation method using the composition. More specifically, the present invention relates to a positive resist composition suitable for uses with an exposure light source of emitting light of 250 nm or less such as far ultraviolet ray or with an irradiation source of emitting electron beam or the like, and a pattern formation method using the composition.

BACKGROUND OF THE INVENTION

The chemical amplification-type positive resist composition is a pattern-forming material of forming a pattern on a substrate by producing an acid in the exposed area upon irradiation of radiation such as far ultraviolet light and due to a reaction using this acid as the catalyst, causing the active radiation-irradiated part and non-irradiated part to change in the solubility in a developer.

In the case of using a KrF excimer laser as the exposure light source, a resin having small absorption in the region of 248 nm and having a basic skeleton of poly(hydroxystyrene) is primarily used as the main component and this is an excellent system of forming a good pattern with high sensitivity and high resolution as compared with conventional naphthoquinonediazide/novolak resin systems.

In the case of using a light source of emitting light at wavelengths shorter than that, for example, in using an ArF excimer laser (193 nm) as the light source, a satisfactory pattern cannot be formed even by the above-described chemical amplification system because the compound having an aromatic group substantially has large absorption in the region of 193 nm.

In order to solve this problem, a resist containing a resin having an alicyclic hydrocarbon structure has been developed for use with an ArF excimer laser.

For example, Patent Document 1 (JP-A-10-254139 (the term "JP-A" as used herein means an "unexamined published Japanese patent application") describes use of a solvent comprising a mixture of a linear ketone and at least one member selected from a cyclic ketone, a propylene glycol monoalkyl ether acetate and an alkyl 2-hydroxypropionate with an attempt to provide a radiation-sensitive resin composition excellent in the transparency to radiation, dry etching resistance, film thickness uniformity, adhesion to substrate, sensitivity, resolution, developability and the like.

Patent Document 2 (JP-A-2002-229192) is proposing to use a specific compound having a cyclic sulfonium structure and a benzene or naphthalene ring as the radiation-sensitive acid generator with an attempt to provide a radiation-sensitive resin composition having high transparency to far ultraviolet ray and at the same time, excellent in the sensitivity, resolution, pattern shape and the like.

Patent Document 3 (JP-A-2001-142212) discloses a resist composition improved in the sensitivity, resolution, adhesion to substrate, and edge roughness of pattern, which is a composition containing a specific resin having an alicyclic structure and a specific solvent such as propylene glycol monomethyl ether acetate.

However, a fine pattern of 120 nm or less is very difficult to form by a contact hole process and application of a technique of shrinking the pattern by a thermal flow process is being studied. Those conventional resist compositions suffer from generation of cracking at the thermal flow process or have a problem in the dry etching resistance.

Also, various compositions using a resin containing an adamantyl group having a hydroxyl group have been heretofore proposed, but when these compositions are applied to the thermal flow technique, cracking is sometimes generated on the resist surface at the thermal flow baking.

[Patent Document 1]
JP-A-10-254139

[Patent Document 2]
JP-A-2002-229192

[Patent Document 3]
JP-A-2001-142212

SUMMARY OF THE INVENTION

Accordingly, an object of the present invention is to provide a positive resist composition reduced in the generation of cracking at the thermal flow process and excellent in the dry etching resistance, and a pattern formation method using the composition.

The present invention has the following constitutions and by these constitutions, the object of the present invention can be attained.

(1) A positive resist composition comprising:

(A) a resin capable of increasing its solubility in an alkali developer under action of an acid, wherein the resin contains a repeating unit originated in an acrylic acid ester derivative in an amount of 50 to 100 mol % based on all repeating units and wherein the resin has repeating units of at least one kind selected from repeating units represented by the following formula (IV) and repeating units having groups represented by the following formula (V-1), (V-2), (V-3) and (V-4); and repeating units represented by the following formula (AII), (B) a compound capable of generating an acid upon irradiation with actinic rays or radiation, and (C) an organic solvent comprising at least one solvent selected from a propylene glycol monoalkyl ether carboxylate, an alkyl lactate and a linear ketone; and a cyclic ketone:

(IV)

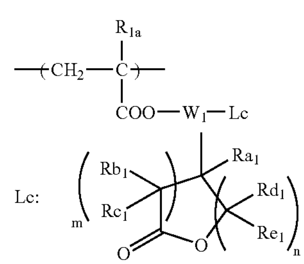

wherein $R_{1a}$ represents a hydrogen atom or a methyl group, $W_1$ represents a single bond or a divalent linking group, $Ra_1$, $Rb_1$, $Rc_1$, $Rd_1$ and $Re_1$ each independently represents a hydrogen atom or an alkyl group, m and n each independently represents an integer of 0 to 3, and m+n is from 2 to 6:

(V-1)

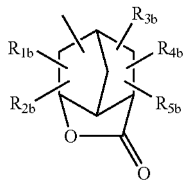

(V-2)

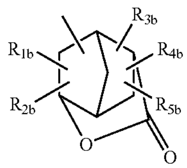

(V-3)

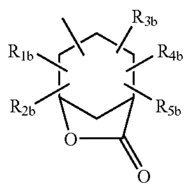

(V-4)

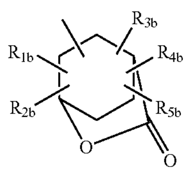

wherein $R_{1b}$ to $R_{5b}$ each independently represents a hydrogen atom, an alkyl group, a cycloalkyl group or an alkenyl group, and two of $R_{1b}$ to $R_{5b}$ may be combined with each other to form a ring:

(AII)

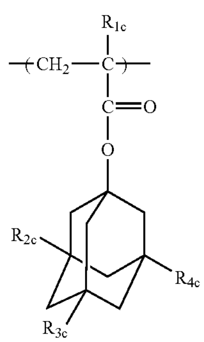

wherein $R_{1c}$ represents a hydrogen atom or a methyl group, and $R_{2c}$ to $R_{4c}$ each independently represents a hydrogen atom, a hydroxyl group, an alkoxy group, an acyloxy group or an alkyloxycarbonyloxy group, provided that one or two of $R_{2c}$ to $R_{4c}$ represents a hydroxyl group.

(2) The composition according to the above (1), wherein the resin (A) contains a repeating unit originated in an acrylic acid ester derivative in an amount of 60 to 100 mol % based on all repeating units.

(3) The positive resist composition according to the above (1), wherein in the resin (A), all repeating units are repeating units originated in an acrylic acid ester derivative.

(4) The composition according to the above (1), wherein the compound (B) is at least one of a triarylsulfonium salt compound and a phenacylsulfonium salt compound.

(5) The composition according to the above (1), wherein the compound (B) contains a triarylsulfonium salt compound and a phenacylsulfonium salt compound.

(6) The composition according to the above (1), wherein the cyclic ketone is contained in an amount 20 to 70% by weight based on the total amount of the organic solvent (C).

(7) The composition according to the above (1), wherein the cyclic ketone is contained in an amount 30 to 60% by weight based on the total amount of the organic solvent (C).

(8) The composition according to the above (1), wherein the resin (A) contains a repeating unit having an alkali-soluble group protected by a 1-adamantyl-1-alkyl group.

(9) The composition according to the above (1), wherein the content of the repeating units represented by formula (IV) is from 20 to 70 mole % based on the total repeating units in the resin.

(10) The composition according to the above (9), wherein the content of the repeating units represented by formula (IV) is from 25 to 60 mole % based on the total repeating units in the resin.

(11) The composition according to the above (1), wherein the content of the repeating units represented by formulae (V-1) to (V-4) is from 20 to 70 mole % based on the total repeating units in the resin.

(12) The composition according to the above (11), wherein the content of the repeating units represented by formulae (V-1) to (V-4) is from 25 to 60 mole % based on the total repeating units in the resin.

(13) The composition according to the above (1), wherein the content of the repeating unit represented by formula (AII) is from 5 to 50 mole % based on the total repeating units in the resin.

(14) The composition according to the above (13), wherein the content of the repeating unit represented by formula (AII) is from 10 to 40 mole % based on the total repeating units in the resin.

(15) The composition according to the above (1), further comprising a nitrogen-containing basic compound.

(16) The composition according to the above (1), further comprising at least one of fluorine-based and/or silicon-based surfactants.

(17) A pattern formation method comprising steps of forming a resist film by using the positive resist composition claimed in the above (1), and exposing and developing said resist film.

DETAILED DESCRIPTION OF THE INVENTION

The present invention is described in detail below.

In the present invention, when a group (atomic group) is denoted without specifying "substituted or unsubstituted", the group includes a group having no substituent and a group having a substituent. For example, "an alkyl group" includes not only an alkyl group having no substituent (unsubstituted alkyl group) but also an alkyl group having a substituent (substituted alkyl group).

[1] Resin Capable of Increasing its Solubility in an Alkali Developer Under Action of an Acid (Component A)

The resin (A) contains from 50 to 100 mol % of a repeating unit originated in an acrylic acid ester derivative.

The repeating unit originated in an acrylic acid ester derivative, contained in the resin (A), may be any repeating unit constituting the resin (A).

The content of the repeating unit originated in an acrylic acid ester derivative is preferably from 60 to 100 mol %, more preferably from 80 to 100 mol %, still more preferably 100 mol %.

The repeating unit except for the repeating unit originated in an acrylic acid ester derivative, which may be contained in the resin (A), is preferably a repeating unit originated, for example, in a methacrylic acid ester derivative, a methacrylic acid or an acrylic acid, but a repeating unit originated in maleic anhydride, norbornene or the like may also be used.

The repeating unit originated in an acrylic acid ester derivative, contained in the resin (A), may be any repeating unit constituting the resin (A) and may be a repeating unit represented by formula (IV), a repeating unit having a group represented by formula (V-1), (V-2), (V-3) or (V-4), a repeating unit represented by formula (AII), a repeating unit represented by formula (pA) shown later, a repeating unit represented by formula (VI) shown later, or a repeating unit originated in acrylic acid esters described later.

That is, when the repeating unit represented by formula (IV) is originated in an acrylic acid ester derivative, this repeating unit can be represented by the following formula (IV-A):

(IV)

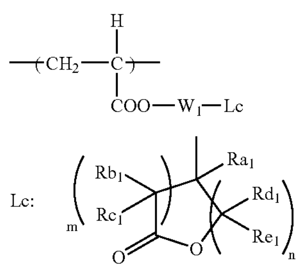

wherein $W_1$, $Ra_1$, $Rb_1$, $Rc_1$, $Rd_1$ and $Re_1$, m and n have the same meanings as $W_1$, $Ra_1$, $Rb_1$, $Rc_1$, $Rd_1$ and $Re_1$, m and n in formula (IV), respectively.

When the repeating unit having a group represented by formula (V-1), (V-2), (V-3) or (V-4) is originated in an acrylic acid ester derivative, this repeating unit can be represented by the following formula (AI-A):

(AI-A)

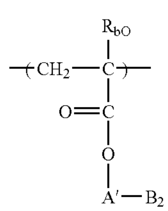

wherein A' and $B_2$ have the same meanings as A' and $B_2$ in formula (AI) shown later, respectively.

When the repeating unit represented by formula (AII) is originated in an acrylic acid ester derivative, this repeating unit can be represented by the following formula (AII-A):

(AII-A)

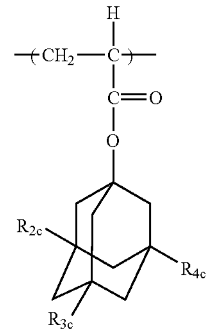

wherein $R_{2c}$, $R_{3c}$ and $R_{4c}$ have the same meanings as $R_{2c}$, $R_{3c}$ and $R_{4c}$ in formula (AII), respectively.

When the repeating unit represented by formula (pA) is originated in an acrylic acid ester derivative, this repeating unit can be represented by the following formula (pA-A):

(pA-A)

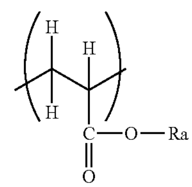

wherein Ra has the same meaning as Ra in formula (pA) shown later.

When the repeating unit represented by formula (VI) is originated in an acrylic acid ester derivative, this repeating unit can be represented by the following formula (VI-A):

(VI-A)

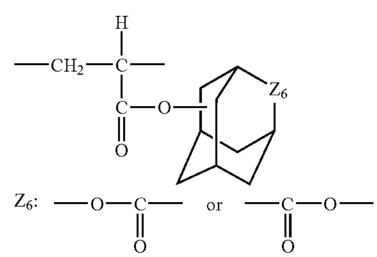

The resin (A) has repeating units of at least one kind selected from repeating units represented by the following formula (IV) and repeating units having groups represented by the formula (V-1), (V-2), (V-3) and (V-4):

(IV)

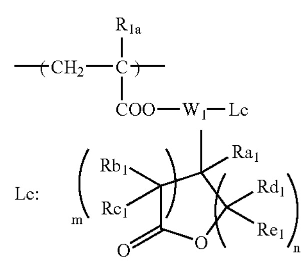

wherein $R_{1a}$ represents a hydrogen atom or a methyl group, $W_1$ represents a single bond or a divalent linking group, $Ra_1$, $Rb_1$, $Rc_1$, $Rd_1$ and $Re_1$ each independently represents a hydrogen atom or an alkyl group, m and n each independently represents an integer of 0 to 3, and m+n is from 2 to 6.

The alkyl group represented by $Ra_1$ to $Re_1$ is preferably a linear or branched alkyl group having from 1 to 4 carbon atoms, such as methyl group, ethyl group, propyl group, isopropyl group, n-butyl group, isobutyl group, sec-butyl group and tert-butyl group.

The divalent linking group represented by $W_1$ is, for example, a sole group or a combination of two or more groups, selected from the group consisting of an alkylene group, an ether group, a thioether group, a carbonyl group and an ester group.

Examples of the alkylene group for $W_1$ include a group represented by the following formula:

$$—[C(Rf)(Rg)]r_1—$$

In the formula, Rf and Rg, which may be the same or different, each represents a hydrogen atom, an alkyl group, a halogen atom, a hydroxyl group or an alkoxy group. The alkyl group is preferably a lower alkyl group such as methyl group, ethyl group, propyl group, isopropyl group and butyl group, more preferably a methyl group, an ethyl group, a propyl group or an isopropyl group. Examples of the alkoxy group include an alkoxy group having from 1 to 4 carbon atoms, such as methoxy group, ethoxy group, propoxy group and butoxy group. Examples of the halogen atom include a chlorine atom, a bromine atom, a fluorine atom and an iodine atom. $r_1$ is an integer of 1 to 10.

Examples of the substituent further substituted to the alkyl group or alkoxy group include a carboxyl group, an acyloxy group, a cyano group, an alkyl group, a halogen atom, a hydroxyl group, an alkoxy group, an acetylamido group, an alkoxycarbonyl group and an acyl group.

In these substituents, examples of the alkyl group include a lower alkyl group such as methyl group, ethyl group, propyl group, isopropyl group, butyl group, cyclopropyl group, cyclobutyl group and cyclopentyl group; examples of the substituent further substituted to this alkyl group include a hydroxyl group, a halogen atom and an alkoxy group; examples of the alkoxy group include an alkoxy group having from 1 to 4 carbon atoms, such as methoxy group, ethoxy group, propoxy group and butoxy group; examples of the substituent further substituted to the alkoxy group include an alkoxy group; examples of the acyloxy group include an acetoxy group; and examples of the halogen atom include a chlorine atom, a bromine atom, a fluorine atom and an iodine atom.

Specific examples of the repeating unit represented by formula (IV) are set forth below, however, the present invention is not limited thereto.

(IV-1)

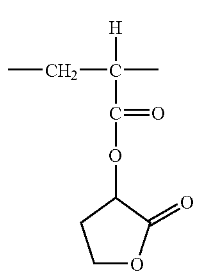

-continued (IV-2)

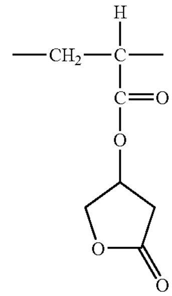

(IV-3)

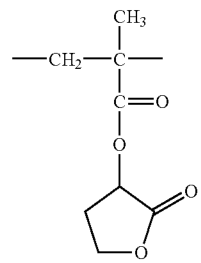

(IV-4)

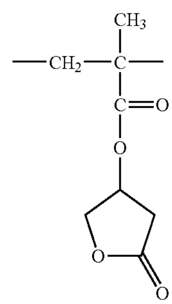

(IV-5)

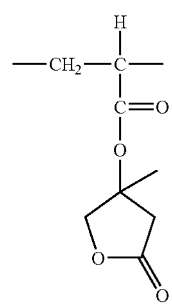

(IV-6)

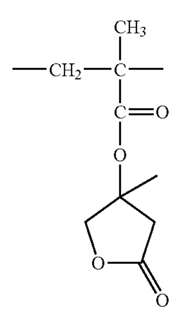

-continued
(IV-7)
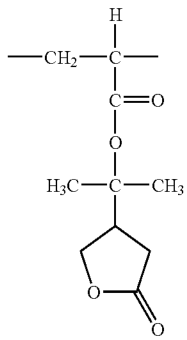
(IV-8)
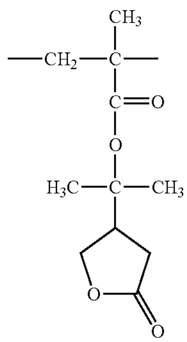
(IV-9)
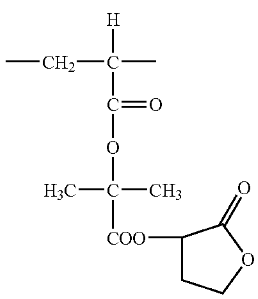
(IV-10)
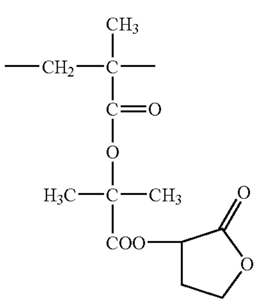
(IV-11)
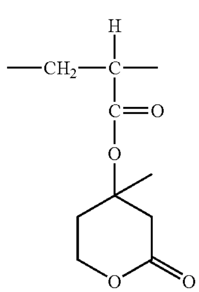
-continued
(IV-12)
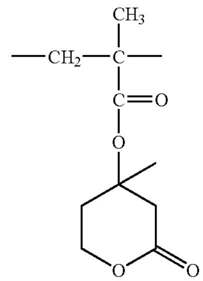
(IV-13)
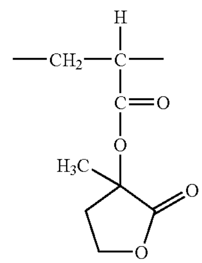
(IV-14)
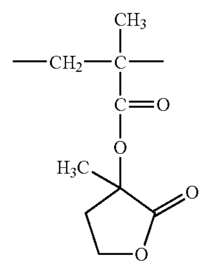
(IV-15)
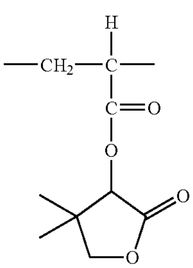
(IV-16)
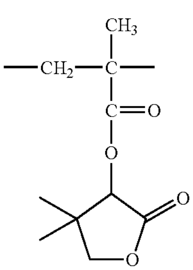

-continued
(IV-17)
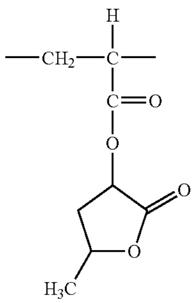
(IV-18)
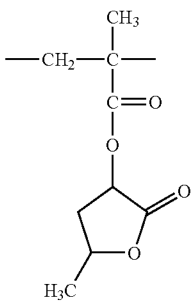
(IV-19)
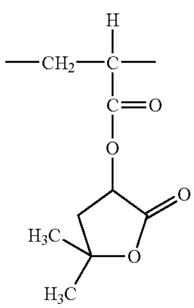
(IV-20)
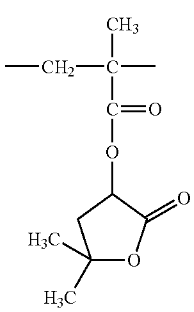
(IV-21)
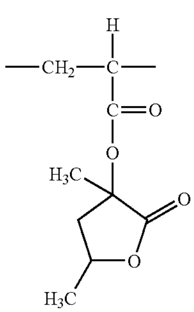
-continued
(IV-22)
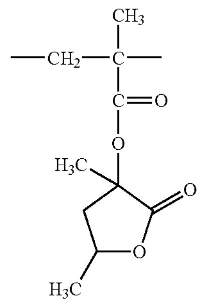
(IV-23)
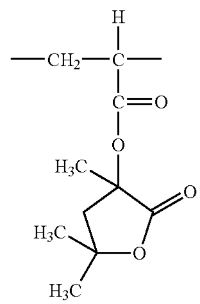
(IV-24)
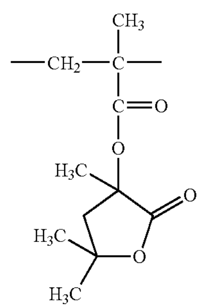
(IV-25)
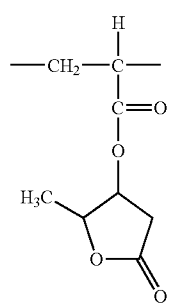
(IV-26)
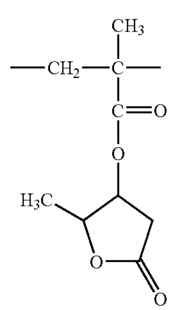

-continued
(IV-27)
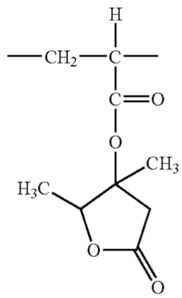
(IV-28)
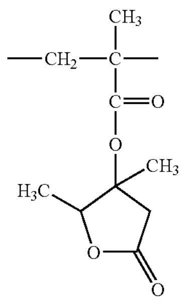
(IV-29)
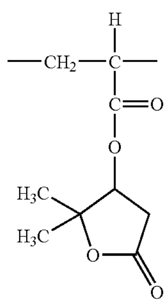
(IV-30)
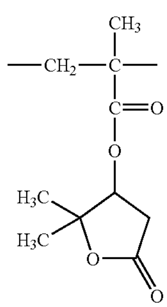
(IV-31)
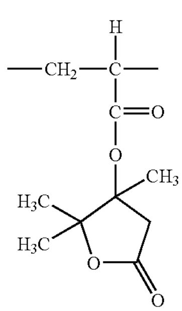
-continued
(IV-32)
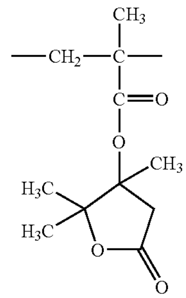
(IV-33)
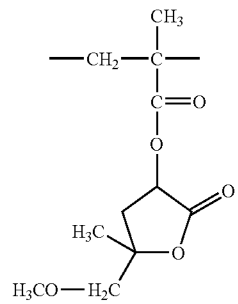
(IV-34)
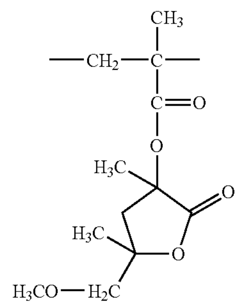
(IV-35)
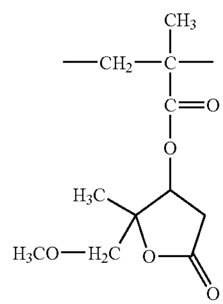
(IV-36)
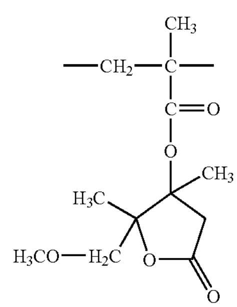

Among these specific examples of formula (IV), compounds (IV-17) to (IV-36) are preferred because more excellent exposure margin can be obtained.

As for the structure of formula (IV), those having an acrylate structure are preferred because the edge roughness can be improved.

In place of or together with the repeating unit represented by formula (IV), the resin (A) may contain a repeating unit having a group represented by any one of the following formulae (V-1) to (V-4):

(V-1)

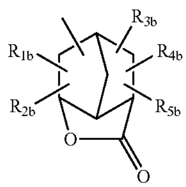

(V-2)

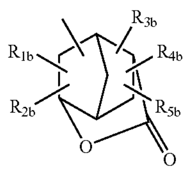

(V-3)

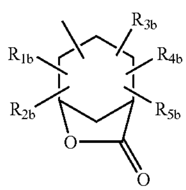

(V-4)

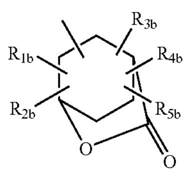

wherein $R_{1b}$ to $R_{5b}$ each independently represents a hydrogen atom, an alkyl group, a cycloalkyl group or an alkenyl group, and two of $R_{1b}$ to $R_{5b}$ may be combined with each other to form a ring.

In formulae (V-1) to (V-4), the alkyl group, the cycloalkyl group and the alkenyl group represented by $R_{1b}$ to $R_{5b}$ include an alkyl group having a substituent, a cycloalkyl group having a substituent and an alkenyl group having a substituent, respectively.

Examples of the alkyl group represented by $R_{1b}$ to $R_{5b}$ include a linear or branched alkyl group. The linear or branched alkyl group is preferably a linear or branched alkyl group having from 1 to 12 carbon atoms, more preferably a linear or branched alkyl group having from 1 to 10 carbon atoms, still more preferably a methyl group, an ethyl group, a propyl group, an isopropyl group, an n-butyl group, an isobutyl group, a sec-butyl group, a tert-butyl group, a pentyl group, a hexyl group, a heptyl group, an octyl group, a nonyl group or a decyl group.

The cycloalkyl group represented by $R_b$ to $R_{5b}$ is preferably a cycloalkyl group having from 3 to 8 carbon atoms, such as cyclopropyl group, cyclopentyl group, cyclohexyl group, cycloheptyl group and cyclooctyl group.

The alkenyl group represented by $R_{1b}$ to $R_{5b}$ is preferably an alkenyl group having from 2 to 6 carbon atoms, such as vinyl group, propenyl group, butenyl group and hexenyl group.

When two of $R_{1b}$ to $R_{5b}$ are combined to form a ring, examples of the ring include a 3-, 4-, 5-, 6-, 7- or 8-membered ring such as cyclopropane ring, cyclobutane ring, cyclopentane ring, cyclohexane ring and cyclooctane ring.

In formula (V-1) to (V-4), $R_{1b}$ to $R_{5b}$ each may be connected to any carbon atom constituting the cyclic skeleton.

Preferred examples of the substituent which may be substituted to the alkyl, cycloalkyl or alkenyl group include an alkoxy group having from 1 to 4 carbon atoms, a halogen atom (e.g., fluorine, chlorine, bromine, iodine), an acyl group having from 2 to 5 carbon atoms, an acyloxy group having from 2 to 5 carbon atoms, a cyano group, a hydroxyl group, a carboxy group, an alkoxycarbonyl group having from 2 to 5 carbon atoms and a nitro group.

Examples of the repeating unit having a group represented by any one of formulae (V-1) to (V-4) include a repeating unit represented by the following formula (AI):

(AI)

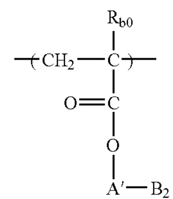

In formula (AI), $R_{b0}$ represents a hydrogen atom, a halogen atom or an alkyl group (preferably having from 1 to 4 carbon atoms). Examples of the substituent which may be substituted to the alkyl group represented by $R_{b0}$ include those described above as the substituent which may be substituted to the alkyl group represented by $R_{1b}$ in formulae (V-1) to (V-4).

Examples of the halogen atom represented by $R_{b0}$ include a fluorine atom, a chlorine atom, a bromine atom and an iodine atom. $R_{b0}$ is preferably a hydrogen atom.

A' represents a single bond, an ether group, an ester group, a carbonyl group, an alkylene group or a divalent group comprising a combination thereof.

$B_2$ represents a group represented by any one of formulae (V-1) to (V-4). Examples of the divalent group comprising a combination of the groups, represented by A', include those represented by the following formulae:

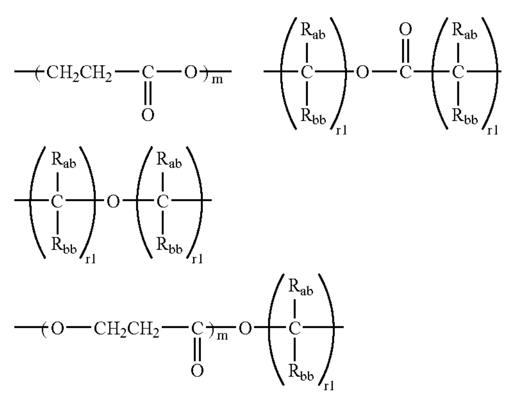

-continued

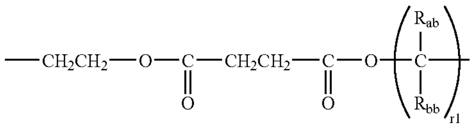

In these formulae, $R_{ab}$ and $R_{bb}$, which may be the same or different, each represents a hydrogen atom, an alkyl group, a halogen atom, a hydroxyl group or an alkoxy group.

The alkyl group is preferably a lower alkyl group such as methyl group, ethyl group, propyl group, isopropyl group and butyl group, more preferably a methyl group, an ethyl group, a propyl group or an isopropyl group. Examples of the alkoxy group include an alkoxy group having from 1 to 4 carbon atoms, such as methoxy group, ethoxy group, propoxy group and butoxy group. Examples of the halogen atom include a chlorine atom, a bromine atom, a fluorine atom and an iodine atom. The alkyl group and alkoxy group each may have a substituent and examples of the substituent which may be substituted to the alkyl group and alkoxy group include a hydroxyl group, a halogen atom and an alkoxy group having from 1 to 4 carbon atoms. r1 represents an integer of 1 to 10, preferably 1 to 4. m represents an integer of 1 to 3, preferably 1 or 2.

Specific examples of the repeating unit represented by formula (AI) are set forth below, however, the present invention is not limited thereto.

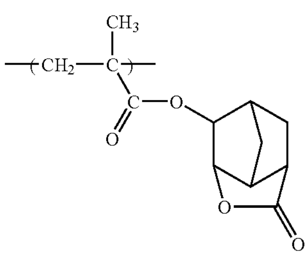

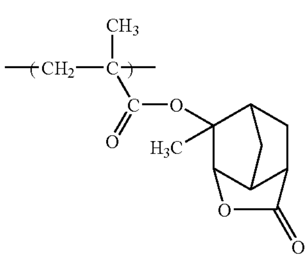

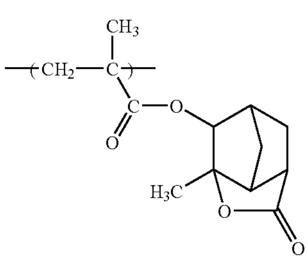

-continued

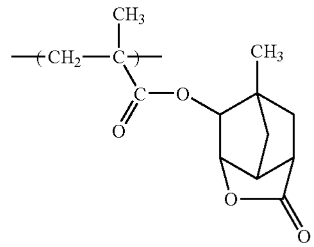

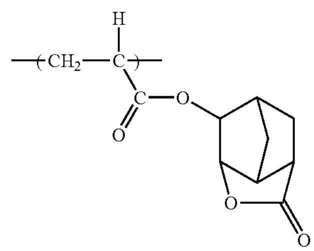

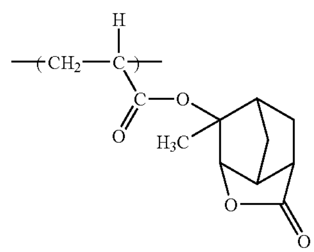

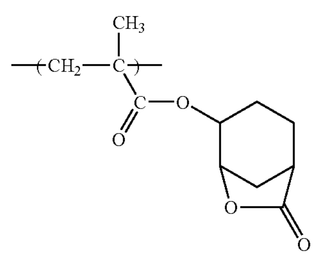

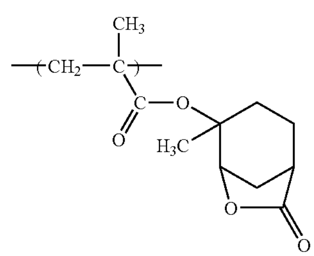

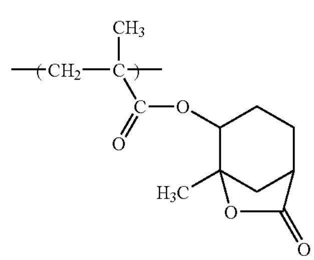

-continued
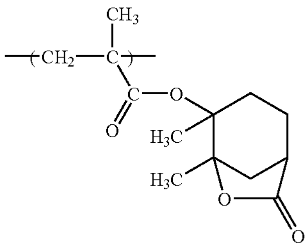
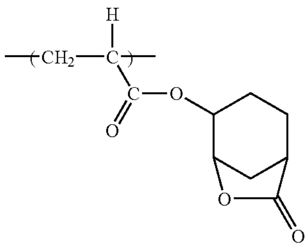
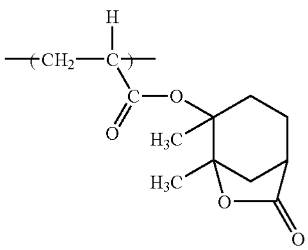
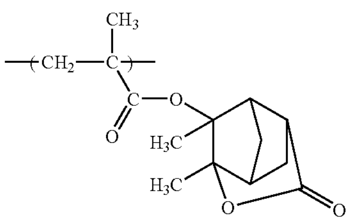
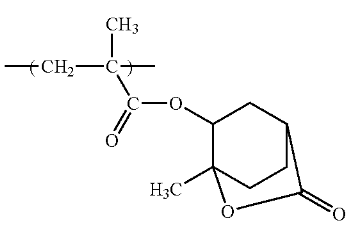
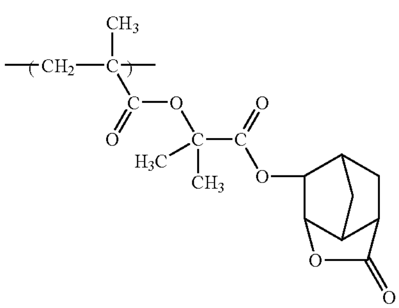
-continued
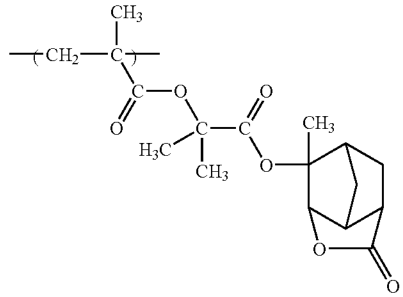
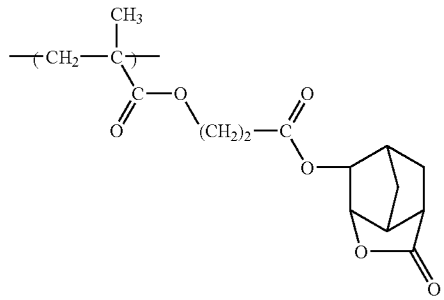
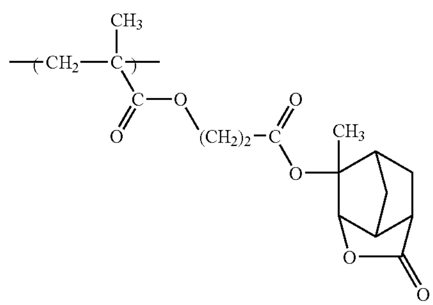
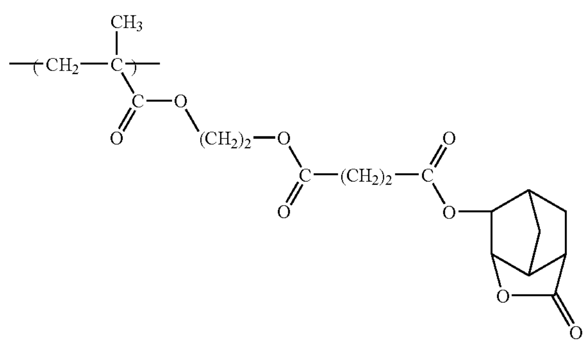
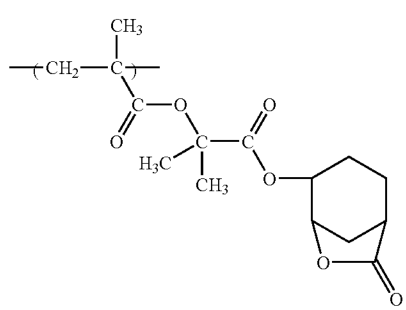

-continued
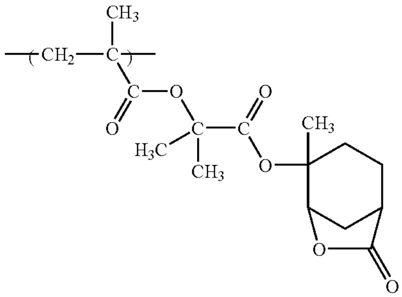
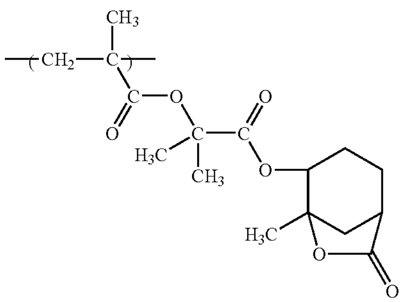
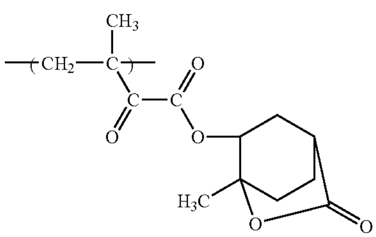
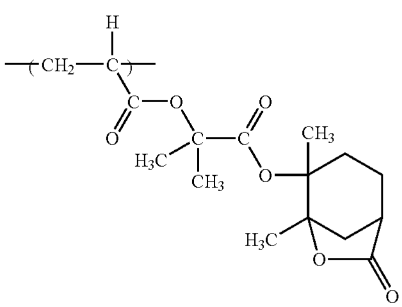
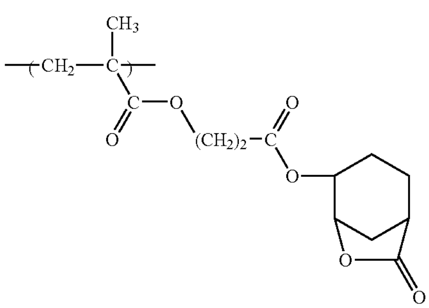
-continued
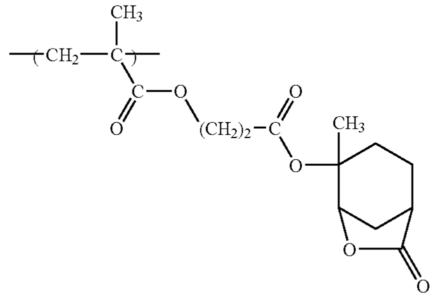
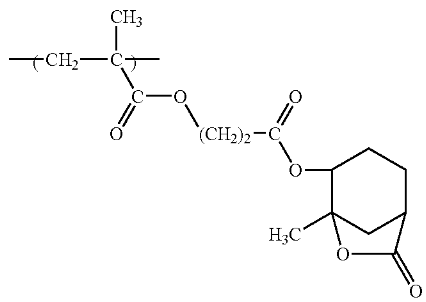
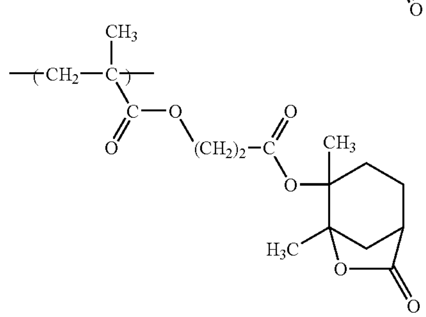
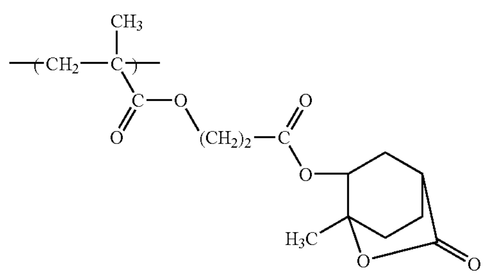
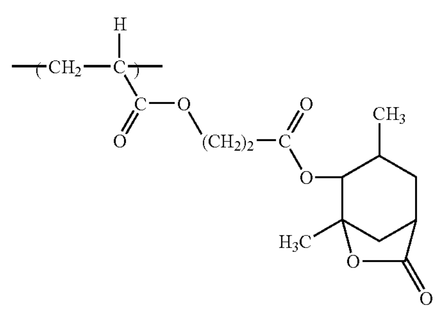
The resin (A) further comprises a repeating unit represented by the following formula (AII):

(AII)

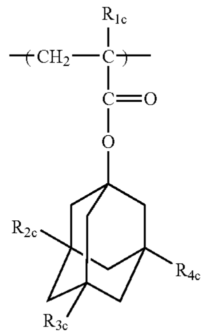

wherein $R_{1c}$ represents a hydrogen atom or a methyl group, and $R_{2c\ to\ R4c}$ each independently represents a hydrogen atom, a hydroxyl group, an alkoxy group, an acyloxy group or an alkyloxycarbonyloxy group, provided that one or two of $R_{2c}$ to $R_{4c}$ represents a hydroxyl group.

The alkoxy group represented by $R_{2c}$ to $R_{4c}$ may be linear, branched or cyclic and is preferably an alkoxy group having from 1 to 14 carbon atoms, such as methoxy group, ethoxy group, propoxy group and butoxy group. Examples of the cyclic alkoxy group include an alkoxy group having an adamantane or cyclohexane structure.

The acyloxy group may be linear, branched or cyclic and is preferably an acyloxy group having from 2 to 15 carbon atoms, such as methoxycarbonyloxy group, ethoxy-carbonyloxy group and propylcarbonyloxy group.

The alkyloxycarbonyloxy group may be linear, branched or cyclic and is preferably an alkyloxycarbonyloxy group having from 2 to 15 carbon atoms, such as methoxycarbonyloxy group, ethoxycarbonyloxy group and propoxycarbonyloxy group.

Examples of the substituent which may be substituted to the alkoxy group, acyloxy group and alkyloxycarbonyloxy group represented by $R_{2c}$ to $R_{4c}$ include an alkoxy group having from 1 to 4 carbon atoms, a halogen atom (e.g., fluorine, chlorine, bromine, iodine), a cyano group, a carboxy group and a nitro group.

Specific examples of the repeating unit having the structure represented by formula (AII) are set forth below, however, the present invention is not limited thereto.

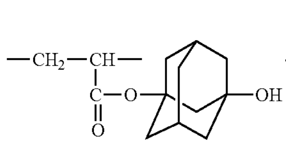

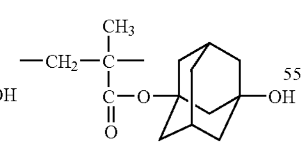

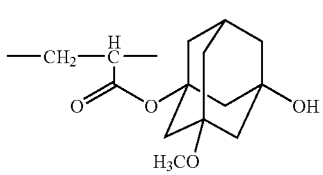

-continued

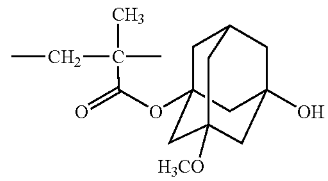

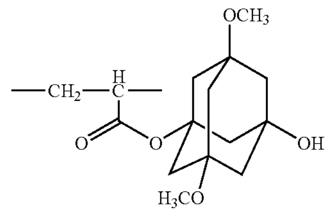

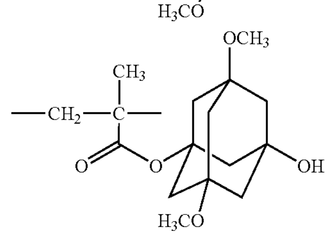

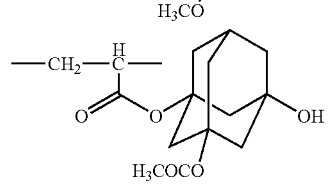

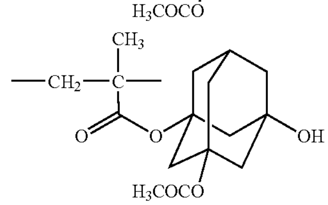

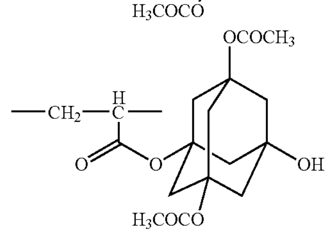

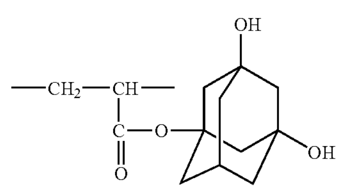

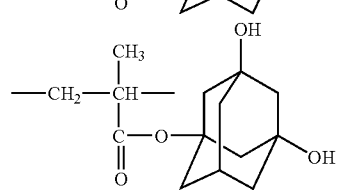

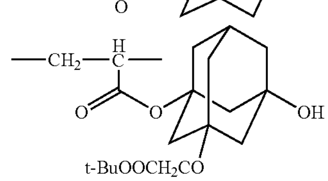

-continued

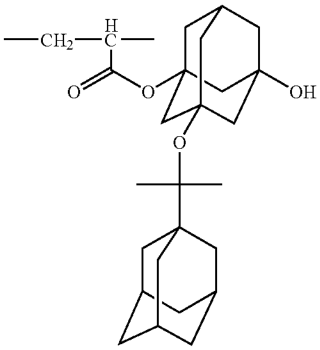

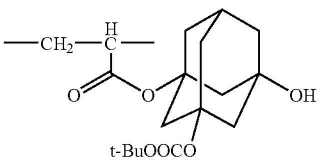

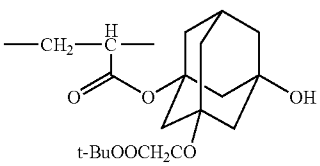

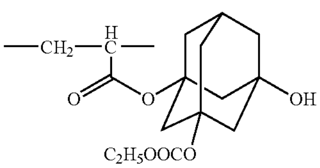

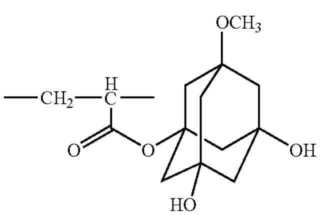

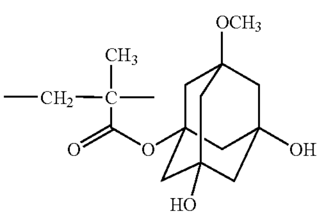

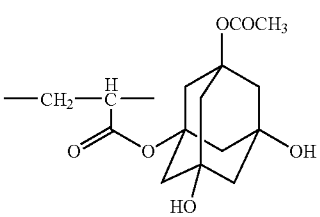

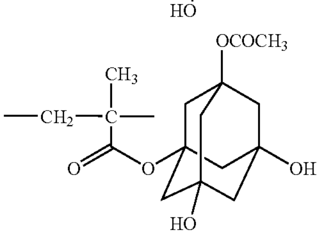

-continued

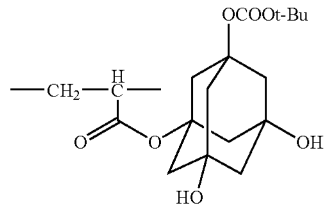

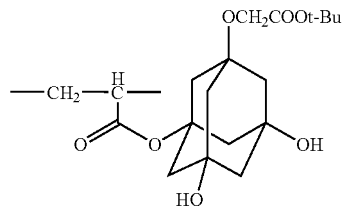

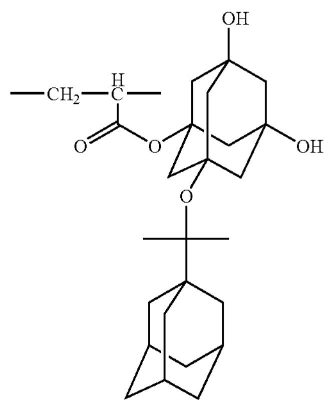

The resin (A) is a resin capable of increasing in the solubility in an alkali developer under the action of an acid (hereinafter also called an "acid-decomposable resin"), and this resin is insoluble or sparingly soluble in an alkali developer and contains a repeating unit having a group which decomposes under the action of an acid and becomes alkali-soluble (acid-decomposable group). The acid-decomposable group may be contained in any repeating unit constituting the resin.

Particularly, the resin (A) preferably contains a repeating unit having, as the acid-decomposable group, an alicyclic hydrocarbon-containing partial structure represented by any one of the following formulae (pI) to (pVI):

(pI)

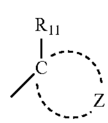

(pII)

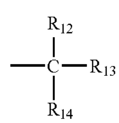

(pIII)

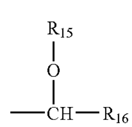

-continued (pIV)

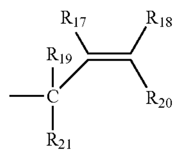

(pV)

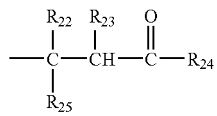

(pVI)

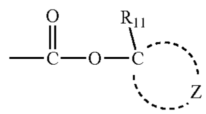

wherein $R_{11}$ represents a methyl group, an ethyl group, an n-propyl group, an isopropyl group, an n-butyl group, an isobutyl group or a sec-butyl group, Z represents an atomic group necessary for forming an alicyclic hydrocarbon group together with the carbon atom, $R_{12}$ to $R_{16}$ each independently represents linear or branched alkyl group having from 1 to 4 carbon atoms or an alicyclic hydrocarbon group, provided that at least one of $R_{12}$ to $R_{14}$ or either one of $R_{15}$ and $R_{16}$ represents an alicyclic hydrocarbon group.

$R_{17}$ to $R_{21}$ each independently represents a hydrogen atom, a linear or branched alkyl group having from 1 to 4 carbon atoms or an alicyclic hydrocarbon group, provided that at least one of $R_{17}$ to $R_{21}$ represents an alicyclic hydrocarbon group and that either one of $R_{19}$ and $R_{21}$ represents a linear or branched alkyl group having from 1 to 4 carbon atoms or an alicyclic hydrocarbon group, $R_{22}$ to $R_{25}$ each independently represents a hydrogen atom, a linear or branched alkyl group having from 1 to 4 carbon atoms or an alicyclic hydrocarbon group, provided that at least one of $R_{22}$ to $R_{25}$ represents an alicyclic hydrocarbon group, and $R_{23}$ and $R_{24}$ may be combined with each other to form a ring.

In formulae (pI) to (pVI), the alkyl group represented by $R_{12}$ to $R_{25}$ is preferably a linear or branched alkyl group having from 1 to 4 carbon atoms, such as methyl group, ethyl group, n-propyl group, isopropyl group, n-butyl group, isobutyl group, sec-butyl group and tert-butyl group.

Examples of the substituent further substituted to the alkyl group include an alkoxy group having from 1 to 4 carbon atoms, a halogen atom (e.g., fluorine, chlorine, bromine, iodine), an acyl group, an acyloxy group, a cyano group, a hydroxyl group, a carboxy group, an alkoxycarbonyl group and a nitro group.

The alicyclic hydrocarbon group represented by $R_{11}$ to $R_{25}$ and the alicyclic hydrocarbon group formed by Z and the carbon atom each may be monocyclic or polycyclic. Specific examples thereof include a group having 5 or more carbon atoms and having a monocyclic, bicyclic, tricyclic or tetracyclic structure. The number of carbon atoms in the group is preferably from 6 to 30, more preferably from 7 to 25. These alicyclic hydrocarbon groups each may have a substituent.

Examples of the structure in the alicyclic moiety of the alicyclic hydrocarbon group are set forth below.

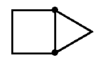

(1)

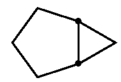

(2)

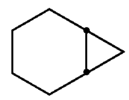

(3)

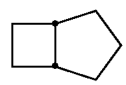

(4)

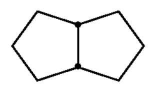

(5)

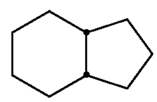

(6)

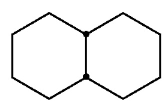

(7)

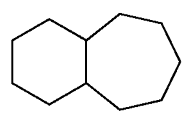

(8)

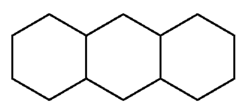

(9)

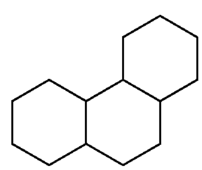

(10)

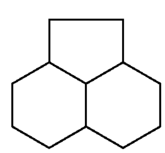

(11)

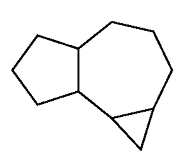

(12)

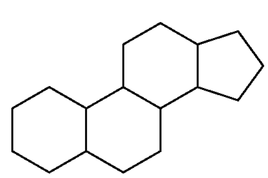

(13)

-continued
(14)
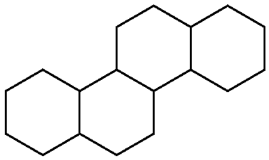
(15)
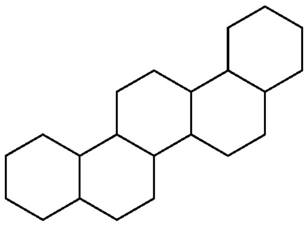
(16)
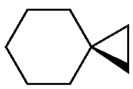
(17)
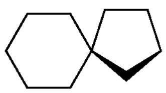
(18)
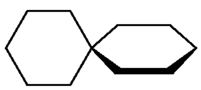
(19)
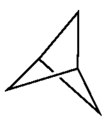
(20)
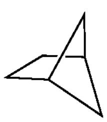
(21)
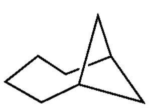
(22)
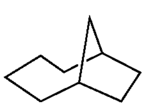
(23)
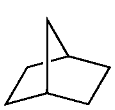
(24)
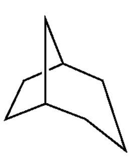
(25)
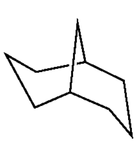
-continued
(26)
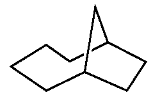
(27)
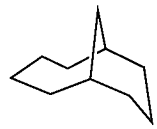
(28)
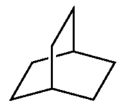
(29)
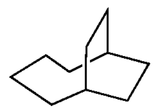
(30)
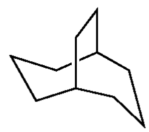
(31)
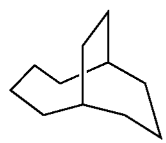
(32)
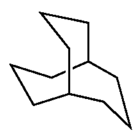
(33)
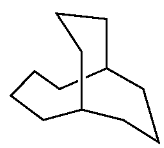
(34)
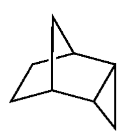
(35)
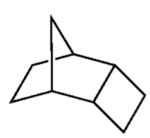
(36)
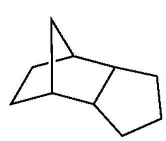
(37)
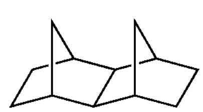

-continued (38)

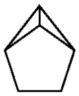

(39)

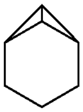

(40)

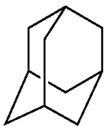

(41)

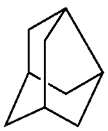

(42)

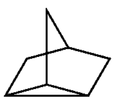

(43)

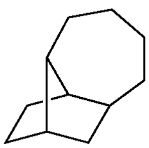

(44)

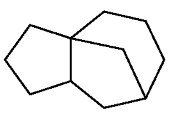

(45)

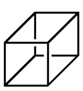

(46)

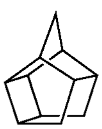

(47)

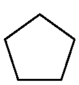

(48)

(49)

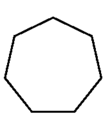

(50)

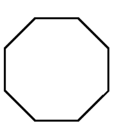

Among these alicyclic moieties, preferred in the present invention are an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group, more preferred are an adamantyl group, a decalin residue, a norbornyl group, a cedrol group, a cyclohexyl group, a cycloheptyl group, a cyclooctyl group, a cyclodecanyl group and a cyclododecanyl group.

Examples of the substituent of the alicyclic hydrocarbon group include an alkyl group, a halogen atom, a hydroxyl group, an alkoxy group, a carboxyl group and an alkoxycarbonyl group. The alkyl group is preferably a lower alkyl group such as methyl group, ethyl group, propyl group, isopropyl group and butyl group, more preferably a methyl group, an ethyl group, a propyl group or an isopropyl group. Examples of the alkoxy group include an alkoxy group having from 1 to 4 carbon atoms, such as methoxy group, ethoxy group, propoxy group and butoxy group. The alkyl group and alkoxy group each may further have a substituent and examples of the substituent which may be further substituted to the alkyl group and alkoxy group include a hydroxyl group, a halogen atom and an alkoxy group.

The structures represented by formulae (pI) to (pVI) each can be used for the protection of an alkali-soluble group in the resin. Examples of the alkali-soluble group include various groups known in this technical field.

Specific examples thereof include a carboxylic acid group, a sulfonic acid group, a phenol group and a thiol group. Among these, preferred are a carboxylic acid group and a sulfonic acid group.

Preferred examples of the alkali-soluble group protected by the structure represented by any one of formulae (pI) to (pVI) (to serve as the acid-decomposable group) in the resin include the groups represented by the following formulae (pVII) to (pXI):

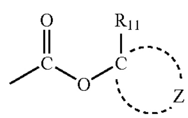

(pVII)

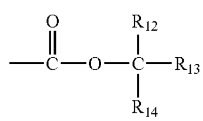

(pVIII)

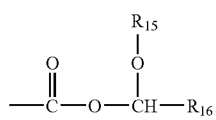

(pIX)

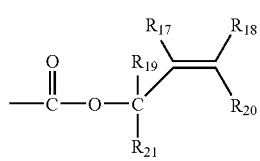

(pX)

wherein $R_{11}$ to $R_{25}$ and Z each has the same meaning as defined above.

In the resin, the repeating unit having an alkali-soluble group protected by the structure represented by any one of formulae (pI) to (pVI) is preferably a repeating unit represented by the following formula (pA):

(pA)

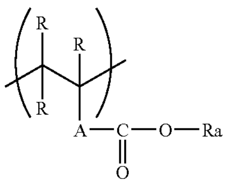

wherein R represents a hydrogen atom, a halogen atom or a linear or branched alkyl group (preferably having from 1 to 4 carbon atoms), and the plurality of Rs may be the same or different, A represents a single bond, or a sole group or a combination of two or more groups, selected from the group consisting of an alkylene group, an ether group, a thioether group, a carbonyl group, an ester group, an amido group, a sulfonamido group, a urethane group and a urea group, and Ra represents any one group of formulae (pI) to (pVI).

Specific examples of the monomer corresponding to the repeating unit represented by formula (pA) are set forth below.

1

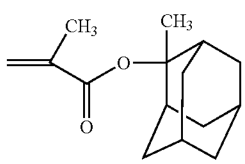

2

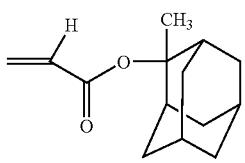

3

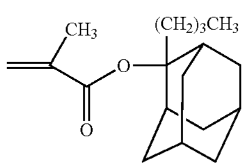

4

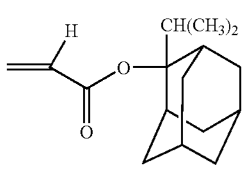

5

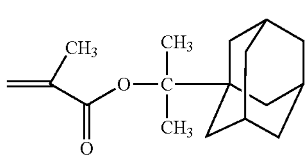

6

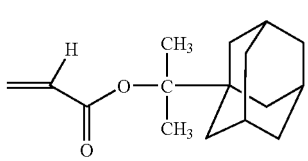

-continued

7

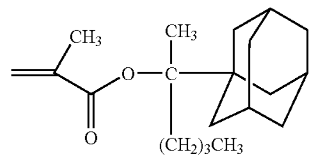

8

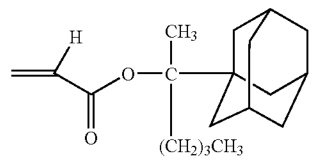

9

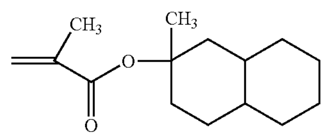

10

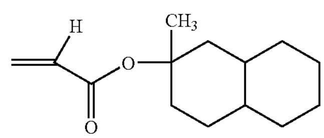

11

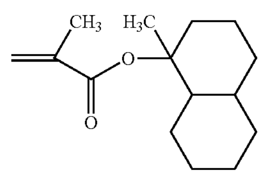

12

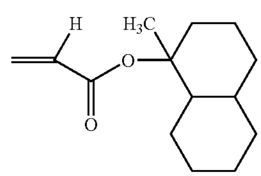

13

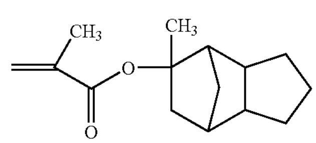

14

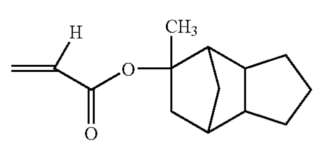

15

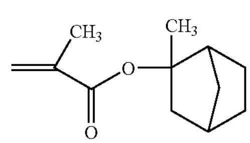

16

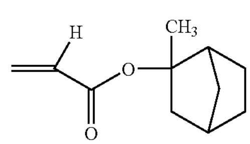

-continued

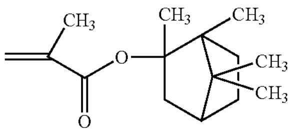

17

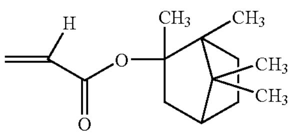

18

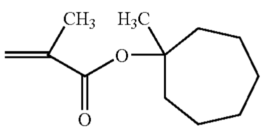

19

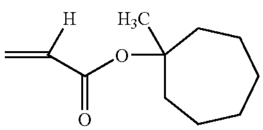

20

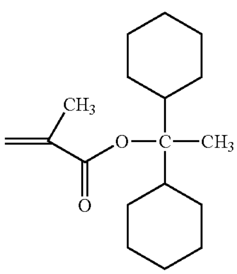

21

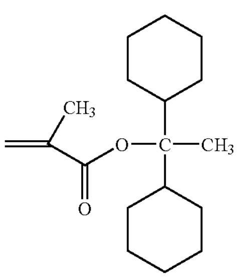

22

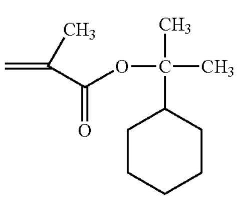

23

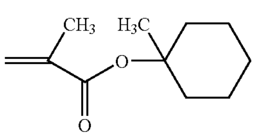

24

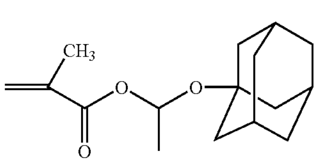

25

-continued

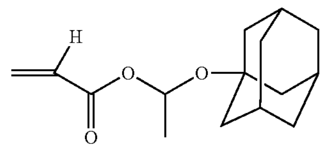

26

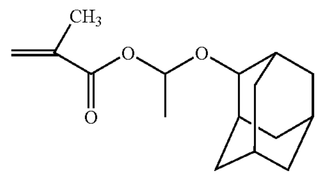

27

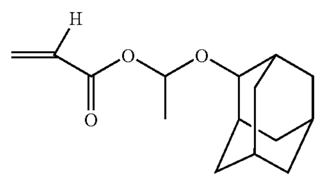

28

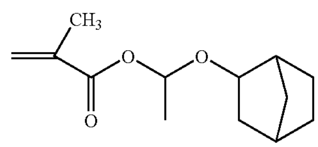

29

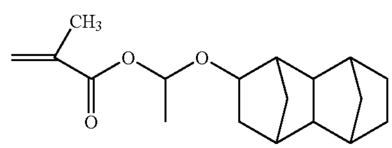

30

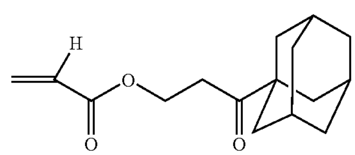

31

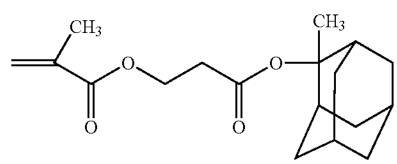

32

In the present invention, the resin (A) preferably contains a repeating unit having an alkali-soluble group protected by a 2-alkyl-2-adamantyl group or a 1-adamantyl-1-alkyl group, more preferably a repeating unit having an alkali-soluble group protected by a 1-adamantyl-1-alkyl group.

In the resin (A), the acid-decomposable group may be contained as the alicyclic hydrocarbon-containing partial structure represented by any one of formulae (pI) to (pVI) or may be contained in at least one repeating unit out of repeating units of the copolymerization components described later.

Examples of the structure of the acid-decomposable group include a structure represented by —C(═O)—$X_1$—$R_o$ in addition to the alkali-soluble group protected by a structure represented by any one of formulae (pI) to (pVI) (to serve as the acid-decomposable group).

In this formula, $R_o$ represents, for example, a tertiary alkyl group such as tert-butyl group and tert-amyl group, a 1-alkoxyethyl group such as isoboronyl group, 1-ethoxyethyl group, 1-butoxyethyl group, 1-isobutoxyethyl group and 1-cyclohexyloxyethyl group, an alkoxymethyl group such as 1-methoxymethyl group and 1-ethoxymethyl group, a 3-oxoalkyl group, a tetrahydropyranyl group, a tetrahydrofuranyl group, a trialkylsilylester group, a 3-oxocyclohexylester group, a 2-methyl-2-adamantyl group or a mevalonic lactone residue, and $X_1$ represents an oxygen atom, a sulfur atom, —NH—, —$NHSO_2$—or —$NHSO_2NH$—.

The resin (A) may further contain a repeating unit represented by the following formula (VI):

(VI)

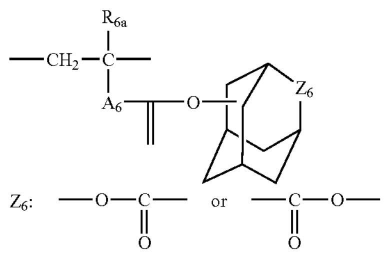

wherein $A_6$ represents a single bond, or a sole group or a combination of two or more groups, selected from the group consisting of an alkylene group, a cycloalkylene group, an ether group, a thioether group, a carbonyl group and an ester group, and $R_{6a}$ represents a hydrogen atom, an alkyl group (preferably having from 1 to 4 carbon atoms), a cyano group or a halogen atom.

Examples of the alkylene group represented by $A_6$ in formula (VI) include a group represented by the following formula:

—[C(Rnf)(Rng)]r—

In the formula, Rnf and Rng, which may be the same or different, each represents a hydrogen atom, an alkyl group, a halogen atom, a hydroxyl group or an alkoxy group. The alkyl group is preferably a lower alkyl group such as methyl group, ethyl group, propyl group, isopropyl group and butyl group, more preferably a methyl group, an ethyl group, a propyl group or an isopropyl group.

Examples of the alkoxy group includes an alkoxy group having from 1 to 4 carbon atoms, such as methoxy group, ethoxy group, propoxy group and butoxy group. Examples of the halogen atom include a chlorine atom, a bromine atom, a fluorine atom and an iodine atom. The alkyl group and alkoxy group each may further have a substituent. Examples of the substituent which may be further substituted to the alkyl group and alkoxy group include a hydroxy group, a halogen atom and an alkoxy group. r is an integer of 1 to 10.

Examples of the cycloalkylene group represented by $A_6$ in formula (VI) include a cycloalkylene group having from 3 to 10 carbon atoms, such as cyclopentylene group, cyclohexylene group and cyclooctylene group.

The bridged alicyclic ring containing $Z_6$ may have a substituent. Examples of the substituent include a halogen atom, an alkoxy group (preferably having from 1 to 4 carbon atoms), an alkoxycarbonyl group (preferably having from 1 to 5 carbon atoms), an acyl group (e.g., formyl, benzoyl), an acyloxy group (e.g., propylcarbonyloxy, benzoyloxy), an alkyl group (preferably having from 1 to 4 carbon atoms), a carboxyl group, a hydroxyl group and an alkylsulfonylsulfamoyl group (e.g., —$CONHSO_2CH_3$). The alkyl group as the substituent may be further substituted, for example, by a hydroxyl group, a halogen atom or an alkoxy group (preferably having from 1 to 4 carbon atoms).

In formula (VI), the oxygen atom of the ester group bonded to $A_6$ may be bonded at any position of the carbon atoms constituting the bridged alicyclic ring structure containing $Z_6$.

Specific examples of the repeating unit represented by formula (VI) are set forth below, however, the present invention is not limited thereto.

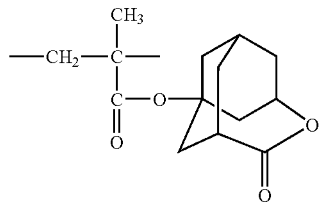

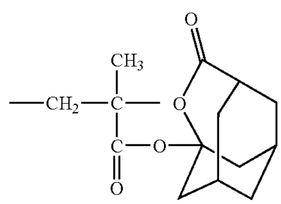

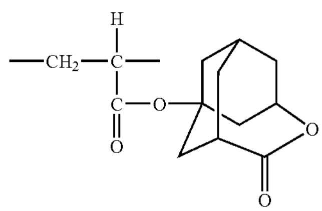

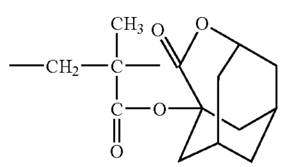

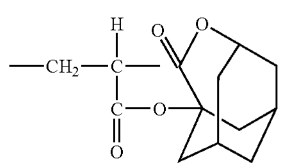

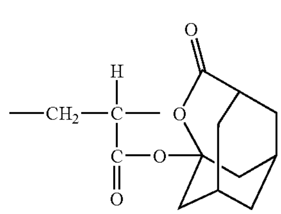

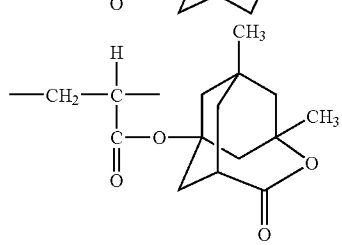

-continued

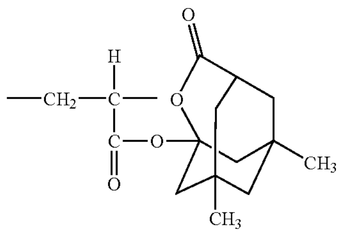

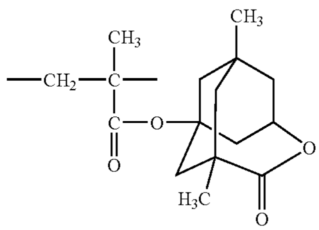

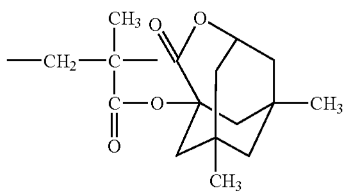

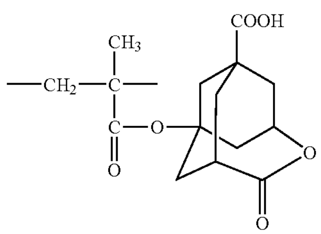

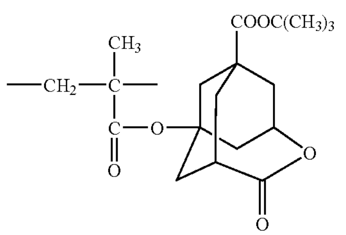

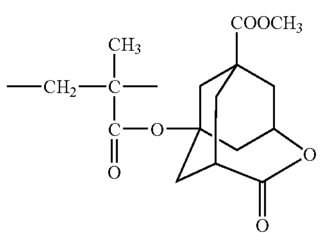

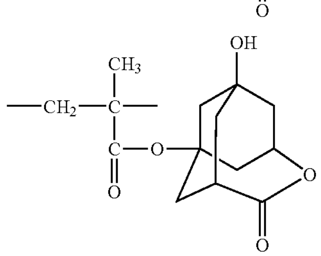

-continued

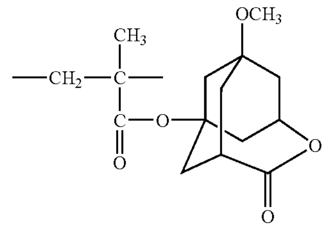

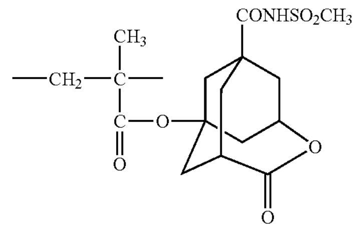

The resin (A) may contain, in addition to the above-described repeating units, various repeating units for the purpose of controlling the dry etching resistance, suitability for standard developer, adhesion to substrate, resist profile and properties generally required of the resist, such as resolution, heat resistance and sensitivity.

Examples of such repeating units include repeating units corresponding to the monomers described below, however, the present invention is not limited thereto.

By containing these repeating units, the performance required of the acid-decomposable resin, particularly, (1) solubility in the coating solvent, (2) film-forming property (glass transition point), (3) alkali developability, (4) film loss (selection of hydrophilic, hydrophobic or alkali-soluble group), (5) adhesion to substrate in unexposed area, (6) dry etching resistance and the like can be subtly controlled.

Examples of the monomer include compounds having one addition polymerizable unsaturated bond, selected from acrylic acid esters, methacrylic acid esters, acrylamides, methacrylamides, allyl compounds, vinyl ethers and vinyl esters.

Specific examples thereof include the following monomers.

Acrylic acid esters (preferably an alkyl acrylate with the alkyl group having from 1 to 10 carbon atoms):

methyl acrylate, ethyl acrylate, propyl acrylate, tert-butyl acrylate, amyl acrylate, cyclohexyl acrylate, ethylhexyl acrylate, octyl acrylate, tert-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol mono-acrylate, benzyl acrylate, methoxybenzyl acrylate, furfuryl acrylate, tetrahydrofurfuryl acrylate, etc.

Methacrylic acid esters (preferably an alkyl methacrylate with the alkyl group having from 1 to 10 carbon atoms):

methyl methacrylate, ethyl methacrylate, propyl methacrylate, isopropyl methacrylate, tert-butyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate, tetrahydrofurfuryl methacrylate, etc.

Acrylamides:

acrylamide, N-alkylacrylamide (the alkyl group is an alkyl group having from 1 to 10 carbon atoms, such as methyl group, ethyl group, propyl group, butyl group, tert-butyl group, heptyl group, octyl group, cyclohexyl group and hydroxyethyl group), N,N-dialkylacrylamide (the alkyl group is an alkyl group having from 1 to 10 carbon atoms, such as methyl group, ethyl group, butyl group, isobutyl group, ethylhexyl group and cyclohexyl group), N-hydroxyethyl-N-methylacrylamide, N-2-acetamidoethyl-N-acetylacrylamide, etc.

Methacrylamides:

methacrylamide, N-alkylmethacrylamide (the alkyl group is an alkyl group having from 1 to 10 carbon atoms, such as methyl group, ethyl group, tert-butyl group, ethylhexyl group, hydroxyethyl group and cyclohexyl group), N,N-dialkylmethacrylamide (the alkyl group is, for example, an ethyl group, a propyl group or a butyl group), N-hydroxyethyl-N-methylmethacrylamide, etc.

Allyl Compounds:

allyl esters (e.g., allyl acetate, allyl caproate, allyl caprylate, allyl laurate, allyl palmitate, allyl stearate, allyl benzoate, allyl acetoacetate, allyl lactate), allyloxy ethanol, etc.

Vinyl Ethers:

alkyl vinyl ether (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether), etc.

Vinyl Esters:

vinyl butyrate, vinyl isobutyrate, vinyl trimethyl acetate, vinyl diethyl acetate, vinyl valerate, vinyl caproate, vinyl chloroacetate, vinyl dichloroacetate, vinyl methoxyacetate, vinyl butoxyacetate, vinyl acetoacetate, vinyl lactate, vinyl-β-phenylbutyrate, vinylcyclohexyl carboxylate, etc.

Dialkyl Itaconates:

dimethyl itaconate, diethyl itaconate, dibutyl itaconate, etc.

Dialkyl Esters and Monoalkyl Esters of Fumaric Acid:

dibutyl fumarate, etc.

In addition, crotonic acid, itaconic acid, maleic anhydride, maleimide, acrylonitrile, methacrylonitrile, maleylonitrile and the like may be used.

Other than these, an addition-polymerizable unsaturated compound copolymerizable with the monomer corresponding to the above-described various repeating units may be copolymerized.

In the resin (A), the molar ratio of respective repeating structural units contained is appropriately selected for controlling the dry etching resistance, suitability for standard developer, adhesion to substrate, resist profile and properties generally required of the resist, such as resolution, heat resistance and sensitivity.

The content of the repeating unit represented by formula (IV) is preferably from 20 to 70 mol %, more preferably from 25 to 60 mol %, based on all repeating units.

The content of the repeating unit having a group represented by any one of formulae (V-1) to (V-4) is preferably from 20 to 70 mol %, more preferably from 25 to 60 mol %, based on all repeating units.

The content of the repeating unit represented by formula (AII) is preferably from 5 to 50 mol %, more preferably from 10 to 40 mol %, still more preferably from 15 to 35 mol %, based on all repeating units.

The content of the repeating unit originated in an acrylic acid ester derivative is preferably from 60 to 100 mol %, more preferably from 80 to 100 mol %, still more preferably 100 mol %, based on all repeating units.

The content of the repeating unit having an acid-decomposable group is preferably from 20 to 60 mol %, more preferably from 25 to 55 mol %, still more preferably from 30 to 50 mol %, based on all repeating units.

The content of the repeating unit having an alicyclic hydrocarbon-containing partial structure represented by any one of formulae (pI) to (pVI) is preferably from 30 to 70 mol %, more preferably from 35 to 65 mol %, still more preferably from 40 to 60 mol %, based on all repeating units.

When the composition of the present invention is used for exposure with ArF, the resin preferably has no aromatic group in view of the transparency to ArF light.

The resin for use in the present invention can be synthesized by an ordinary method (for example, radical polymerization). In the general synthesis method, for example, monomer species are charged into a reactor all at once or on the way of reaction and dissolved, if desired, in a reaction solvent such as tetrahydrofuran, 1,4-dioxane, ethers (e.g., diisopropyl ether), ketones (e.g., methyl ethyl ketone, methyl isobutyl ketone) and esters (e.g., ethyl acetate), or in a solvent which dissolves the composition of the present invention, such as propylene glycol monomethyl ether acetate which is described later. The obtained solution is rendered uniform and, if desired, under heating in an inert gas atmosphere such as nitrogen or argon, polymerized by using a commercially available radical polymerization initiator (e.g., azo-base initiator, peroxide). If desired, the initiator may be added additionally or in parts. After the completion of reaction, the reactant is poured into a solvent and the desired polymer is recovered by a powder or solid recovery method.

The reaction concentration is usually 20% by weight or more, preferably 30% by weight or more, more preferably 40% by weight or more, and the reaction temperature is usually from 10 to 150° C., preferably from 30 to 120° C., more preferably from 50 to 100° C.

The repeating structural units in the above-described specific examples may be used individually or as a mixture of several units.

Also, in the present invention, one resin may be used or a plurality of resins may be used in combination.

The weight average molecular weight of the resin for use in the present invention is preferably from 1,000 to 200,000, more preferably from 3,000 to 20,000, in terms of polystyrene by GPC method. With a weight average molecular weight of 1,000 to 200,000, the heat resistance, dry etching resistance, developability and film-forming property can be enhanced.

The molecular weight distribution (Mw/Mn) is usually from 1 to 10, preferably from 1 to 5, more preferably from 1 to 4. As the molecular weight distribution is smaller, more excellent effect is obtained in the resolution, resist shape, smoothness of resist pattern side wall and roughness property.

In the positive resist composition of the present invention, the amount of all resins for use in the present invention blended in the entire composition is preferably from 40 to 99.99% by weight, more preferably from 50 to 99.97% by weight, based on the entire resist solid content.

[2] Compound Capable of Generating Acid Upon Irradiation with Actinic Rays or Radiation (Component B)

The compound capable of generating an acid upon irradiation with actinic rays or radiation (photo-acid generator) for use in the present invention may be appropriately selected from a photoinitiator for photocationic polymerization, a photoinitiator for photoradical polymerization, a photo-decoloring agent for dyes, a photo-discoloring agent, a known compound of generating an acid upon irradiation with actinic rays or radiation used for microresist and the like (for example, KrF excimer laser (248 nm), ArF excimer laser (193 nm), $F_2$ excimer laser (157 nm), X ray or electron beam) and a mixture thereof.

Examples thereof include onium salts such as diazonium salt, ammonium salt, phosphonium salt, iodonium salt, sulfonium salt, selenonium salt and arsonium salt, organic halogen compounds, organic metals/organic halides, photo-acid generators having an o-nitrobenzyl-type protective group, compounds of undergoing photodecomposition to generate a sulfonic acid, represented by iminosulfonate and the like, and disulfone compounds.

In addition, compounds where the above-described group or compound of generating an acid upon irradiation with actinic rays or radiation is introduced into the polymer main or side chain, described, for example, in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029 may also be used.

Furthermore, compounds of generating an acid under the action of light, described, for example, in U.S. Pat. No. 3,779,778 and European Patent 126,712 may also be used.

More specifically, for example, the following compounds can be used.

(2) Iodonium salt compound represented by the following formula (PAG1) and sulfonium salt compound represented by formula (PAG2):

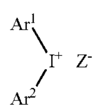

(PAG1)

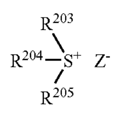

(PAG2)

In these formulae, $Ar^1$ and $Ar^2$ each independently represents an aryl group. The aryl group represented by $Ar^1$ and $Ar^2$ may have a substituent. Examples of the substituent which may be substituted to the aryl group represented by $Ar^1$ and $Ar^2$ include an alkyl group, a cycloalkyl group, an alkoxy group, a nitro group, a carboxyl group, an alkoxycarbonyl group, a hydroxy group, a mercapto group and a halogen atom.

$R^{203}$, $R^{204}$ and $R^{205}$ each independently represents an alkyl group or an aryl group, preferably an aryl group having from 6 to 14 carbon atoms, an alkyl group having from 1 to 8 carbon atoms, or a substitution derivative thereof.

The alkyl group and aryl group represented by $R^{203}$, $R^{204}$ and $R^{205}$ each may have a substituent. Preferred examples of the substituent of the aryl group include an alkoxy group having from 1 to 8 carbon atoms, an alkyl group having from 1 to 8 carbon atoms, a nitro group, a carboxyl group, a hydroxy group and a halogen atom, and preferred examples of the substituent of the alkyl group include an alkoxy group having from 1 to 8 carbon atoms, a carboxyl group and an alkoxycarbonyl group.

$Z^-$ represents a counter anion and examples thereof include perfluoroalkane sulfonate anion (e.g., $BF_4^-$, $AsF_6^-$, $PF_6^-$, $SbF_6^-$, $SiF_6^{2-}$, $ClO_4^-$, $CF_3SO_3^-$), pentafluorobenzene sulfonate anion, condensed polynuclear aromatic sulfonate anion (e.g., naphthalene-1-sulfonate anion), anthraquinone sulfonate anion, and sulfonic acid group-containing dyes, however, the present invention is not limited thereto.

Two of R203, $R^{204}$ and $R^{205}$, or $Ar^1$ and $Ar^2$ may be combined through a single bond or a substituent.

Specific examples of these onium salt compounds include the following compounds, however, the present invention is not limited thereto.

(PAG1-1)

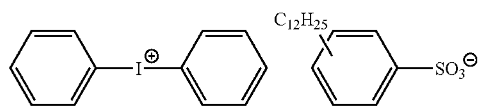

(PAG1-2)

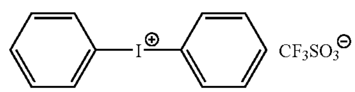

(PAG1-3)

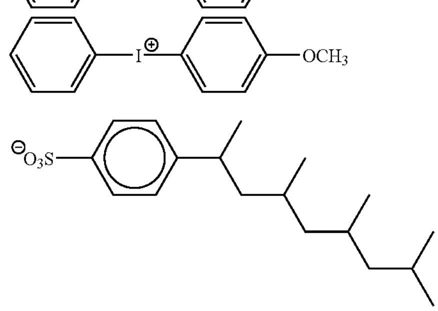

(PAG1-4)

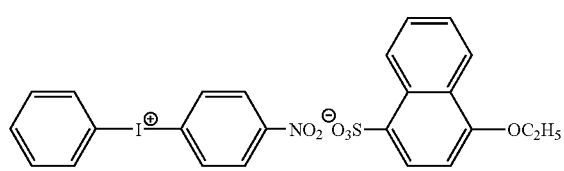

(PAG1-5)

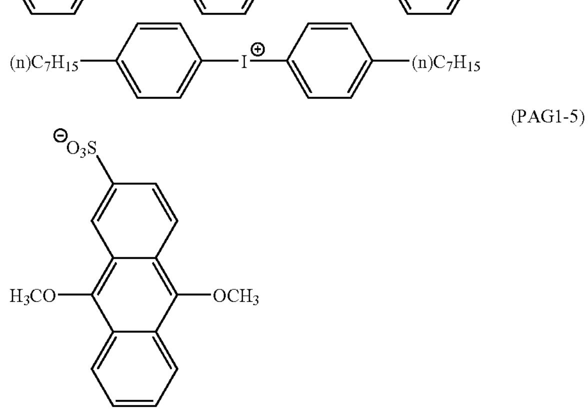

-continued
(PAG1-6)
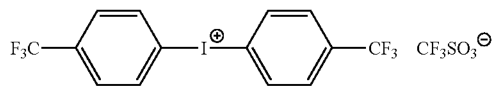
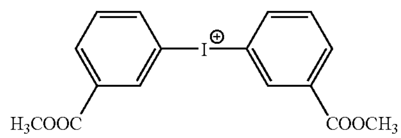
(PAG1-7)
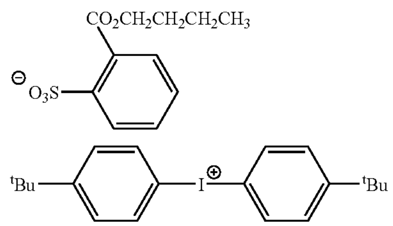
(PAG1-8)
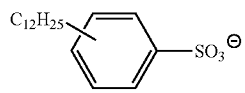
(PAG1-9)
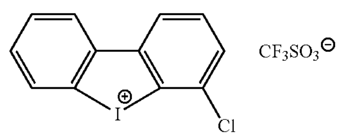
(PAG1-10)
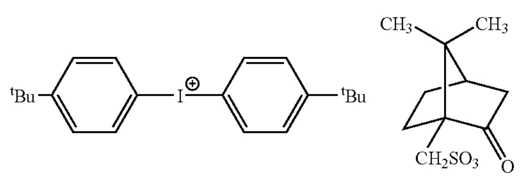
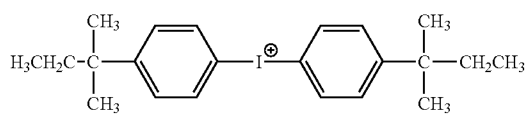
(PAG1-11)
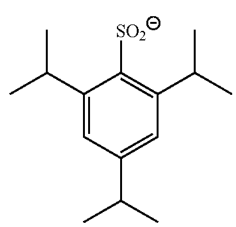
(PAG1-12)
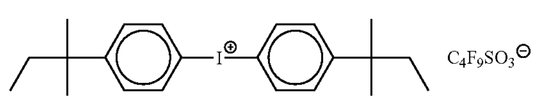
(PAG1-13)
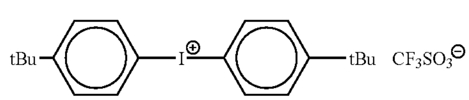
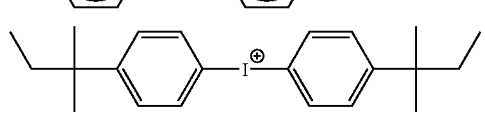
-continued
(PAG1-14)
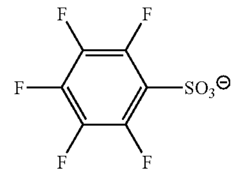
(PAG2-1)
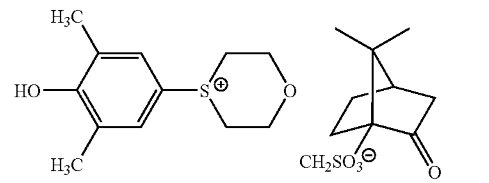
(PAG2-2)
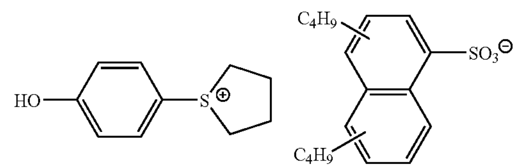
(PAG2-3)
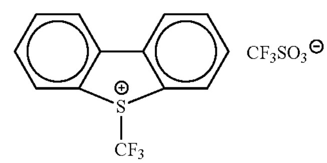
(PAG2-4)
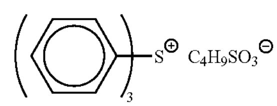
(PAG2-5)
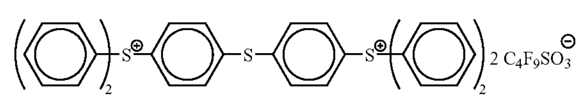
(PAG2-6)
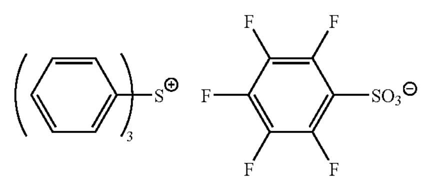
(PAG2-7)
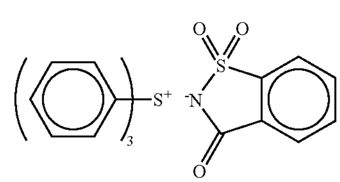
(PAG2-8)
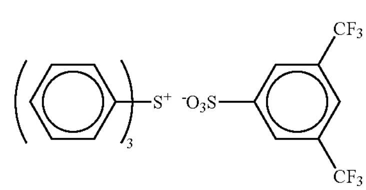
The onium salts represented by formulae (PAG1) and (PAG2) are known and can be synthesized by the method described, for example, in U.S. Pat. Nos. 2,807,648 and 4,247,473 and JP-A-53-101331.

(3) Disulfone derivative represented by the following formula (PAG3) and iminosulfonate derivative represented by formula (PAG4):

$$Ar^3—SO_2—SO_2—Ar^4 \quad \text{(PAG3)}$$

(PAG4)

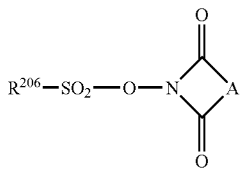

wherein $Ar^3$ and $Ar^4$ each independently represents an aryl group, $R^{206}$ represents an alkyl group or an aryl group, and A represents an alkylene group, an alkenylene group or an arylene group.

Specific examples thereof include the following compounds, however, the present invention is not limited thereto.

(PAG3-1)

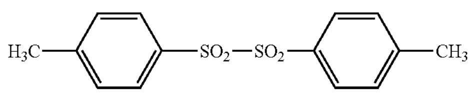

(PAG3-2)

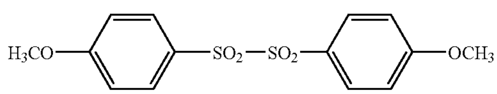

(PAG3-3)

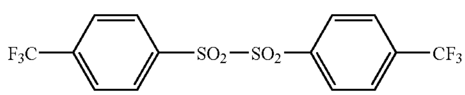

(PAG3-4)

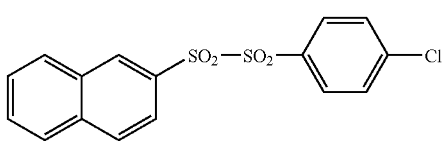

(PAG3-5)

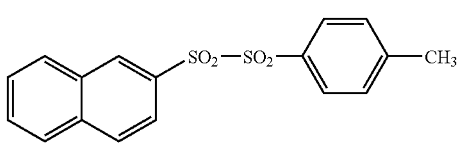

(PAG3-6)

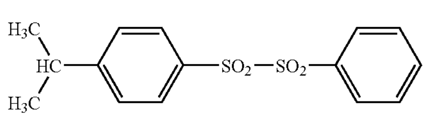

(PAG3-7)

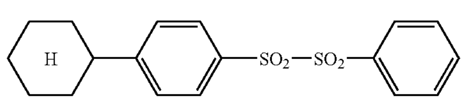

-continued (PAG4-1)

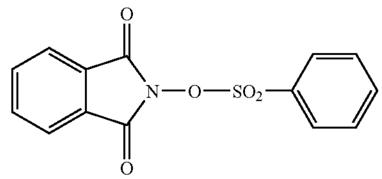

(PAG4-2)

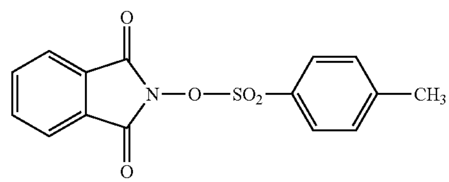

(PAG4-3)

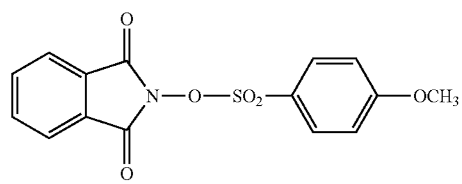

(PAG4-4)

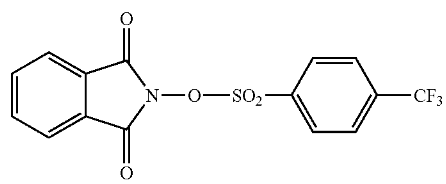

(PAG4-5)

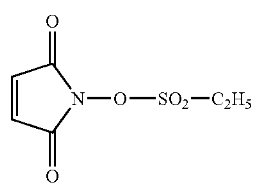

(PAG4-6)

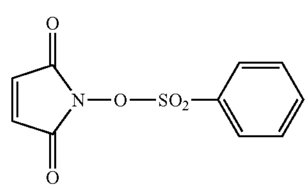

(PAG4-7)

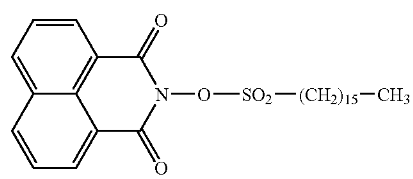

(3) Diazodisulfone derivative represented by the following formula (PAG5):

(PAG5)

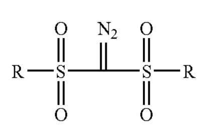

where each R independently represents a linear or branched alkyl group, a cycloalkyl group or an aryl group.

Specific examples thereof include the following compounds, however, the present invention is not limited thereto.

(PAG5-1)

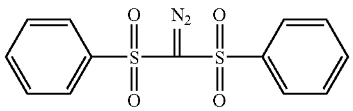

(PAG5-2)

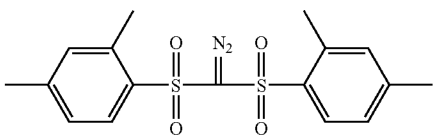

(PAG5-3)

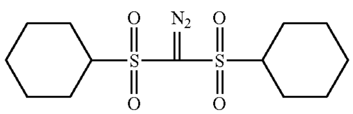

(PAG5-4)

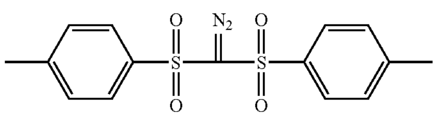

(PAG5-5)

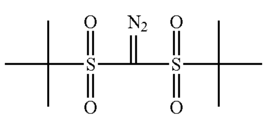

The composition of the present invention preferably comprises a sulfonium salt compound as the photo-acid generator, more preferably at least either one of a triarylsulfonium salt compound (B1) and a phenacylsulfonium salt (B2), still more preferably both of a triarylsulfonium salt compound (B1) and a phenacylsulfonium salt (B2).

(B1) Triarylsulfonium Salt Compound

The triarylsulfonium salt is a salt having a triarylsulfonium as cation.

The aryl group in the triarylsulfonium cation is preferably a phenyl group or a naphthyl group, more preferably a phenyl group. Three aryl groups in the triarylsulfonium cation may be the same or different.

Each aryl group may have, as a substituent, an alkyl group (for example, an alkyl group having from 1 to 15 carbon atoms), an alkoxy group (for example, an alkoxy group having from 1 to 15 carbon atoms), a halogen atom, a hydroxyl group or a phenylthio group. The substituent is preferably an alkyl group having from 1 to 8 carbon atoms or an alkoxy group having from 1 to 8 carbon atoms, and most preferably a methyl group, a tert-butyl group or an alkoxy group having from 1 to 4 carbon atoms. The substituent may be substituted to one of three aryl groups or may be substituted to all three aryl groups. The substituent is preferably substituted at the p-position of the aryl group.

The anion of the triarylsulfonium salt is, for example, sulfonate anion, preferably alkanesulfonate anion substituted at the 1-position by a fluorine atom, or bezenesulfonate anion substituted by an electron-withdrawing group, more preferably a perfluoroalkane-sulfonate anion having from 1 to 8 carbon atoms, and most preferably perfluorobutanesulfonate anion or perfluoro-octanesulfonate anion. By using these, the decomposition rate of the acid-decomposable group increases to ensure excellent sensitivity and the diffusion of acid generated is inhibited to enhance the resolving power.

The compound may have a plurality of triarylsulfonium structures by combining the triarylsulfonium structure with another triarylsulfonium structure through a linking group such as —S—.

Examples of the electron-withdrawing group include a fluorine atom, a chlorine atom, a bromine atom, a nitro group, a cyano group, an alkoxycarbonyl group, an acyloxy group and an acyl group.

Specific examples of the triarylsulfonium salt which can be used in the present invention are set forth below, however, the present invention is not limited thereto.

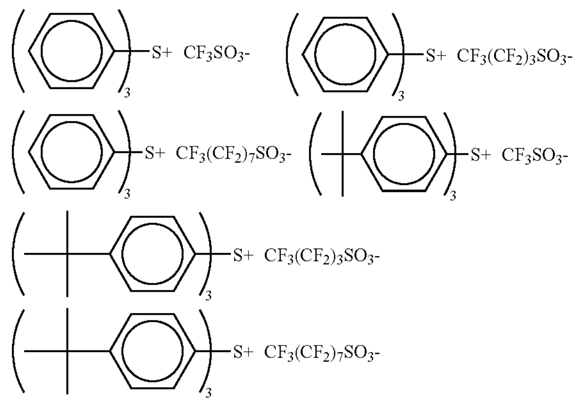

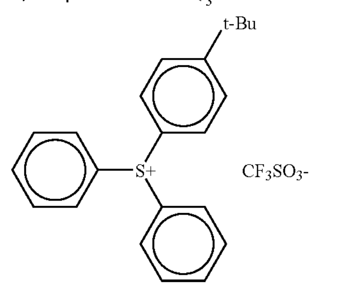

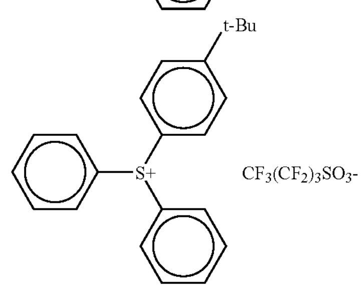

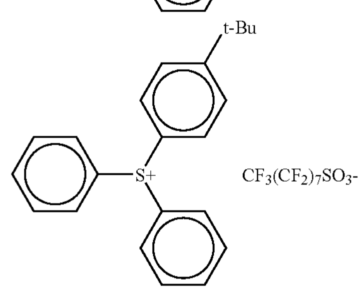

-continued
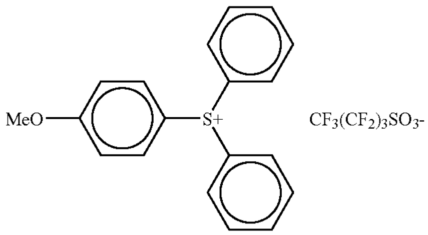
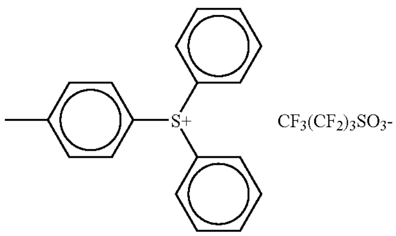
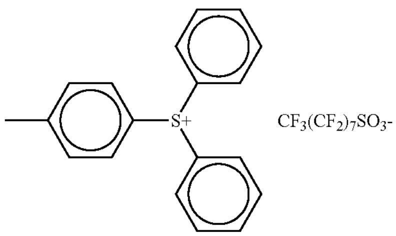
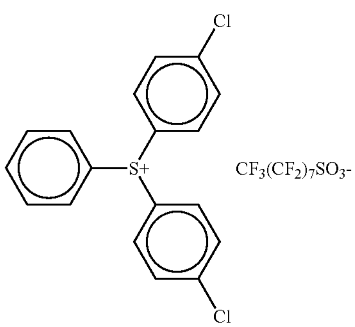
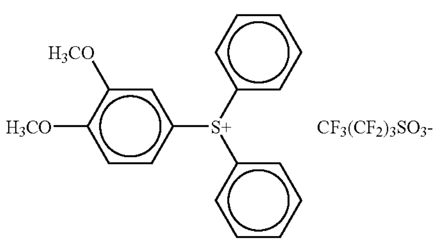
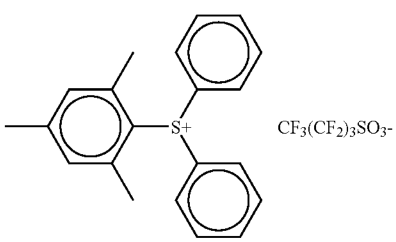
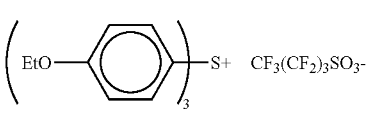
-continued
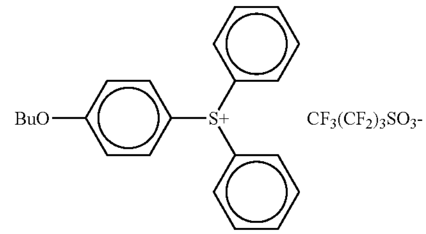
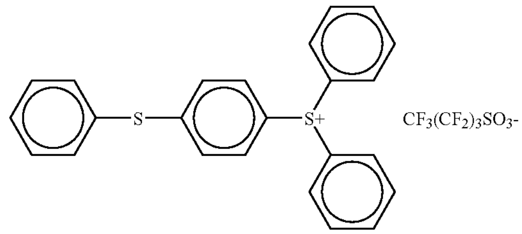
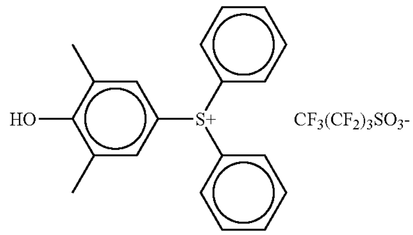
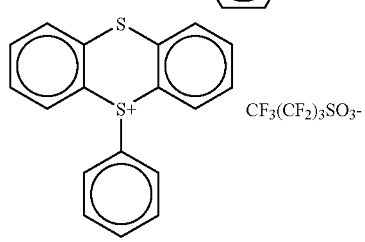
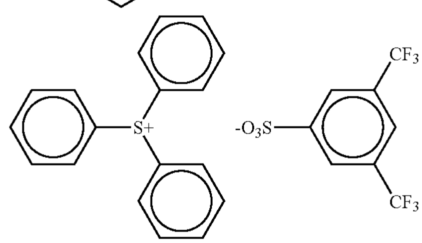
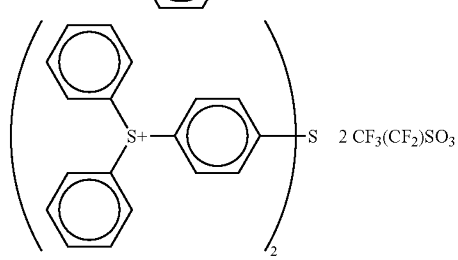
Furthermore, the following compounds may be used.
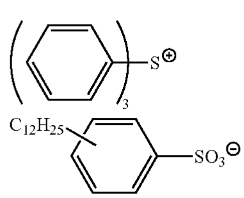

-continued
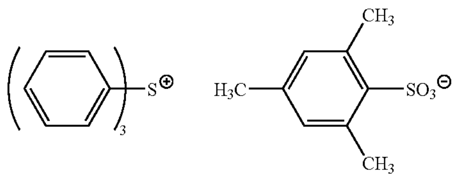
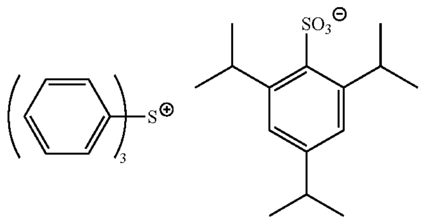
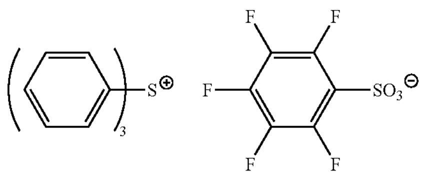
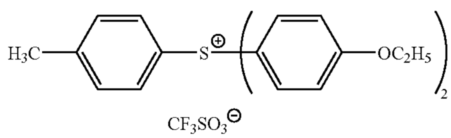
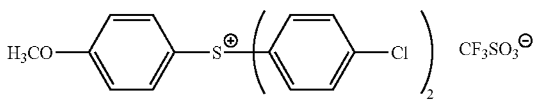
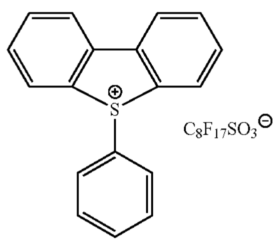
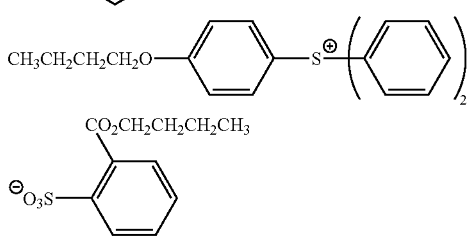
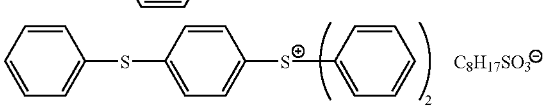
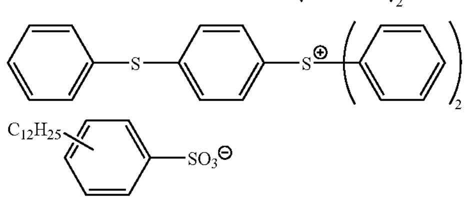
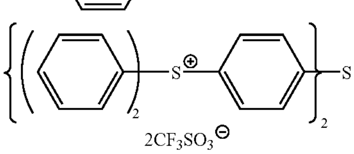
-continued
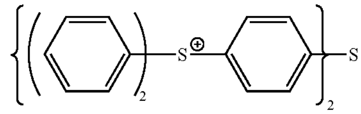
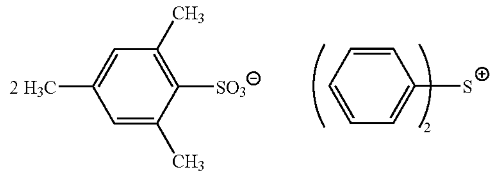
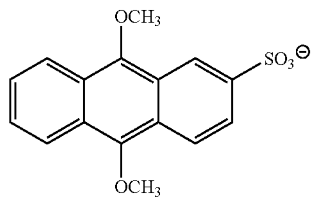
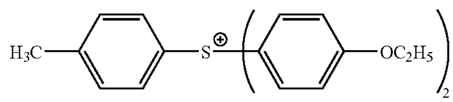
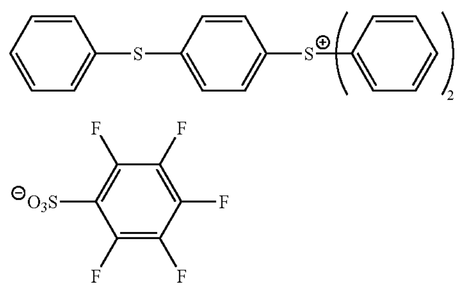
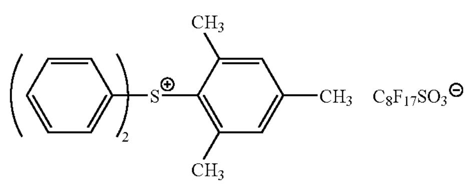
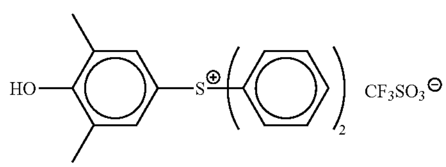
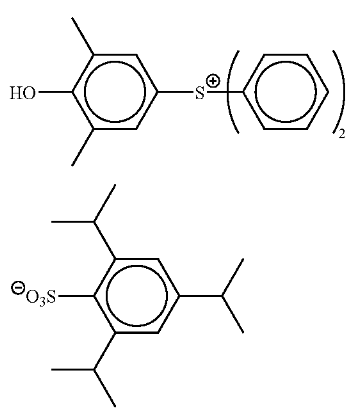

-continued
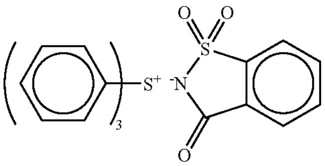
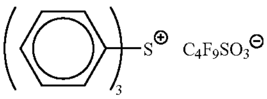
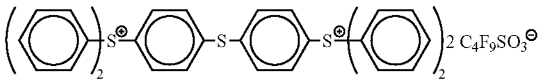
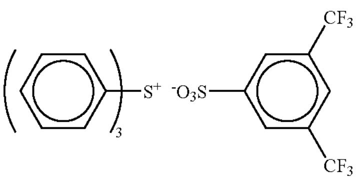
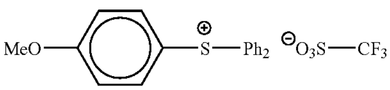
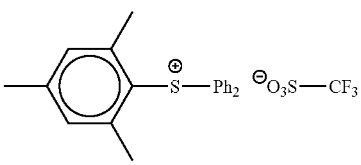
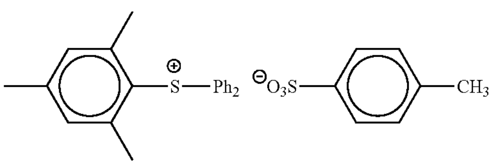
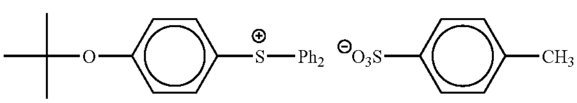
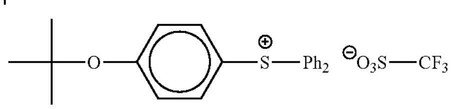
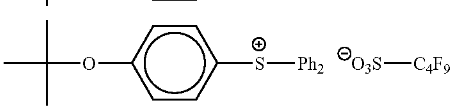
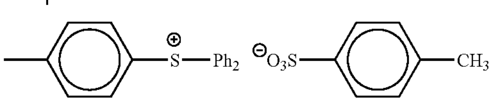
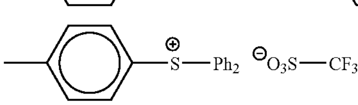
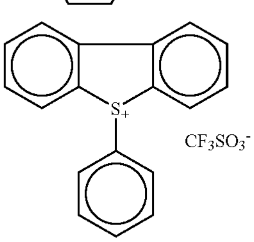
-continued
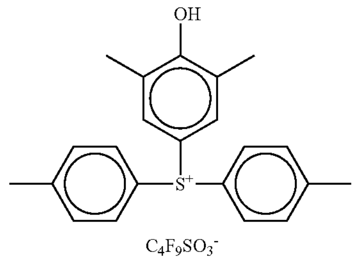
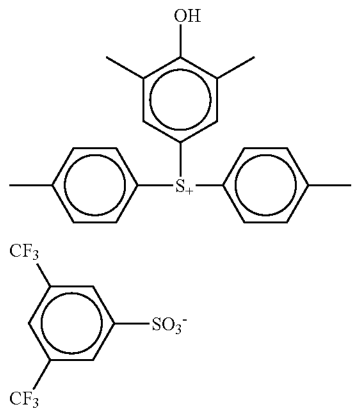
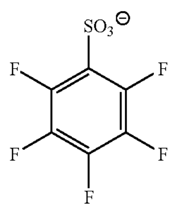
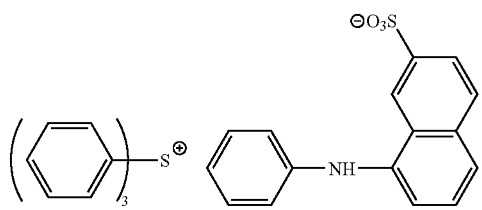
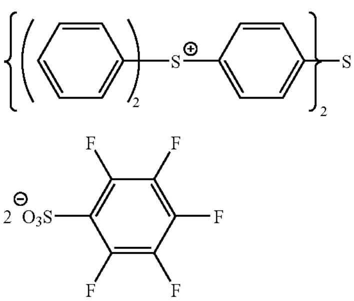
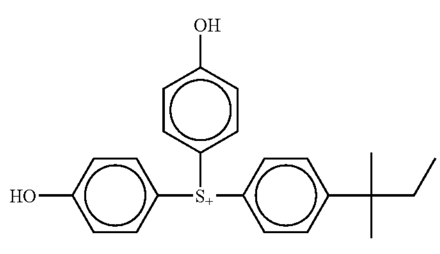

-continued
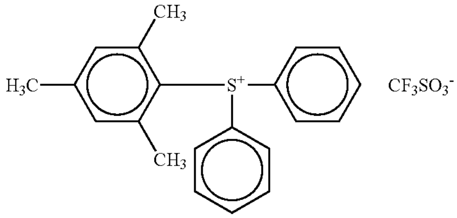
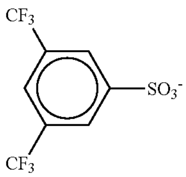
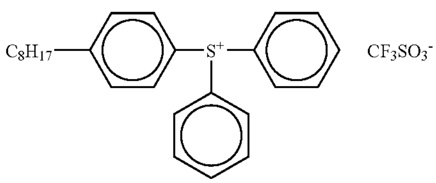
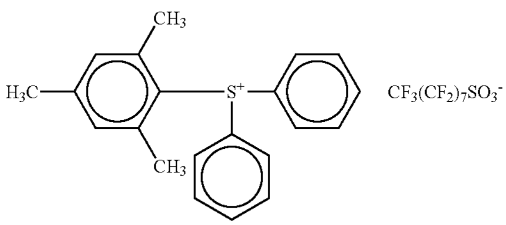
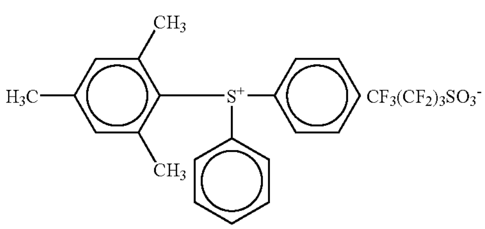
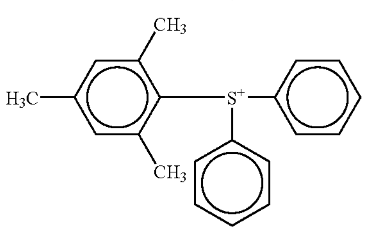
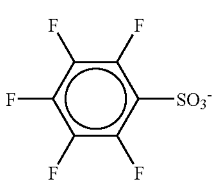
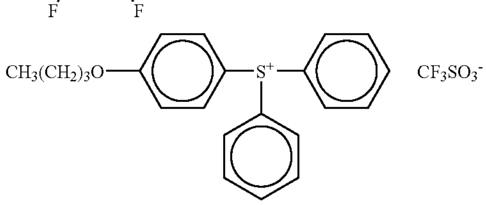
-continued
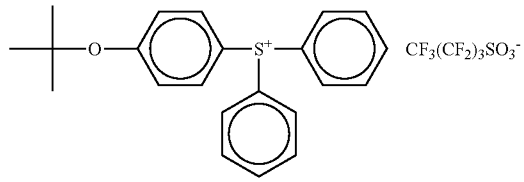
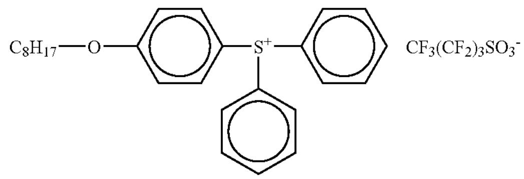
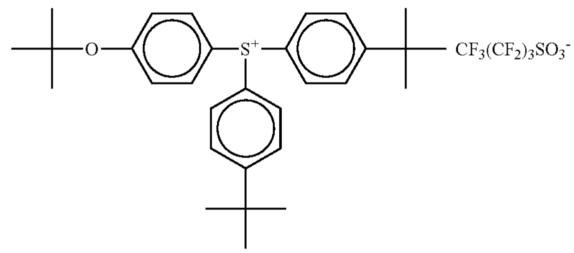
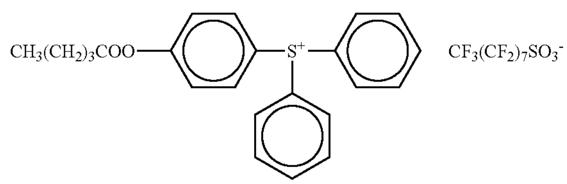
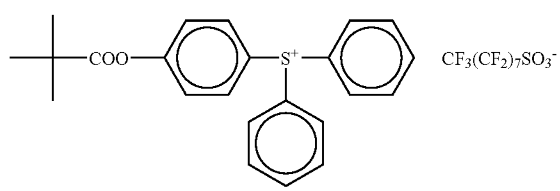
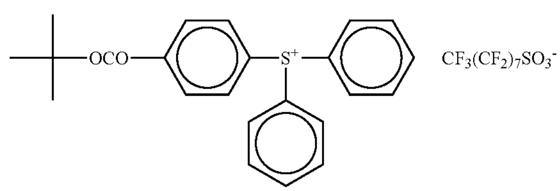
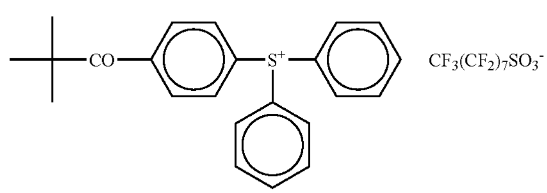
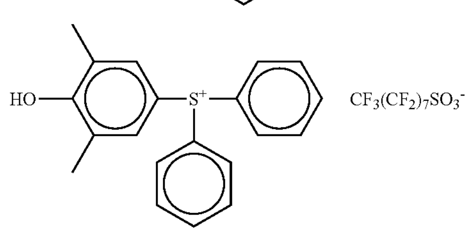

-continued
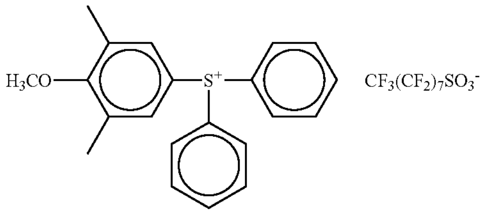
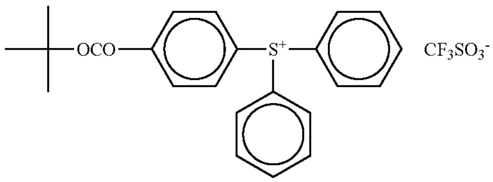
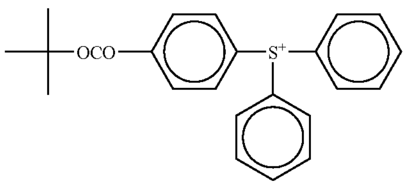
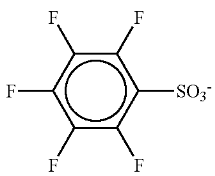
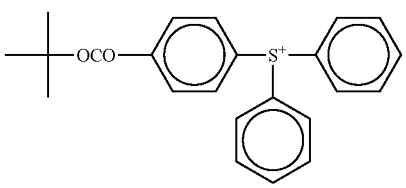
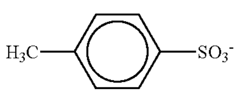
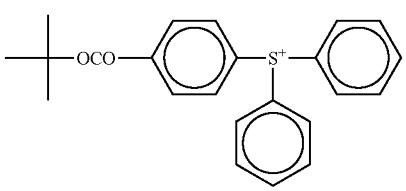
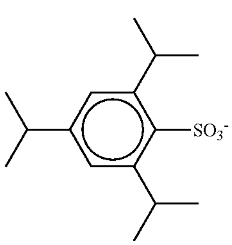
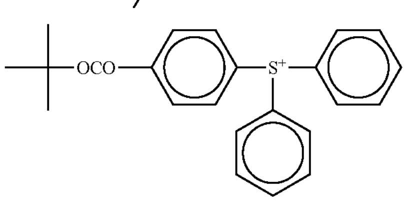
-continued
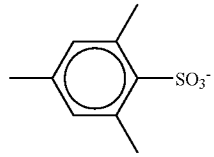
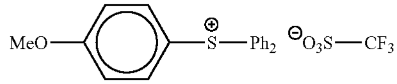
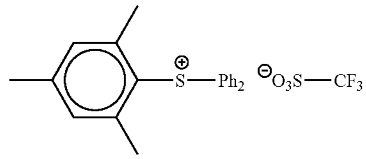
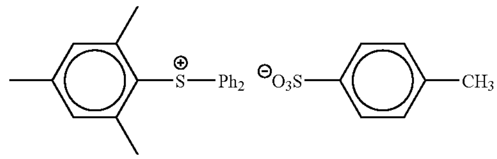
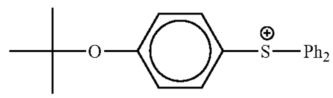
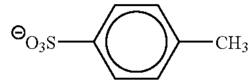
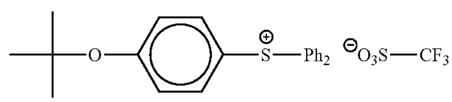
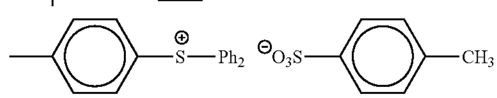
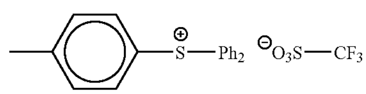
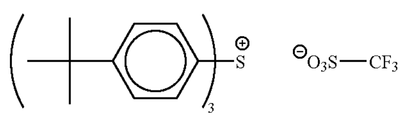
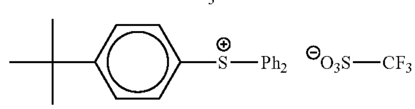
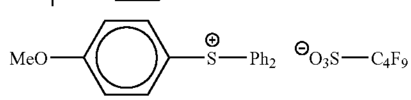
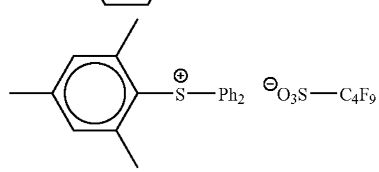
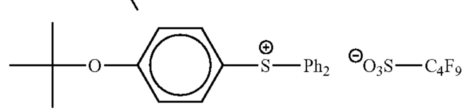
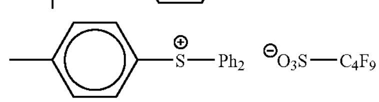

-continued

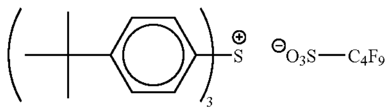

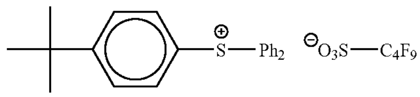

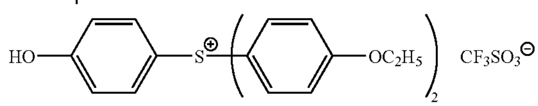

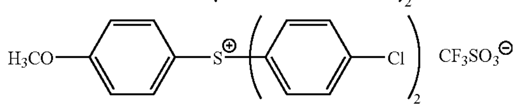

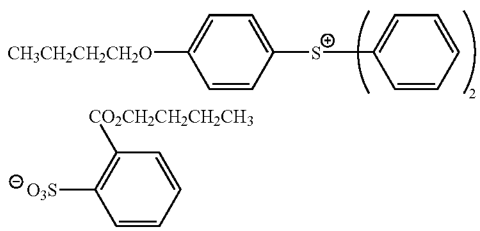

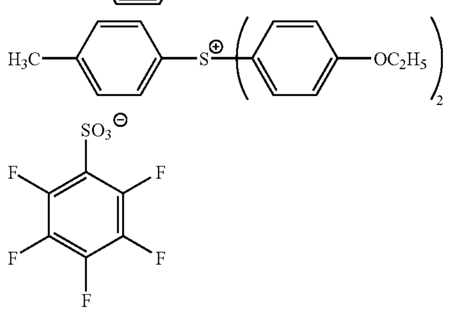

(B2) Phenacylsulfonium Salt Compound

The phenacylsulfonium salt compound may be sufficient if it is a sulfonium salt compound having a phenacyl skeleton in the cation moiety, and is preferably, for example, a compound represented by the following formula (PAG6):

(PAG6)

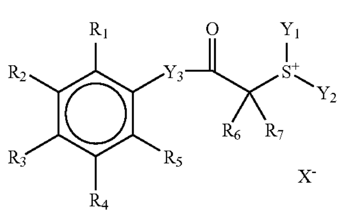

wherein $R_1$ to $R_5$ each independently represents a hydrogen atom, an alkyl group, a cycloalkyl group, an alkoxy group, a nitro group, a halogen atom, an alkyloxycarbonyl group or an aryl group, at least two or more of $R_1$ to $R_5$ may combine to form a ring structure, $R_6$ and $R_7$ each independently represents a hydrogen atom, an alkyl group, a cycloalkyl group, a cyano group or an aryl group, $Y_1$ and $Y_2$ each independently represents an alkyl group, a cycloalkyl group, an aryl group, an aralkyl group or an aromatic group containing a heteroatom, $Y_1$ and $Y_2$ may combine to form a ring, $Y_3$ represents a single bond or a divalent linking group, $X^-$ represents non-nucleophilic anion, and at least one of $R_1$ to $R_5$ and at least one of $Y_1$ and $Y_2$ may combine to form a ring, or at least one of $R_1$ to $R_5$ and at least one of $R_6$ and $R_7$ may be combined to form a ring.

The compound may have two or more structures of formula (PAG6) by combining these at any position of $R_1$ to $R_7$, $Y_1$ and $Y_2$ through a linking group.

The alkyl group represented by $R_1$ to $R_7$ is preferably an alkyl group having from 1 to 5 carbon atoms, such as methyl group, ethyl group, propyl group, n-butyl group, sec-butyl group and tert-butyl group.

The cycloalkyl group represented by $R_1$ to $R_7$ is preferably a cycloalkyl group having from 3 to 8 carbon atoms, such as cyclopropyl group, cyclobutyl group, cyclopentyl group, cyclohexyl group and cyclooctyl group.

The alkoxy group represented by $R_1$ to $R_5$ and the alkoxy group in the alkyloxycarbonyl group represented by $R_1$ to $R_5$ are preferably an alkoxy group having from 1 to 5 carbon atoms, such as methoxy group, ethoxy group, propoxy group and butoxy group.

The aryl group represented by $R_1$ to $R_7$ is preferably an aryl group having from 6 to 14 carbon atoms, such as phenyl group, tolyl group and naphthyl group.

Examples of the halogen atom represented by $R_1$ to $R_5$ include a fluorine atom, a chlorine atom, a bromine atom and an iodine atom.

The alkyl group represented by $Y_1$ and $Y_2$ is preferably a linear or branched alkyl group having from 1 to 30 carbon atoms, such as methyl group, ethyl group, propyl group, isopropyl group, n-butyl group, isobutyl group, sec-butyl group, pentyl group, neopentyl group, hexyl group, heptyl group, octyl group, nonyl group, decyl group, undecyl group, dodecyl group, tridecyl group, tetradecyl group, pentadecyl group, hexadecyl group, heptadecyl group, octadecyl group, nonadecyl group and eicosyl group.

The cycloalkyl group represented by $Y_1$ and $Y_2$ is preferably a cycloalkyl group having from 3 to 30 carbon atoms, such as cyclopropyl group, cyclopentyl group, cyclohexyl group, adamantyl group, norbornyl group and boronyl group.

The aryl group represented by $Y_1$ and $Y_2$ is preferably an aryl group having from 6 to 14 carbon atoms, such as phenyl group, tolyl group and naphthyl group.

The aralkyl group represented by $Y_1$ and $Y_2$ is preferably an aralkyl group having from 7 to 12 carbon atoms, such as benzyl group, phenethyl group and cumyl group.

The aromatic group containing a heteroatom means a group where a heteroatom such as nitrogen atom, oxygen atom and sulfur atom is contained in an aromatic group such as an aryl group having from 6 to 14 carbon atoms.

Examples of the aromatic group containing a heteroatom represented by $Y_1$ and $Y_2$ include a hetero-aromatic hydrocarbon group such as furan, thiophene, pyrrole, pyridine and indole.

$Y_1$ and $Y_2$ may be combined to form a ring together with $S^+$ in formula (PAG6).

In this case, examples of the group formed resulting from combining of $Y_1$ and $Y_2$ include an alkylene group having from 4 to 10 carbon atoms. Among these alkylene groups, preferred are a butylene group, a pentylene group and a hexylene group, more preferred are a butylene group and a pentylene group.

When $Y_1$ and $Y_2$ are combined to form a ring together with $S^+$ in formula (PAG6), the ring formed may contain a hetero atom.

These alkyl group, cycloalkyl group, alkoxy group, alkoxycarbonyl group, aryl group and aralkyl group each may be substituted, for example, by a nitro group, a halogen atom, a carboxyl group, a hydroxyl group, an amino group, a cyano group or an alkoxy group (preferably having from 1 to 5 carbon atoms). The aryl group and aralkyl group each may also be substituted by an alkyl group (preferably having from 1 to 5 carbon atoms).

The substituent of the alkyl group is preferably a halogen atom.

$Y_3$ represents a single bond or a divalent linking group and the divalent linking group is preferably an alkylene group, an alkenylene group, —O—, —S—, —CO—, —CONHR—(wherein R is hydrogen, an alkyl group or an acyl group) or a linking group which may contain two or more thereof.

Examples of the non-nucleophilic anion represented by $X^-$ include sulfonate anion and carboxylate anion.

The non-nucleophilic anion is anion extremely low in the ability of causing a nucleophilic reaction. By virtue of this anion, the aging stability of resist is enhanced.

Examples of the sulfonate anion include aliphatic sulfonate anion, aromatic sulfonate anion and camphor sulfonate anion.

Examples of the carboxylate anion include aliphatic carboxylate anion, aromatic carboxylate anion and aralkyl carboxylate anion.

Examples of the aliphatic group in the aliphatic sulfonate anion include an alkyl group having from 1 to 30 carbon atoms (specifically, a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group and an eicosyl group) and a cycloalkyl group having from 3 to 30 carbon atoms (specifically, a cyclopropyl group, a cyclopentyl group, a cyclohexyl group, an adamantyl group, a norbornyl group and a boronyl group).

Examples of the aromatic group in the aromatic sulfonate anion include an aryl group having from 6 to 14 carbon atoms (specifically, a phenyl group, a tolyl group and a naphthyl group).

The alkyl group, cycloalkyl group and aryl group in the aliphatic sulfonate anion and aromatic sulfonate anion each may have a substituent.

Examples of the substituent include a halogen atom, an alkyl group, a cycloalkyl group, an aryl group, an alkoxy group and an alkylthio group.

Examples of the halogen atom include a chlorine atom, a bromine atom, a fluorine atom and an iodine atom.

The alkyl group is preferably an alkyl group having from 1 to 15 carbon atoms, such as methyl group, ethyl group, isopropyl group, n-butyl group, isobutyl group, sec-butyl group, pentyl group, neopentyl group, hexyl group, heptyl group, octyl group, nonyl group, decyl group, undecyl group, dodecyl group, tridecyl group, tetradecyl group, pentadecyl group, hexadecyl group, heptadecyl group, octadecyl group, nonadecyl group and elcosyl group.

The cycloalkyl group is preferably a cycloalkyl group having from 3 to 30 carbon atoms, such as cyclopropyl group, cyclopentyl group, cyclohexyl group, cycloheptyl group, cyclooctyl group, cyclononyl group, cyclodecanoyl group, adamantyl group, norbornyl group and boronyl group.

The aryl group is preferably an aryl group having from 6 to 10 carbon atoms, such as phenyl group, naphthyl group and anthryl group.

The alkoxy group is preferably an alkoxy group having from 1 to 5 carbon atoms, such as methoxy group, ethoxy group, propoxy group and butoxy group.

The alkylthio group is preferably an alkylthio group having from 1 to 15 carbon atoms, such as methylthio group, ethylthio group, propylthio group, isopropylthio group, n-butylthio group, isobutylthio group, sec-butylthio group, pentylthio group, neopentylthio group, hexylthio group, heptylthio group, octylthio group, nonylthio group, decylthio group, undecylthio group, dodecylthio group, tridecylthio group, tetradecylthio group, pentadecylthio group, hexadecylthio group, heptadecylthio group, octadecylthio group, nonadecylthio group and eicosylthio group. The alkyl group, cycloalkyl group, aryl group, alkoxy group and alkylthio group each may be further substituted by a halogen atom (preferably fluorine atom).

Examples of the aliphatic group in the aliphatic carboxylate anion are the same as examples of the aliphatic group in the aliphatic sulfonate anion.

Examples of the aromatic group in the aromatic carboxylate anion are the same as examples of the aromatic group in the aromatic sulfonate anion.

The aralkyl group in the aralkyl carboxylate anion is preferably an aralkyl group having from 6 to 12 carbon atoms, such as benzyl group, phenethyl group, naphthylmethyl group, naphthylethyl group and naphthylmethyl group.

The aliphatic group, aromatic group and aralkyl group in the aliphatic carboxylate anion, aromatic carboxylate anion and aralkyl carboxylate anion each may have a substituent and examples of the substituent include the same halogen atom, alkyl group, cycloalkyl group, aryl group, alkoxy group and alkylthio group as those described above in regard to the aromatic sulfonate anion.

Other examples of the non-nucleophilic anion include fluorinated phosphorus, fluorinated boron and fluorinated antimony.

In the compound represented by formula (PAG6), at least one of $R_1$ to $R_5$ and at least one of $Y_1$ and $Y_2$ may combine to form a ring, or at least one of $R_1$ to $R_5$ and at least one of $R_6$ and $R_7$ may be combined to form a ring. By forming a ring, the steric structure of the compound represented by formula (PAG6) is fixed and the photo-decomposability is enhanced.

The compound may have two or more structures of formula (PAG6) by combining these at any position of $R_1$ to $R_7$, $Y_1$ and $Y_2$ through a linking group.

Specific examples of the compound represented by formula (PAG6) are set forth below, however, the present invention is not limited thereto.

(PAGGA-1)

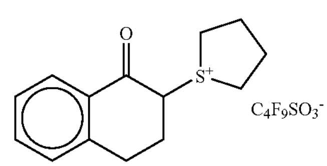

(PAGGA-2)

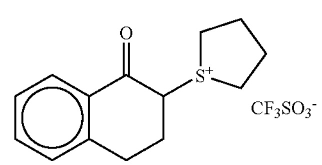

-continued
(PAGGA-3)
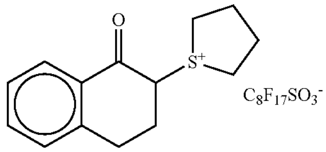
(PAGGA-4)
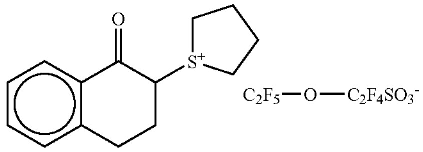
(PAGGA-5)
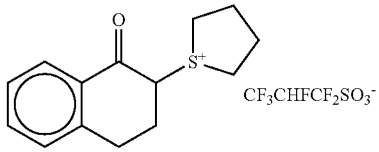
(PAGGA-6)
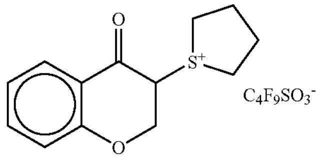
(PAGGA-7)
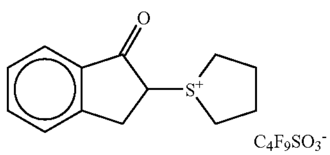
(PAGGA-8)
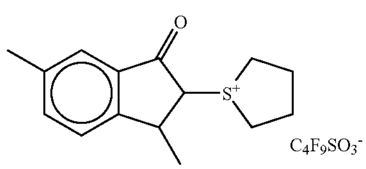
(PAGGA-9)
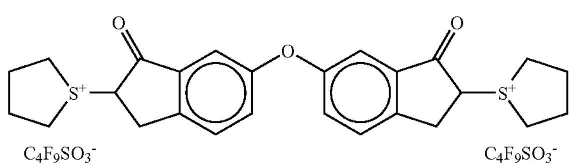
(PAGGA-10)
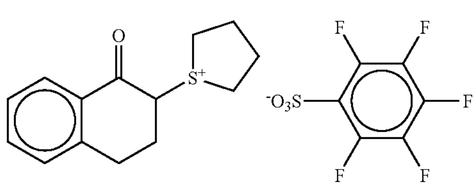
(PAGGA-11)
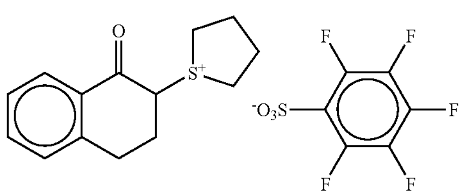
-continued
(PAGGA-12)
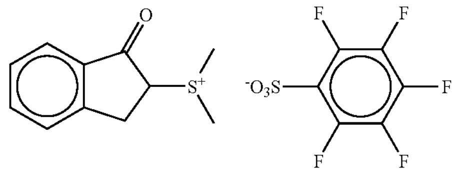
(PAGGA-13)
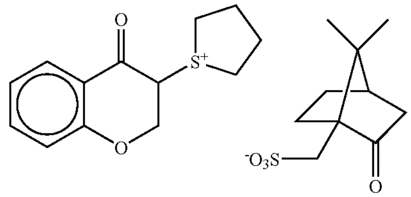
(PAGGB-1)
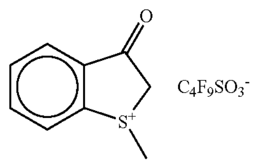
(PAGGB-2)
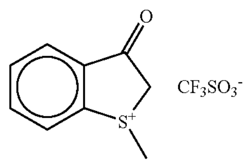
(PAGGB-3)
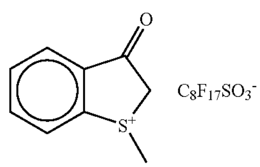
(PAGGB-4)
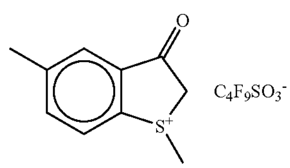
(PAGGB-5)
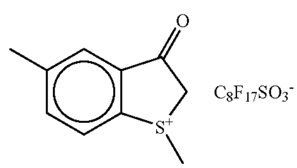
(PAGGB-6)
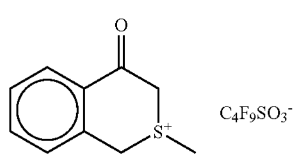
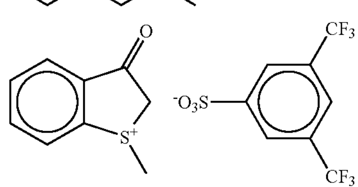

-continued
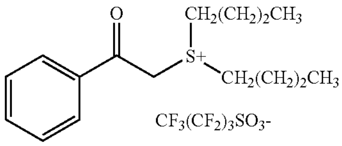
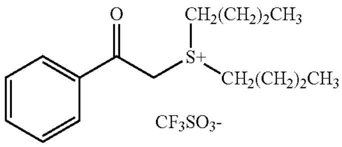
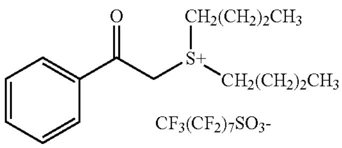
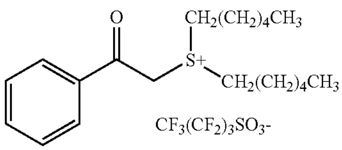
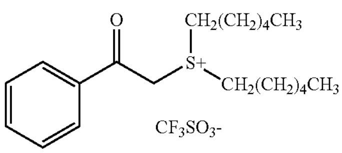
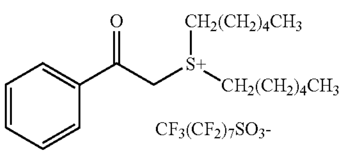
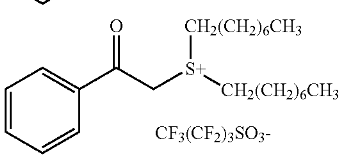
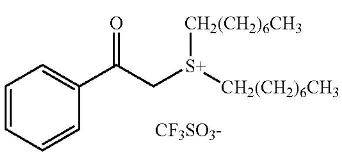
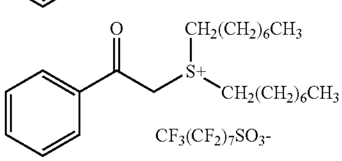
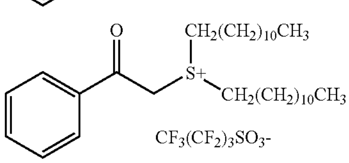
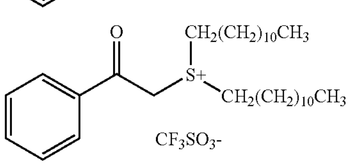
-continued
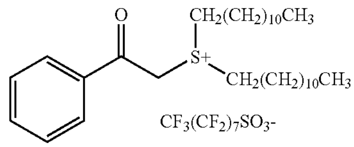
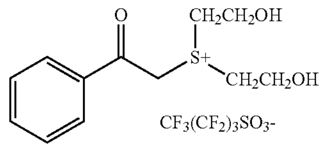
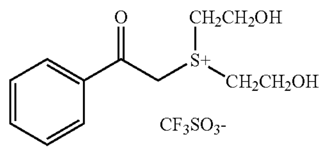
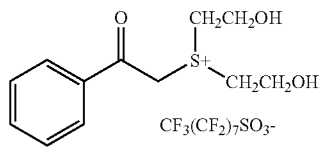
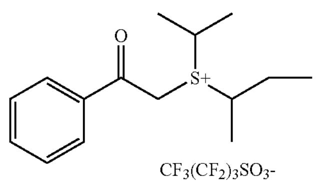
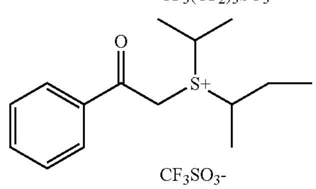
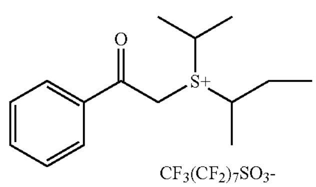
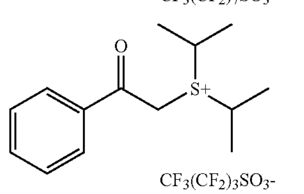
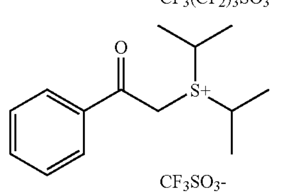
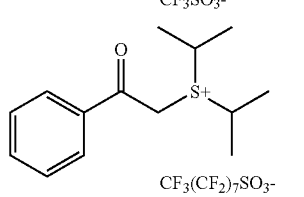

-continued
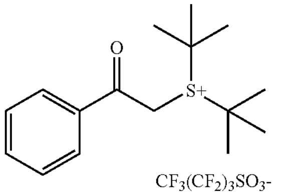
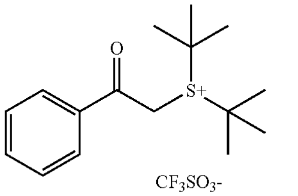
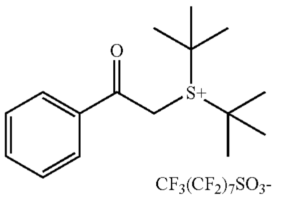
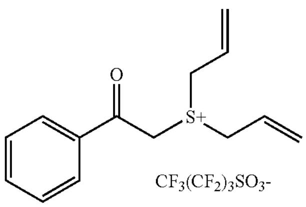
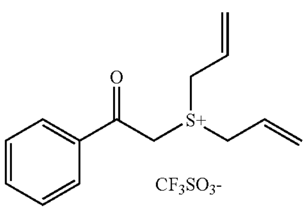
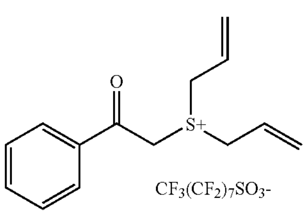
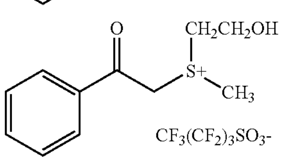
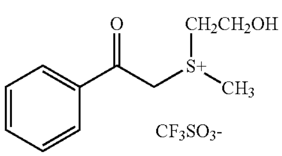
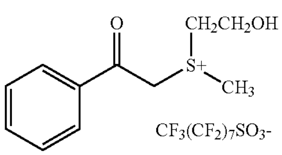
-continued
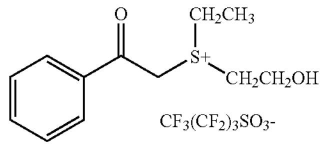
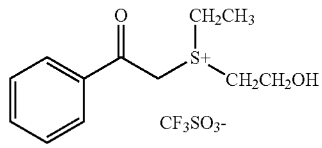
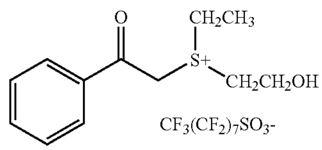
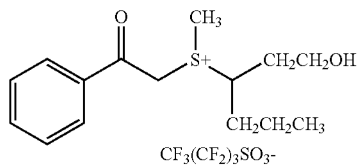
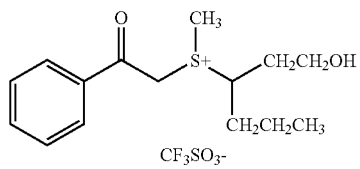
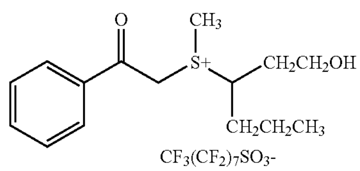
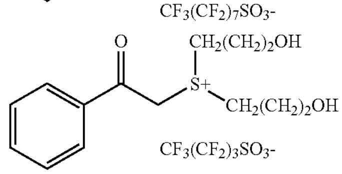
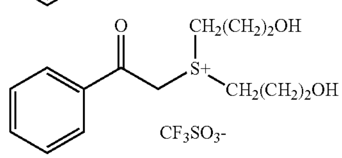
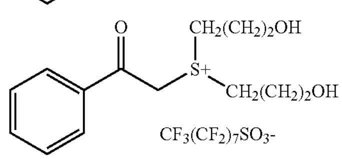
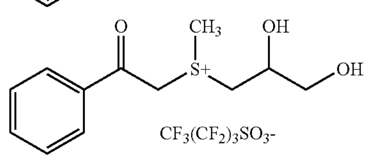
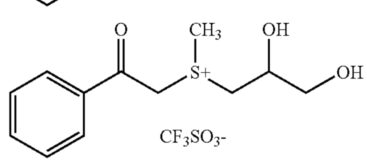

-continued
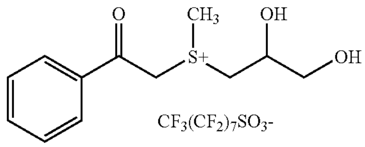
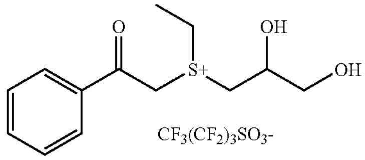
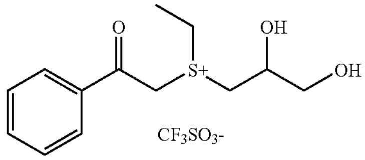
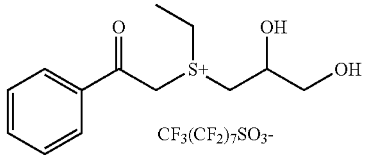
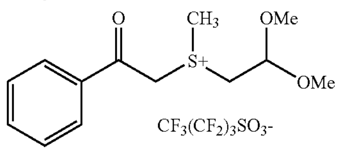
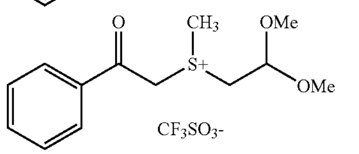
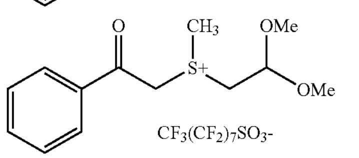
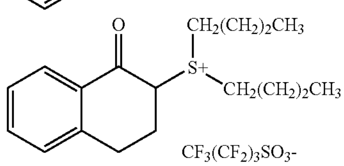
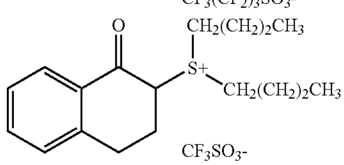
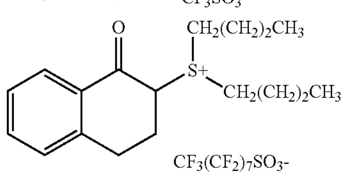
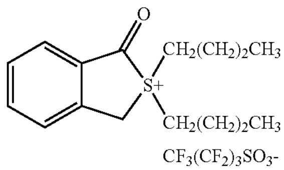
-continued
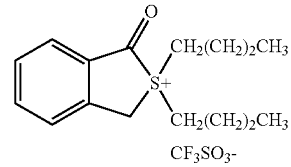
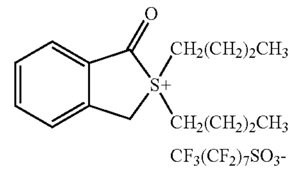
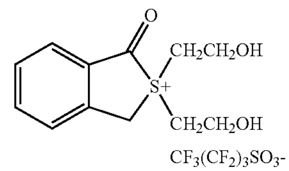
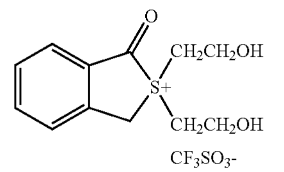
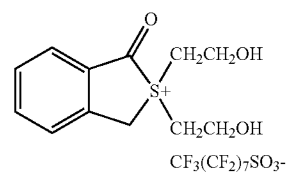
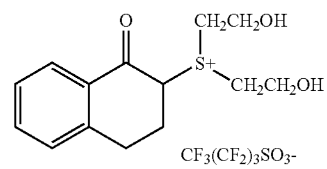
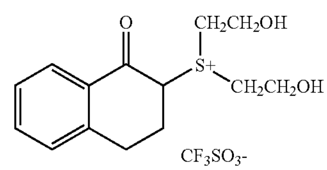
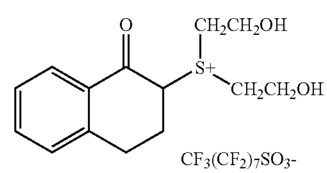
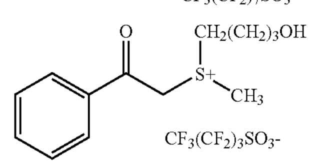
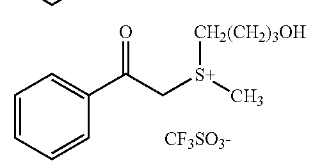

-continued

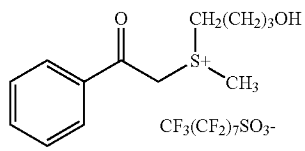

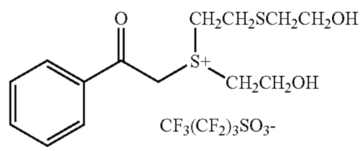

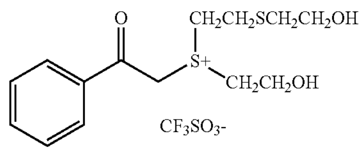

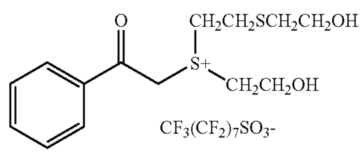

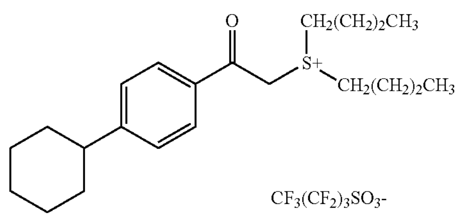

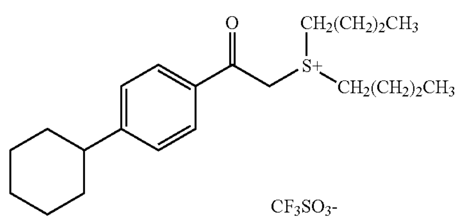

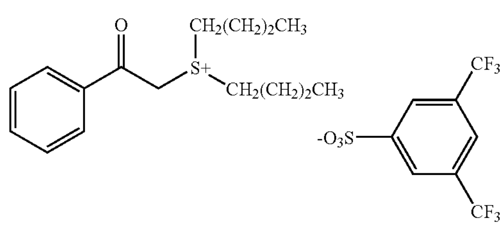

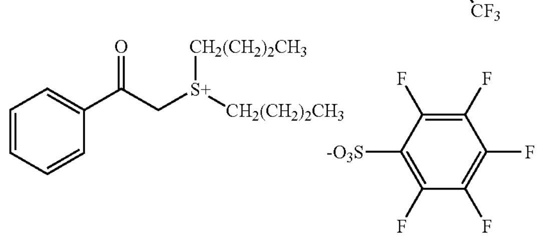

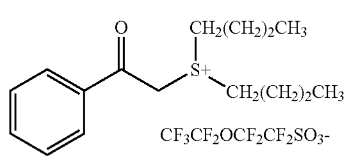

-continued

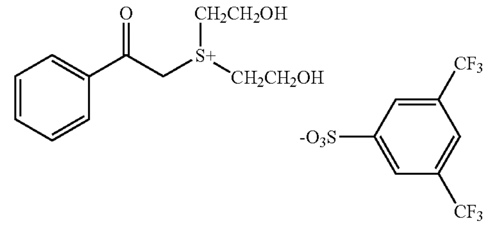

Among these specific examples of the acid generator represented by formula (PAG6), Compounds (PAG6A-1) to (PAG6A-13) and (PAG6B-1) to (PAG6B-7) are preferred.

One photo-acid generator may be used alone or two or more photo-acid generators may be used in combination.

The amount of the triarylsulfonium salt compound (B1) or phenacylsulfonium salt compound (B2) added is usually from 0.1 to 20% by weight, preferably from 0.5 to 20% by weight, more preferably from 1 to 10% by weight, based on the entire solid content of the composition.

In the present invention, the triarylsulfonium salt compound (B1) and the phenacylsulfonium salt compound (B2) are preferably used in combination and in this case, the ratio (B1)/(B2) (by weight) is preferably from 97/3 to 5/95, more preferably from 90/10 to 10/90, still more preferably from 30/70 to 70/30.

The total amount of photo-acid generators contained in the composition of the present invention is preferably from 0.1 to 20% by weight, more preferably from 0.5 to 20% by weight, still more preferably from 1 to 15% by weight.

Among the acid generators for use in the present invention, particularly preferred examples are set forth below.

z1

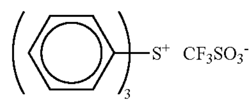

z2

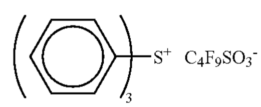

z3

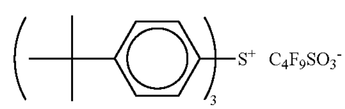

z4

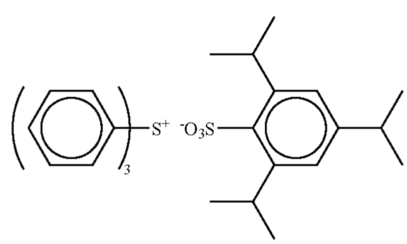

z5

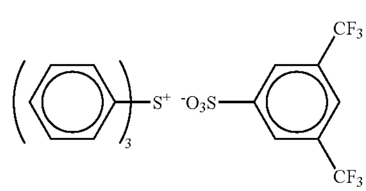

-continued
z6
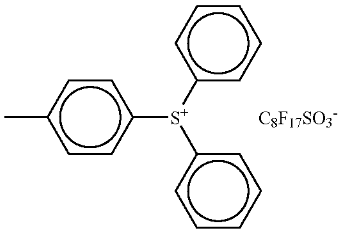
z7
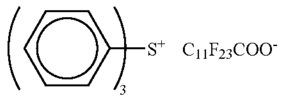
z8
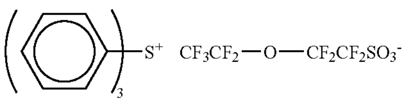
z9
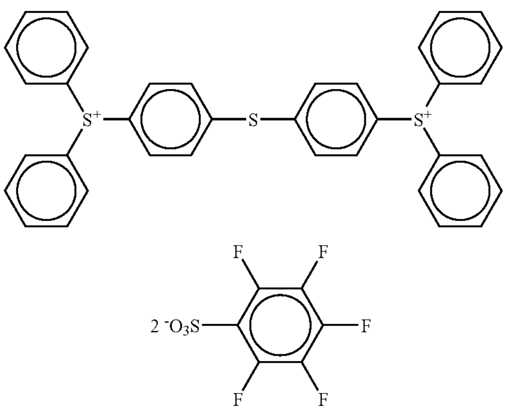
z10
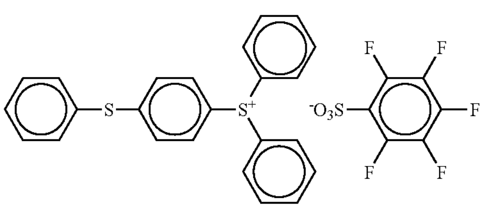
z11
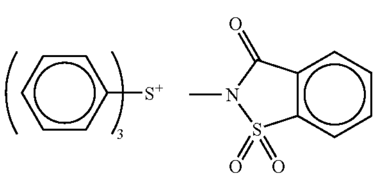
z12
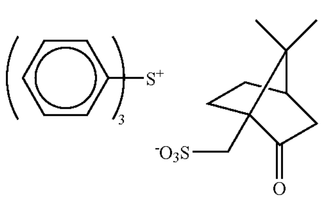
-continued
z13
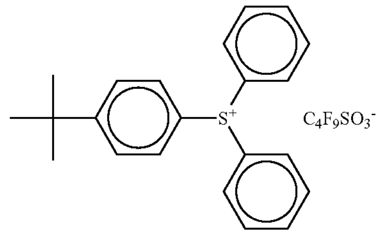
z14
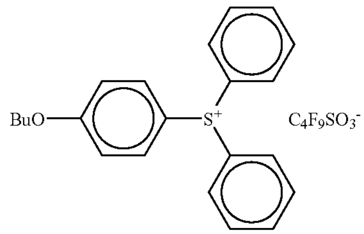
z15
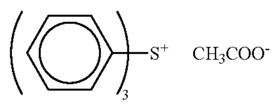
z16
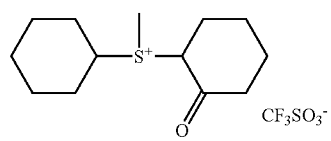
z17
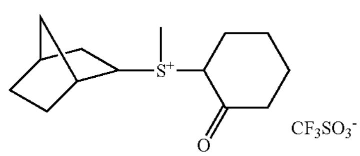
z18
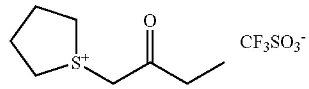
z19
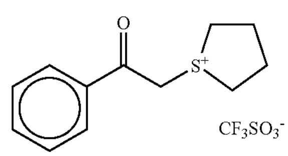
z20
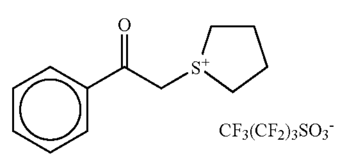
z21
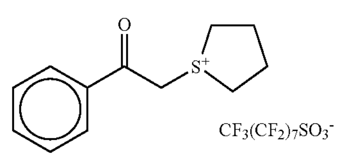

-continued z22

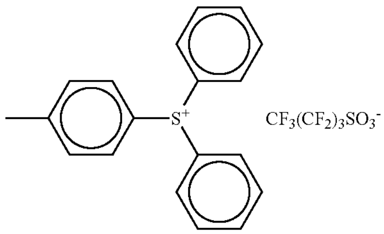

z23

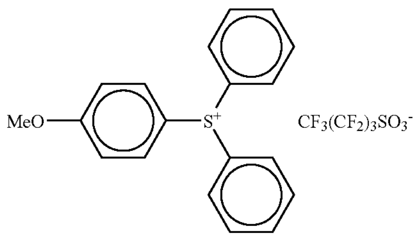

z24

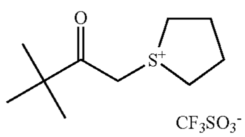

z25

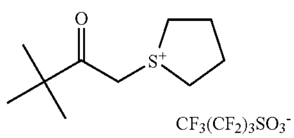

z26

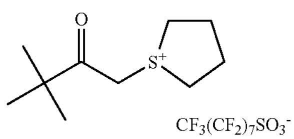

z27

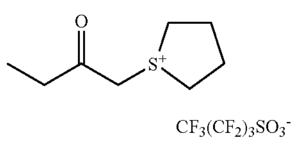

z28

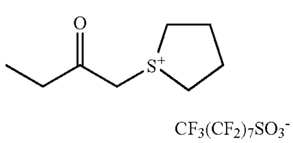

z29

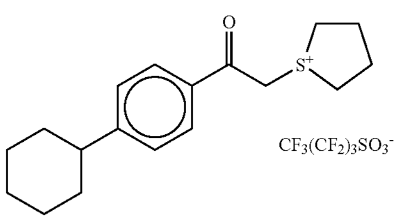

z30

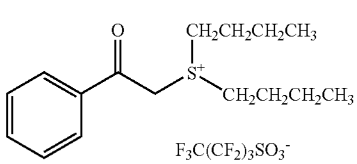

-continued z31

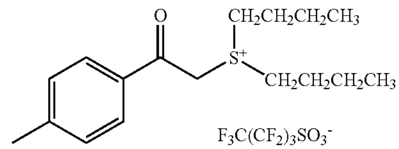

z32

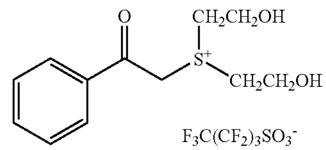

z33

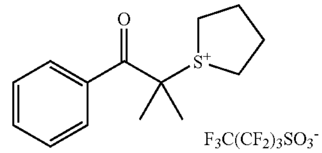

z34

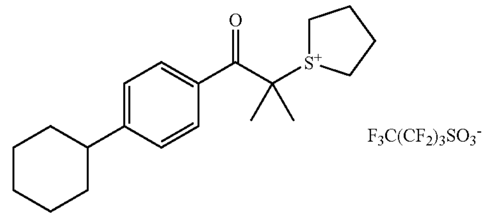

z35

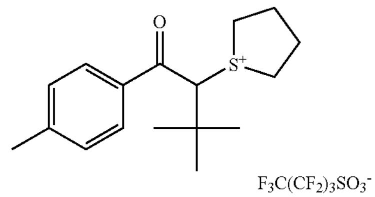

z36

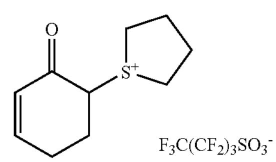

z37

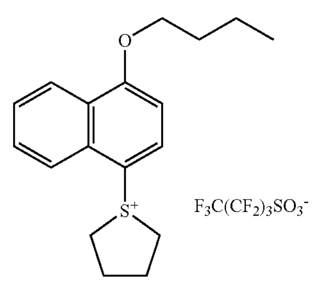

In the present invention, the photo-acid generator is preferably a compound of generating a perfluorobutanesulfonic acid or a perfluorooctanesulfonic acid.

[3] Organic Solvent (Component C)

The resist composition of the present invention is obtained by dissolving the components described above in an organic solvent.

The organic solvent for use in the present invention is a mixed solvent prepared by mixing at least one solvent selected from a propylene glycol monoalkyl ether carboxylate, an alkyl lactate and a linear ketone, with a cyclic ketone.

The ratio (by weight) of the amount added of at least one solvent selected from a propylene glycol monoalkyl ether carboxylate, an alkyl lactate and a linear ketone to the amount of a cyclic ketone added is preferably from 10/90 to 90/10, more preferably from 20/80 to 80/20, still more preferably from 30/70 to 70/30.

The cyclic ketone content is preferably from 20 to 70% by weight, more preferably from 30 to 60% by weight, based on the mixed solvent.

Preferred examples of the propylene glycol monoalkyl ether carboxylate include propylene glycol monomethyl ether acetate, propylene glycol monomethyl ether propionate, propylene glycol monoethyl ether acetate and propylene glycol monoethyl ether propionate. Among these, propylene glycol monomethyl ether acetate is more preferred.

Preferred examples of the alkyl lactate include methyl lactate and ethyl lactate.

Examples of the linear ketone include methyl ethyl ketone, 2-heptanone, 3-heptanone and 4-heptanone. Among these, 2-heptanone is preferred.

Examples of the cyclic ketone include cyclopentanone, 3-methylcyclopentanone, cyclohexanone, 2-methylcyclohexanone, 2,6-dimethylcyclohexanone, isophorone, cycloheptane, 1,3-cycloheptadione and γ-butyrolactone. Among these, preferred are cyclopentanone, 3-methylcyclopentanone, cyclohexanone and cycloheptanone, more preferred are cyclopentanone and cyclohexanone.

In combination with this specific mixed solvent, another organic solvent may be used usually in an amount of 10% by weight or less. Examples of the another organic solvent include ethylene carbonate, propylene carbonate, ethylene dichloride, ethylene glycol monomethyl ether, ethylene glycol monoethyl ether, 2-methoxyethyl acetate, ethylene glycol monoethyl ether acetate, propylene glycol monomethyl ether, toluene, ethyl acetate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran.

By using such a mixed solvent, a resist composition having a solid concentration of usually from 3 to 25% by weight, preferably from 5 to 22% by weight, more preferably from 7 to 20% by weight is prepared.

[4] Nitrogen-Containing Basic Compound

The positive resist composition of the present invention preferably further contains a nitrogen-containing basic compound.

The nitrogen-containing basic compound is sufficient if it does not deteriorate the sublimation or resist performance, and, for example, an organic amine, a basic ammonium salt or a basic sulfonium salt is used.

Among these nitrogen-containing basic compounds, an organic amine is preferred because excellent image performance is obtained. Examples of the nitrogen-containing basic compound which can be used include basic compounds described in JP-A-63-149640, JP-A-5-249662, JP-A-5-127369, JP-A-5-289322, JP-A-5-249683, JP-A-5-289340, JP-A-5-232706, JP-A-5-257282, JP-A-6-242605, JP-A-6-242606, JP-A-6-266100, JP-A-6-266110, JP-A-6-317902, JP-A-7-120929, JP-A-7-146558, JP-A-7-319163, JP-A-7-508840, JP-A-7-333844, JP-A-7-219217, JP-A-7-92678, JP-A-7-28247, JP-A-8-22120, JP-A-8-110638, JP-A-8-123030, JP-A-9-274312, JP-A-9-166871, JP-A-9-292708, JP-A-9-325496, JP-T-7-508840 (the term "JP-T" as used herein means a "published Japanese translation of a PCT patent application") and U.S. Pat. Nos. 5,525,453, 5,629,134 and 5,667,938.

The nitrogen-containing basic compound specifically includes structures represented by the following formulae (A) to (E):

(A)

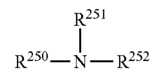

(B)

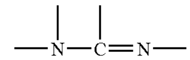

(C)

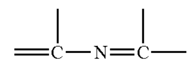

(D)

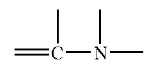

(E)

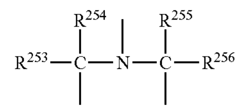

In these formulae, $R^{250}$, $R^{251}$ and $R^{252}$ may be the same or different and each represents a hydrogen atom, an alkyl group having from 1 to 20 carbon atoms, a cycloalkyl group having from 3 to 20 carbon atoms or an aryl group having from 6 to 20 carbon atoms, and $R^{251}$ and $R^{252}$ may be combined with each other to form a ring. The alkyl group, cycloalkyl group and aryl group represented by $R^{250}$, $R^{251}$ and $R^{252}$ each may have a substituent. Examples of the alkyl group having a substituent include an aminoalkyl group having from 1 to 20 carbon atoms and a hydroxyalkyl group having from 1 to 20 carbon atoms, and examples of the cycloalkyl group having a substituent include an aminocycloalkyl group having from 3 to 20 carbon atoms and a hydroxycycloalkyl group having from 3 to 20 carbon atoms.

$R^{253}$, $R^{254}$, $R^{255}$ and $R^{256}$ may be the same or different and each represents an alkyl group having from 1 to 10 carbon atoms.

The compound is preferably a nitrogen-containing basic compound having two or more nitrogen atoms differing in the chemical environment within one molecule, or an aliphatic tertiary amine.

Preferred examples of the nitrogen-containing basic compound include 1,5-diazabicyclo[4.3.0]-non-5-ene, 1,8-diazabicyclo[5.4.0]undec-7-ene, 1,4-diazabicyclo[2.2.2]-octane, 4-dimethylaminopyridine, 1-naphthylamine, piperidines, hexamethylenetetramine, imidazoles, hyroxypyridines, pyridines, anilines, hydroxyalkylanilines, 4,4'-diaminodiphenylether, pyridinium p-toluenesulfonate, 2,4,6-trimethylpyridinium p-toluenesulfonate, tetramethylammonium p-toluenesulfonate, tetrabutylammonium lactate, triethylamine, tributylamine, tripentylamine, tri-n-octylamine, tri-i-octylamine, tris(ethylhexyl)amine, tridecylamine and tridodecylamine.

Among these, preferred are 1,5-diazabicyclo[4.3.0]-5-nonene, 1,8-bicyclo[5.4.0]-7-undecene, 1,4-diazabicyclo-[2.2.2]octane, 4-diemthylaminopyridine, 1-naphthylamine, piperidine, 4-hydroxypiperidine, 2,2,6,6-tetramethyl-4-hydroxypiperidine, hexamethylenetetramine, imidazoles, hydroxypyridines, pyridines, anilines and organic amines such as 4,4'-diaminodiphenylether, triethylamine, tributylamine, tripentylamine, tri-n-octylamine, tris(ethylhexyl)

amine, tridodecylamine, N,N-dihydroxyethylaniline and N-hydroxyethyl-N-ethylaniline.

The ratio of the photo-acid generator and the nitrogen-containing basic compound used in the positive resist composition is usually (photo-acid generator)/(nitrogen-containing basic compound) (by mol)=2.5 to 300, preferably from 5.0 to 200, more preferably from 7.0 to 150.

[5] Other Additives

The positive resist composition of the present invention may contain, if desired, a low molecular acid-decomposable compound, a surfactant, a compound of accelerating dissolution in developer, an antihalation agent, a plasticizer, a photosensitizer, a surfactant, an adhesion aid, a crosslinking agent, a photo-base generator and the like.

The positive resist composition of the present invention may contain, if desired, a low molecular acid-decomposable compound having a molecular weight of 2,000 or less and containing a group decomposable under the action of an acid, of which alkali solubility increases under the action of an acid.

Examples thereof include alicyclic compounds such as cholic acid derivative, dehydrocholic acid derivative, deoxycholic acid derivative, lithocholic acid derivative, ursocholic acid derivative and abietic acid derivative each containing an acid-decomposable group, and aromatic compounds such as naphthalene derivative containing an acid-decomposable group, described in *Proc. SPIE*, 2724, 355 (1996), JP-A-8-15865, U.S. Pat. No. 5,310,619 and 5,372,912, and *J. Photolym. Sci., Tech*., Vol. 10, No. 3, 511 (1997).

Furthermore, the low molecular acid-decomposable dissolution inhibiting compound described in JP-A-6-51519 may be used in an amount of not impairing the transmission at 220 nm. Also, a 1,2-naphthoquinonediazide compound may be used.

In the case of using this low-molecular acid-decomposable dissolution inhibiting compound in the resist composition of the present invention, the content thereof is usually from 0.5 to 50 parts by weight, preferably from 0.5 to 40 parts by weight, more preferably from 0.5 to 30 parts by weight, still more preferably from 0.5 to 20.0 parts by weight, per 100 parts by weight (solid content) of the resist composition.

When the low-molecular acid-decomposable dissolution inhibiting compound is added, not only the development defects are more improved but also the dry etching resistance is enhanced.

Examples of the compound of accelerating dissolution in developer, which can be used in the present invention, include low molecular compounds having a molecular weight of 1,000 or less, such as the compounds having two or more phenolic hydroxyl groups described in JP-A-3-206458, naphthols (e.g., 1-naphthol), compounds having one or more carboxyl group, carboxylic anhydrides, sulfonamide compounds, and sulfonylimide compounds.

The dissolution accelerating compound is preferably blended in an amount of 30% by weight or less, more preferably 20% by weight or less, based on the total mass (solid content) of the composition.

The antihalation agent is preferably a compound which efficiently absorbs radiation irradiated, and examples thereof include substituted benzenes such as fluorene, 9-fluorenone and benzophenone, and polycyclic aromatic compounds such as anthracene, anthracene-9-methanol, anthracene-9-carboxyethyl, phenanthrene, perylene and azilene. Among these, polycyclic aromatic compounds are preferred. This antihalation agent reduces the light reflection on a substrate to lessen the effect of multiple reflection within the resist film and thereby improve the standing wave.

Also, a photosensitizer may be added in order to enhance the efficiency of acid generation upon exposure. Preferred examples of the photosensitizer include, but are not limited to, benzophenone, p,p'-tetramethyldiamino-benzophenone, 2-chlorothioxanthone, anthrone, 9-ethoxy-anthracene, pyrene, phenothiazine, benzyl, benzoflavin, acetophenone, phenanthrene, benzoquinone, anthraquinone and 1,2-naphthoquinone. These photosensitizers can be used also as the above-described antihalation agent.

The positive resist composition of the present invention preferably contains a surfactant, more preferably at least one of fluorine-based and/or silicon-based surfactants (a fluorine-based surfactant, a silicon-based surfactant and a surfactant containing both a fluorine atom and a silicon atom).

When the positive resist composition of the present invention contains a fluorine-based and/or silicon-based surfactant, a resist pattern with good sensitivity, resolution and adhesion and reduced in development defects can be obtained on use of an exposure light source of 250 nm or less, particularly 220 nm or less.

Examples of these surfactants include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include fluorine-based surfactants and silicon-based surfactants, such as EFtop EF301 and EF303 (produced by Shin-Akita Kasei K. K.), Florad FC430 and 431 (produced by Sumitomo 3M Inc.), Megafac F171, F173, F176, F189 and R08 (produced by Dainippon Ink & Chemicals, Inc.), Surflon S-382, SC101, 102, 103, 104, 105 and 106 (produced by Asahi Glass Co., Ltd.), and Troysol S-366 (produced by Troy Chemical). In addition, polysiloxane polymer KP-341 (produced by Shin-Etsu Chemical Co., Ltd.) may also be used as a silicon-containing surfactant.

Other than those known surfactants, surfactants using a polymer having a fluoro-aliphatic group, which is derived from a fluoro-aliphatic compound produced by telomerization (also called telomer process) or oligomerization (also called oligomer process), may be used. The fluoro-aliphatic compound can be synthesized by the method described in JP-A-2002-90991.

The polymer having a fluoro-aliphatic group is preferably a copolymer of a fluoro-aliphatic group-containing monomer with (poly(oxyalkylene)) acrylate and/or (poly(oxyalkylene)) methacrylate and the polymer may have an irregular distribution or may be a block copolymer. Examples of the poly(oxyalkylene) group include a poly (oxy-ethylene) group, a poly(oxypropylene) group and a poly(oxy-butylene group). This group may also be a unit having alkylenes differing in the chain length within the same chain, such as block-linked poly(oxyethylene, oxypropylene and oxyethylene) and block-linked poly(oxyethylene and oxypropylene). Furthermore, the copolymer of a fluoro-aliphatic group-containing monomer and a (poly(oxy-alkylene)) acrylate (or methacrylate) may be not only a two-component copolymer but also a three or more component copolymer obtained by simultaneously copolymerizing two or more different fluoro-aliphatic group-containing monomers or two or more different (poly(oxyalkylene)) acrylates (or methacrylates).

Examples thereof include commercially available surfactants such as Megafac F178, F470, F473, F475, F-476 and F-472 (produced by Dainippon Ink & Chemicals, Inc.), copolymers of an acrylate (or methacrylate) having $C_6F_{13}$ group and a (poly(oxyalkylene)) acrylate (or methacrylate), copolymers of an acrylate (or methacrylate) having $C_6F_{13}$ group, a (poly(oxyethylene)) acrylate (or methacrylate) and a (poly(oxypropylene)) acrylate (or methacrylate), copolymers of an acrylate (or methacrylate) having $C_8BF_{17}$ group and a (poly(oxyalkylene)) acrylate (or methacrylate), and copolymers of an acrylate (or methacrylate) having C8F17 group, a (poly(oxyethylene)) acrylate (or methacrylate) and a (poly(oxypropylene)) acrylate (or methacrylate).

The amount of the surfactant used is preferably from 0.0001 to 2% by weight, more preferably from 0.001 to 1% by weight, based on the entire solid content of the resist composition.

<Using Method>

The positive resist composition of the present invention is used by dissolving these components in the above-described mixed solvent and coating the obtained solution on a predetermined support as follows.

That is, the positive resist composition is coated on a substrate (e.g., silicon/silicon dioxide-coated substrate) as used in the production of precision integrated circuit elements by an appropriate coating method such as spinner or coater, to form a resist film.

This resist film is exposed through a predetermined mask and developed by baking, whereby a good resist pattern can be obtained. The exposure light is preferably a far ultraviolet ray having a wavelength of 250 nm or less, more preferably 220 nm or less. Specific examples thereof include KrF excimer laser (248 nm), ArF excimer laser (193 nm), $F_2$ excimer laser (157 nm), X ray and electron beam.

The alkali developer which can be used for the positive resist composition is an alkaline aqueous solution (usually from 0.1 to 10% by weight) of an inorganic alkali such as sodium hydroxide, potassium hydroxide, sodium carbonate, sodium silicate, sodium metasilicate and aqueous ammonia, a primary amine such as ethylamine and n-propylamine, a secondary amine such as diethylamine and di-n-butylamine, a tertiary amine such as triethylamine and methyldiethylamine, an alcohol amine such as dimethylethanolamine and triethanolamine, a quaternary ammonium salt such as tetramethylammonium hydroxide and tetraethylammonium hydroxide, and a cyclic amine such as pyrrole and piperidine.

This alkaline aqueous solution may be used after adding thereto an appropriate amount of an alcohol or surfactant.

EXAMPLES

The present invention is described in greater detail below by referring to Examples, however, the present invention should not be construed as being limited thereto.

Synthesis Example 1 (Synthesis of Resin (RA-1)):

2-Methyl-2-adamantyl acrylate, 5-oxo-4-oxa-tricyclo-[4.2.1.0$^{3,7}$]non-2-yl acrylate and 3-hydroxy-1-adamantyl acrylate at a molar ratio of 40/40/20 were dissolved in methyl ethyl ketone/tetrahydrofuran (5/5 by weight) to prepare 100 mL of a solution having a solid concentration of 20% by weight. To this solution, 2 mol % of polymerization initiator V-65 (produced by Wako Pure Chemical Industries, Ltd.) was added and the resulting solution was added dropwise to 10 mL of methyl ethyl ketone heated at 60° C., over 4 hours in a nitrogen atmosphere.

After the completion of dropwise addition, the reaction solution was heated for 4 hours, 1 mol % of V-65 was again added thereto and the resulting solution was stirred for 4 hours. When the reaction was completed, the reaction solution was cooled to room temperature and crystallized in 3 L of a distilled water/isopropyl alcohol (1/1 by mass) mixed solvent and Resin (RA-1) as the precipitated white powder was recovered.

The polymer composition ratio determined from $C^{13}$NMR was 38/41/21. The weight average molecular weight in terms of standard polystyrene as determined by GPC was 9,700.

Resins (RA-2) to (RA-11) were synthesized in the same manner as in Synthesis Example 1 except for using the monomer and composition ratio shown in Table 1. The repeating units 1, 2, 3 and 4 show the order from the left in the structural formula.

TABLE 1

| | Repeating Unit 1 | Repeating Unit 2 | Repeating Unit 3 | Repeating Unit 4 | Molecular Weight |
|---|---|---|---|---|---|
| Resin RA-1 | 38 | 41 | 21 | | 9700 |
| Resin RA-2 | 32 | 48 | 20 | | 11000 |
| Resin RA-3 | 30 | 21 | 30 | 19 | 8700 |
| Resin RA-4 | 30 | 40 | 30 | | 8800 |
| Resin RA-5 | 39 | 40 | 21 | | 9000 |
| Resin RA-6 | 32 | 41 | 18 | 9 | 7800 |
| Resin RA-7 | 39 | 41 | 20 | | 10500 |
| Resin RA-8 | 32 | 36 | 32 | | 10100 |
| Resin RA-9 | 27 | 30 | 25 | 18 | 9000 |
| Resin RA-10 | 35 | 39 | 20 | 6 | 9400 |
| Resin RA-11 | 20 | 20 | 38 | 22 | 8000 |

The structures of Resins (RA-1) to (RA-11) are shown below.

RA-1

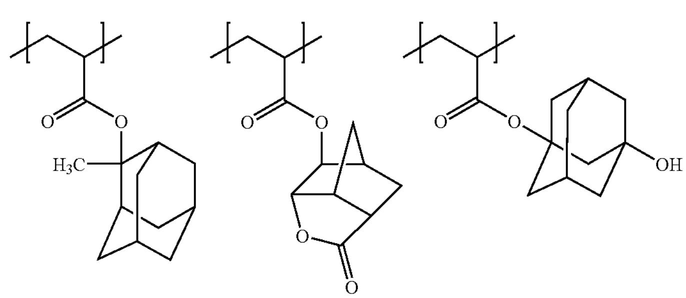

-continued
RA-2
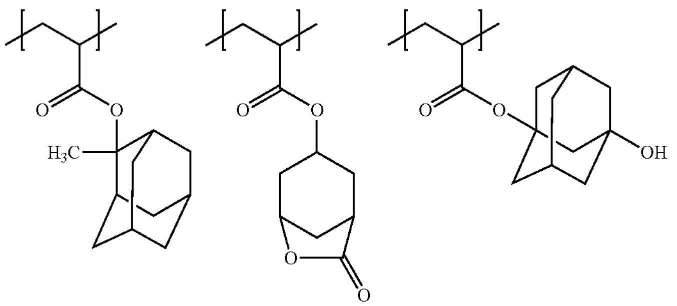
RA-3
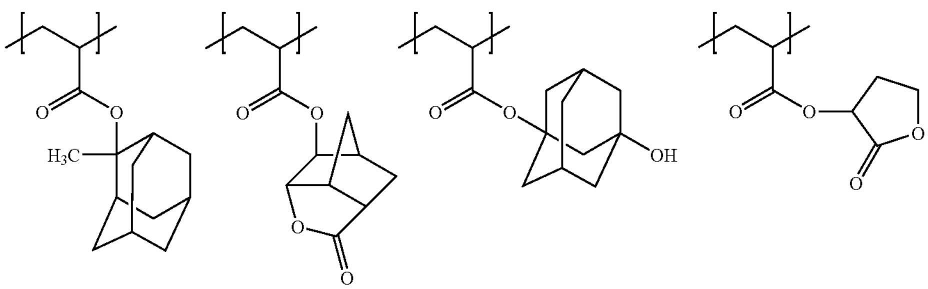
RA-4
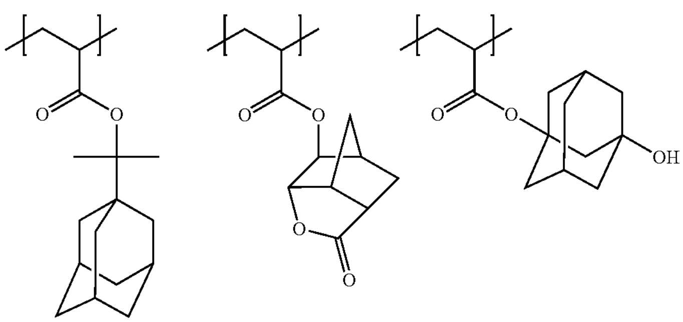
RA-5
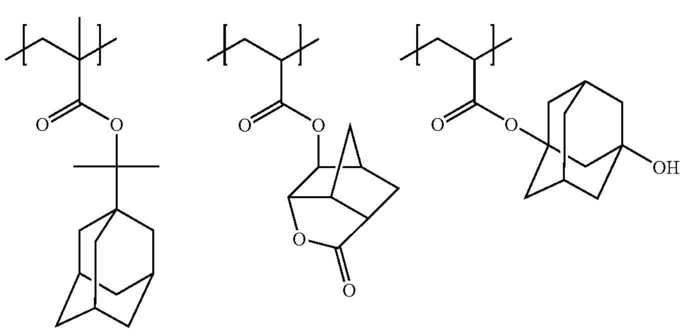

-continued
RA-6
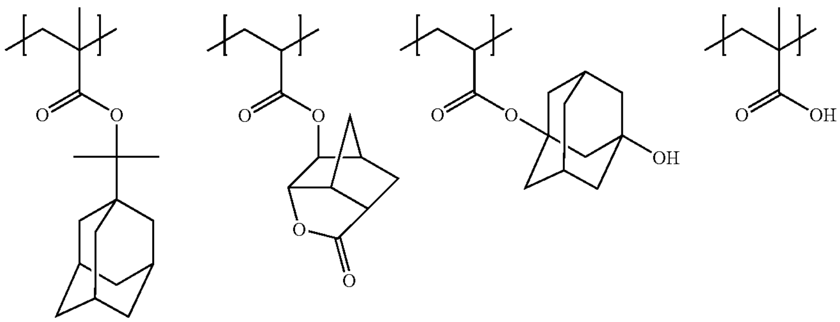
RA-7
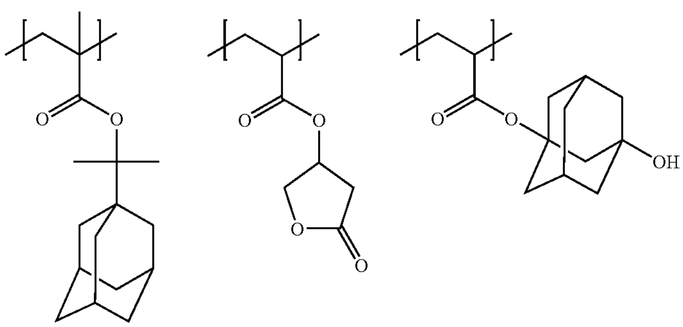
RA-8
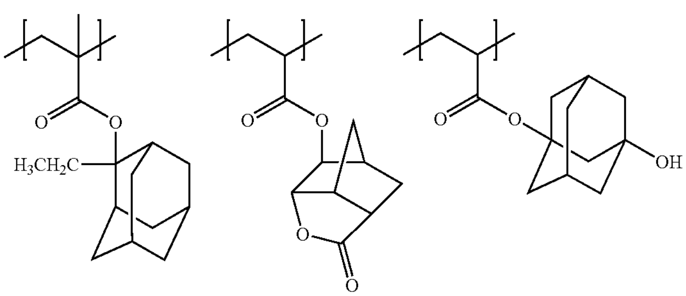
RA-9
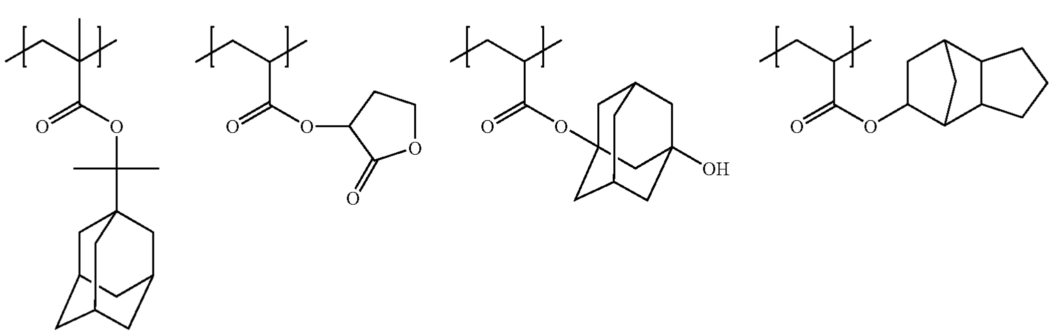

-continued
RA-10
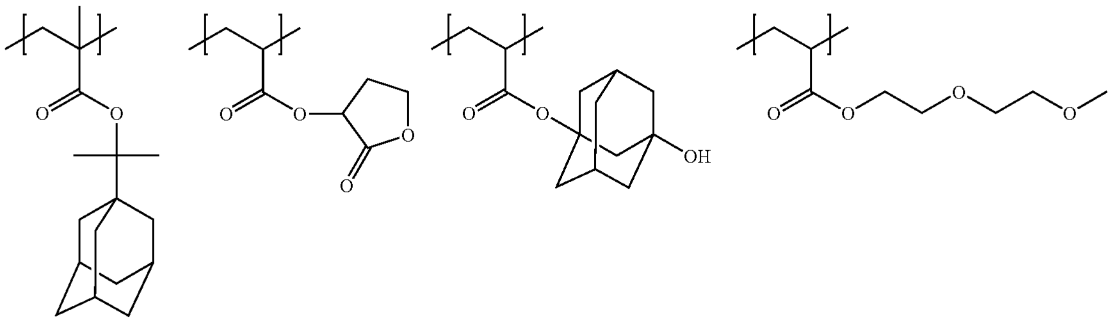
RA-11
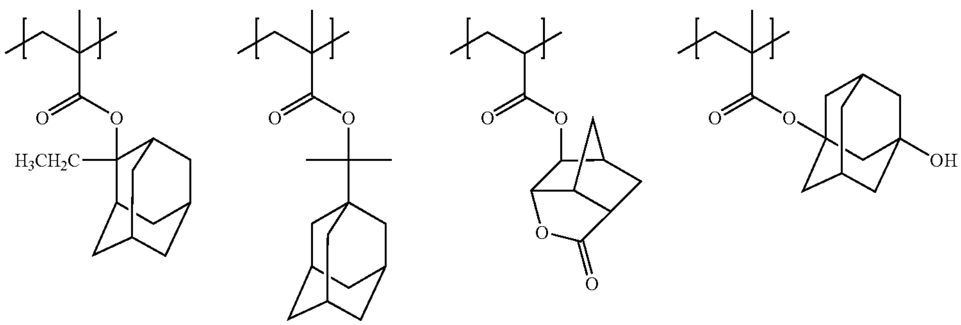
Synthesis Example 2 (Synthesis of Comparative Resins (CRA-1) and (CRA-2)):
Comparative Resins (CRA-1) and (CRA-2) were synthesized in the same manner as in Synthesis Example 1 except for using the monomer and composition ratio shown in Table 2. The repeating units 1, 2 and 3 show the order from the left in the structural formula.
CRA-1:
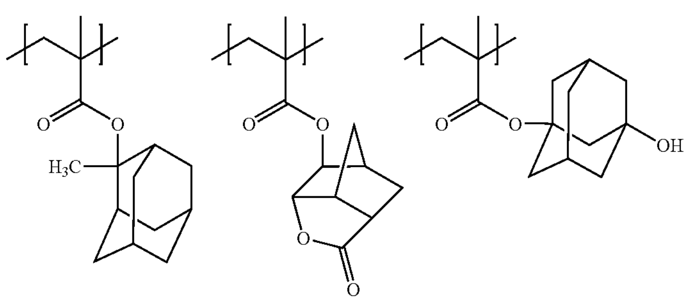
CRA-2:
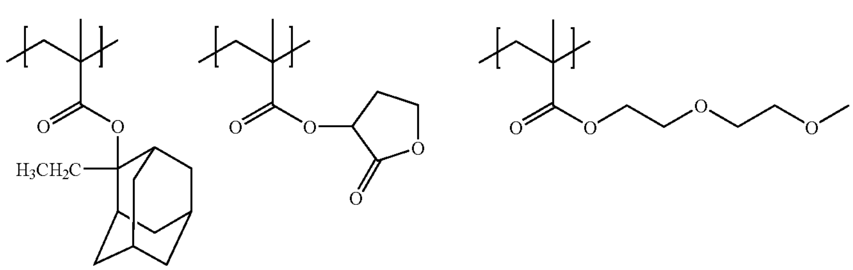

TABLE 2

| | Repeating Unit 1 | Repeating Unit 2 | Repeating Unit 3 | Molecular Weight |
|---|---|---|---|---|
| Resin CRA-1 | 38 | 42 | 20 | 8900 |
| Resin CRA-2 | 39 | 42 | 19 | 10200 |

Synthesis Example 3 (Synthesis of Resin (RB-1))

2-Methyl-2-adamantyl acrylate, 5-oxo-4-oxa-tricyclo-[4.2.1.0$^{3.7}$]non-2-yl acrylate and 3,5-dihydroxy-1-adamantyl acrylate at a molar ratio of 40/40/20 were dissolved in methyl ethyl ketone/tetrahydrofuran (5/5) to prepare 100 mL of a solution having a solid concentration of 20% by weight. To this solution, 2 mol % of polymerization initiator V-65 (produced by Wako Pure Chemical Industries, Ltd.) was added and the resulting solution was added dropwise to 10 mL of methyl ethyl ketone heated at 60° C., over 4 hours in a nitrogen atmosphere.

After the completion of dropwise addition, the reaction solution was heated for 4 hours, 1 mol % of V-65 was again added thereto and the resulting solution was stirred for 4 hours. When the reaction was completed, the reaction solution was cooled to room temperature and crystallized in 3 L of a distilled water/isopropyl alcohol (1/1) mixed solvent and Resin (RB-1) as the precipitated white powder was recovered.

The polymer composition ratio (molar ratio) determined from $C^{13}$NMR was 40/38/22. The weight average molecular weight in terms of standard polystyrene as determined by GPC was 8,800.

Resins (RB-2) to (RB-10) were synthesized in the same manner as in Synthesis Example 3 except for using the monomer and composition ratio shown in Table 3. The repeating units 1, 2, 3 and 4 show the order from the left in the structural formula.

TABLE 3

| | Repeating Unit 1 | Repeating Unit 2 | Repeating Unit 3 | Repeating Unit 4 | Weight Average Molecular Weight |
|---|---|---|---|---|---|
| Resin RB-1 | 37 | 41 | 22 | | 8800 |
| Resin RB-2 | 29 | 31 | 30 | 10 | 9600 |
| Resin RB-3 | 38 | 41 | 21 | | 8000 |
| Resin RB-4 | 40 | 40 | 20 | | 9200 |
| Resin RB-5 | 29 | 40 | 19 | 11 | 7500 |
| Resin RB-6 | 35 | 40 | 22 | 3 | 7700 |
| Resin RB-7 | 40 | 41 | 39 | | 9500 |
| Resin RB-8 | 38 | 39 | 23 | | 10100 |
| Resin RB-9 | 40 | 21 | 20 | 19 | 8000 |
| Resin RB-10 | 21 | 19 | 41 | 19 | 7000 |

The structures of Resins (RB-1) to (RB-10) are shown below.

RB-1

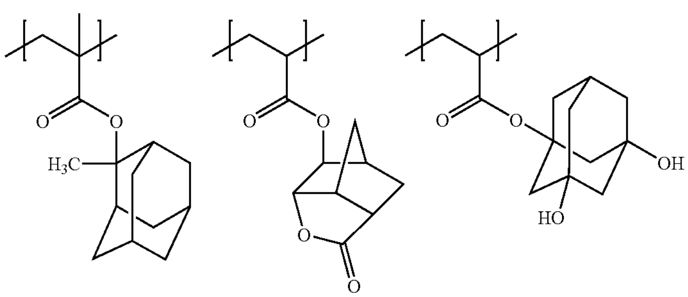

RB-2

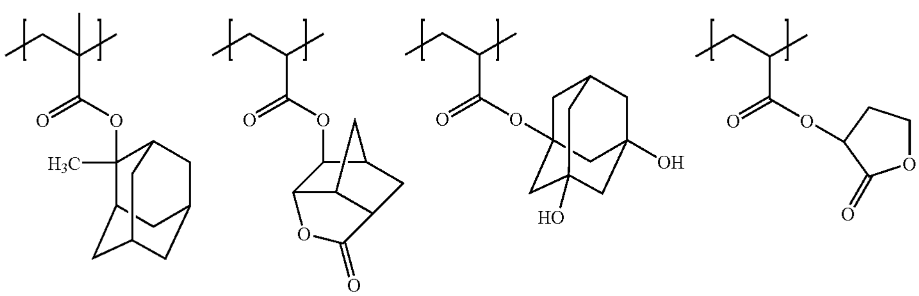

-continued
RB-3
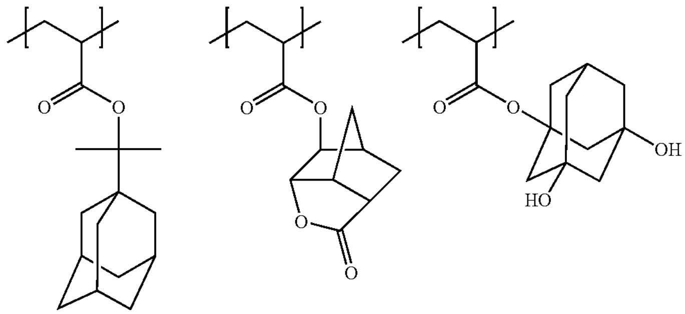
RB-4
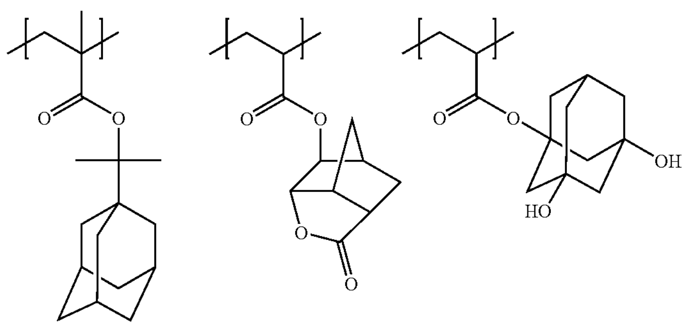
RB-5
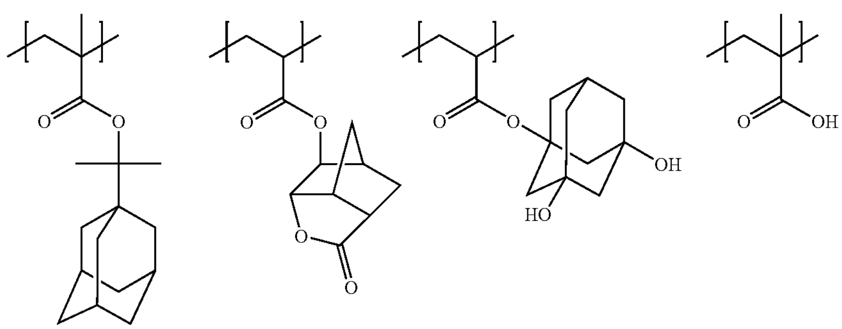
RB-6
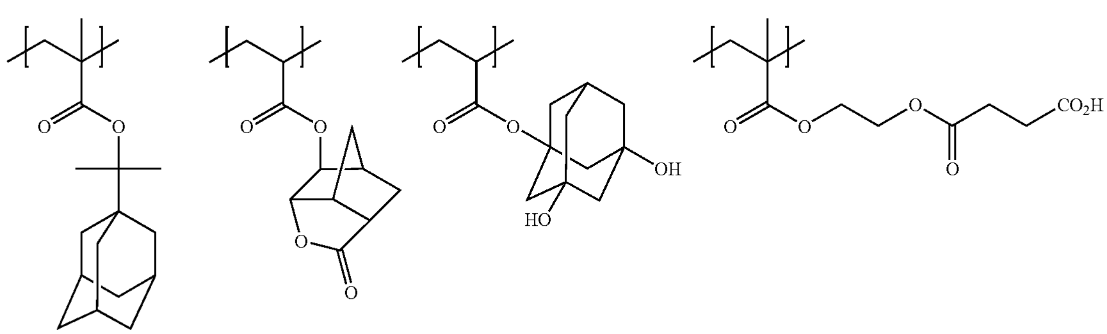

-continued
RB-7
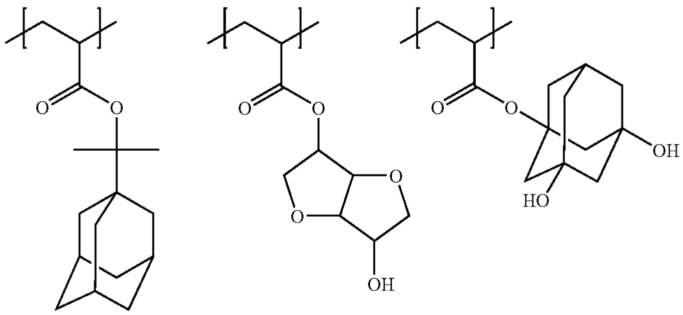
RB-8
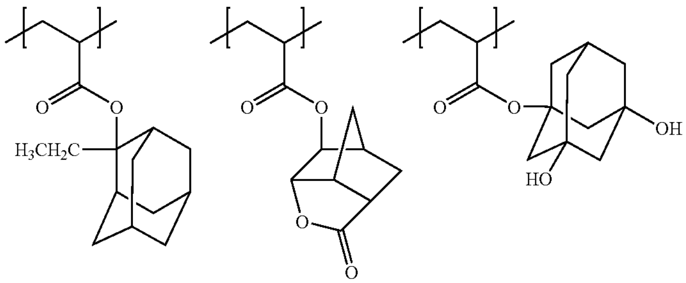
RB-9
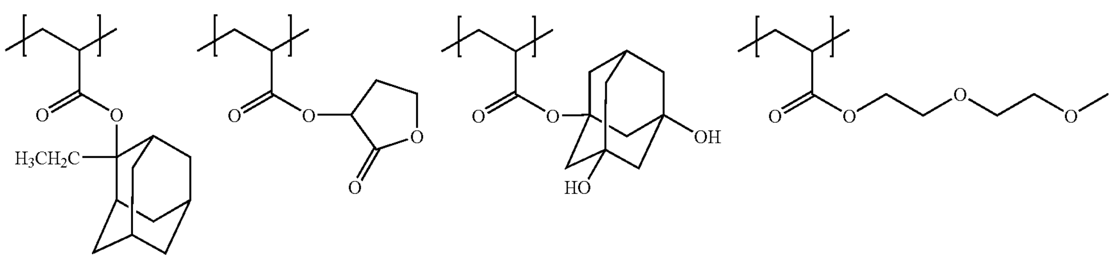
RB-10
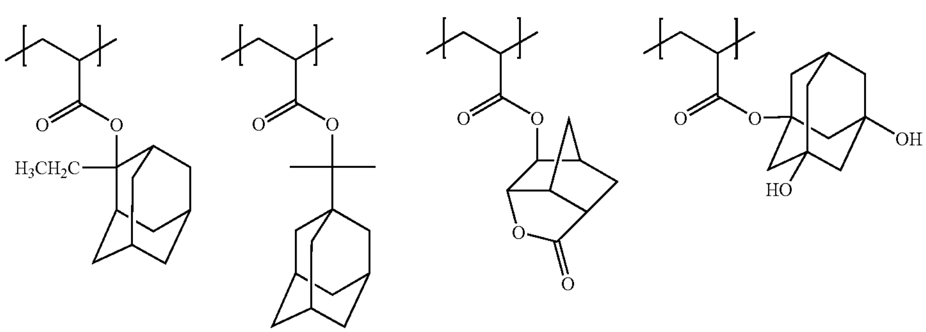
Synthesis Example 4 (Synthesis of Comparative Resins (CRB-1) and (CRB-2)):
Comparative Resins (CRB-1) and (CRB-2) were synthesized in the same manner as in Synthesis Example 3 except for using the monomer and composition ratio shown in Table 4. The repeating units 1, 2 and 3 show the order from the left in the structural formula.

CRB-1:

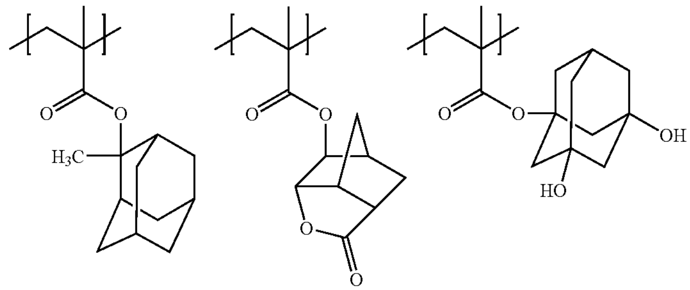

CRB-2:

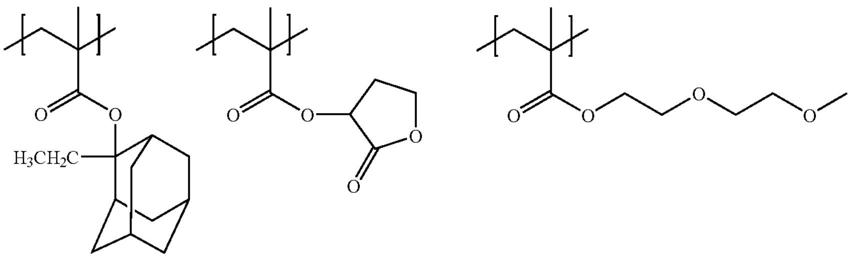

TABLE 4

| | Repeating Unit 1 | Repeating Unit 2 | Repeating Unit 3 | Weight Average Molecular Weight |
|---|---|---|---|---|
| Resin CRB-1 | 38 | 40 | 22 | 8400 |
| Resin CRB-2 | 39 | 20 | 41 | 9200 |

Examples 1 to 36 and Comparative Examples 1 to 6:

Respective components shown in Tales 5 and 6 at a mass ratio shown in Tables 5 and 6 were dissolved to give an entire solid content of 10% by weight and the obtained solutions each was filtered through a microfilter of 0.1 μm to prepare a positive resist composition. Here, the basic compound was used in an amount of 0.2 parts by weight and the surfactant was used in an amount of 100 ppm based on the entire amount of resist. Thereafter, evaluations were performed as described later and the results are shown in Tables 5 and 6.

TABLE 5

| | Resin (parts by weight) | Photo-Acid Generator (parts by weight) | Basic Compound | Surfactant | Solvent (weight ratio) | Cracking | DE Resistance |
|---|---|---|---|---|---|---|---|
| Example 1 | RA-1 (97.8) | Z2 (2) | N-2 | W-1 | SL-1/SL-5 (60/40) | ○ | ○ |
| Example 2 | RA-1 (95.8) | z2 (1)/z20 (3) | N-5 | W-2 | SL-1/SL-5 (80/20) | ○ | ○ |
| Example 3 | RA-2 (97.8) | Z2 (2) | N-3 | W-2 | SL-2/SL-4 (70/30) | ○ | ○ |
| Example 4 | RA-3 (97.3) | z2 (2.5) | N-2 | W-3 | SL-2/SL-5 (80/20) | ○ | ○ |
| Example 5 | RA-4 (97.8) | Z2 (2) | N-3 | W-2 | SL-1/SL-4 (80/20) | ○ | ○ |
| Example 6 | RA-4 (93.8) | Z34 (6) | N-4 | W-4 | SL-1/SL-5/SL-6 (60/25/15) | ○ | ○ |
| Example 7 | RA-5 (97.3) | z2 (2.5) | N-2 | W-4 | SL-1/SL-5/SL-7 (60/35/5) | ○ | ○ |
| Example 8 | RA-5 (95.3) | z20 (4.5) | N-3 | W-2 | SL-1/SL-3/SL-5 (70/25/5) | ○ | ○ |
| Example 9 | RA-5 (94.8) | Z34 (5) | N-3 | W-4 | SL-1/SL-5 (60/40) | ○ | ○ |
| Example 10 | RA-5 (94.8) | z22 (1)/z34 (4) | N-3 | W-4 | SL-1/SL-5 (60/40) | ○ | ○ |
| Example 11 | RA-6 (98.3) | z2 (1.5) | N-1 | W-2 | SL-1/SL-5 (60/40) | ○ | ○ |
| Example 12 | RA-6 (95.8) | Z34 (4) | N-3 | W-4 | SL-1/SL-5 (70/30) | ○ | ○ |
| Example 13 | RA-6 (95.8) | z22 (1)/z34 (3) | N-3 | W-4 | SL-1/SL-5 (70/30) | ○ | ○ |
| Example 14 | RA-7 (97.8) | Z22 (2) | N-1 | W-1 | SL-1/SL-5 (60/40) | ○ | ○ |
| Example 15 | RA-8 (97.3) | z22 (2.5) | N-5 | W-2 | SL-2/SL-4 (60/40) | ○ | ○ |
| Example 16 | RA-9 (96.8) | Z2 (3) | N-4 | W-4 | SL-2/SL-6 (80/20) | ○ | ○ |
| Example 17 | RA-10 (97.8) | Z22 (2) | N-3 | W-2 | SL-1/SL-5 (60/40) | ○ | ○ |
| Example 18 | RA-11 (97.8) | Z2 (2) | N-2 | W-2 | SL-1/SL-5 (60/40) | ○ | ○ |
| Comparative Example 1 | RA-1 (97.8) | Z2 (2) | N-2 | W-1 | SL-1 | X | Δ |
| Comparative Example 2 | CRA-1 (97.8) | Z2 (2) | N-2 | W-1 | SL-1/SL-5 (60/40) | X | X |

TABLE 5-continued

| | Resin (parts by weight) | Photo-Acid Generator (parts by weight) | Basic Compound | Surfactant | Solvent (weight ratio) | Cracking | DE Resistance |
|---|---|---|---|---|---|---|---|
| Comparative Example 3 | CRA-2 (94.8) | z22 (1)/z34 (4) | N-3 | W-4 | SL-1/SL-5 (60/40) | X | Δ |

TABLE 6

| | Resin (parts by weight) | Photo-Acid Generator (parts by weight) | Basic Compound | Surfactant | Solvent (weight ratio) | Cracking | DE Resistance |
|---|---|---|---|---|---|---|---|
| Example 19 | RB-1(97.8) | z2 (2) | N-2 | W-1 | SL-1/SL-5 (60/40) | ○ | ○ |
| Example 20 | RB-1(95.8) | z2 (1)/z20 (3) | N-3 | W-2 | SL-1/SL-5 (70/30) | ○ | ○ |
| Example 21 | RB-2(97.8) | z2 (2) | N-4 | W-2 | SL-2/SL-4 (70/30) | ○ | ○ |
| Example 22 | RB-3(97.3) | z2 (2.5) | N-3 | W-3 | SL-2/SL-5 (60/40) | ○ | ○ |
| Example 23 | RB-4(97.8) | z2 (2) | N-4 | W-2 | SL-2/SL-5 (60/40) | ○ | ○ |
| Example 24 | RB-4(97.3) | z2 (2.5) | N-2 | W-4 | SL-1/SL-5/SL-6 (60/25/15) | ○ | ○ |
| Example 25 | RB-5(97.8) | z2 (2) | N-3 | W-4 | SL-1/SL-5/SL-7 (60/35/5) | ○ | ○ |
| Example 26 | RB-5(95.3) | z34 (4.5) | N-3 | W-4 | SL-1/SL-3/SL-5 (70/25/5) | ○ | ○ |
| Example 27 | RB-5 (94.8) | z22 (1)/z34 (4) | N-3 | W-4 | SL-1/SL-5 (60/40) | ○ | ○ |
| Example 28 | RB-5 (97.8) | Z22 (2) | N-3 | W-4 | SL-1/SL-5 (60/40) | ○ | ○ |
| Example 29 | RB-6 (95.3) | z34 (4.5) | N-3 | W-2 | SL-1/SL-5 (60/40) | ○ | ○ |
| Example 30 | RB-6 (95.3) | z22 (1)/z34 (3.5) | N-3 | W-4 | SL-1/SL-5 (70/30) | ○ | ○ |
| Example 31 | RB-6 (97.3) | Z22 (2.5) | N-2 | W-4 | SL-1/SL-5 (70/30) | ○ | ○ |
| Example 32 | RB-7 (95.8) | z34 (4) | N-3 | W-1 | SL-1/SL-5 (60/40) | ○ | ○ |
| Example 33 | RB-8 (97.3) | z22 (2.5) | N-1 | W-1 | SL-2/SL-4 (60/40) | ○ | ○ |
| Example 34 | RB-9 (96.8) | z2 (3) | N-3 | W-4 | SL-2/SL-5 (60/40) | ○ | ○ |
| Example 35 | RB-10 (96.8) | z20 (3) | N-4 | W-2 | SL-1/SL-6 (80/20) | ○ | ○ |
| Example 36 | RB-11 (97.8) | z2 (2) | N-3 | W-4 | SL-1/SL-5 (60/40) | ○ | ○ |
| Comparative Example 4 | RB-1 (97.8) | z2 (2) | N-2 | W-1 | SL-1 | X | Δ |
| Comparative Example 5 | CRB-1 (97.8) | z2 (2) | N-2 | W-1 | SL-1/SL-5 (60/40) | X | X |
| Comparative Example 6 | CRB-2 (96.8) | z20 (3) | N-4 | W-2 | SL-1/SL-6 (80/20) | X | X |

[Nitrogen-Containing Basic Compound]

N-1: 1,5-diazabicyclo[4.3.0]-non-5-ene
N-2: trioctylamine
N-3: N,N-di-n-butylaniline
N-4: adamantylamine
N-5: 2,5-diisopropylaniline

[Surfactant]

W-1: Megafac F176 (produced by Dainippon Ink & Chemicals, Inc.) (fluorine-containing surfactant)
W-2: Megafac R08 ((produced by Dainippon Ink & Chemicals, Inc.) (fluorine/silicon-containing surfactant)
W-3: polysiloxane polymer KP-341 (produced by Shin-Etsu Chemical Co., Ltd.)
W-4: Troysol S-366 (produced by Troy Chemical)

[Solvent]

SL-1: propylene glycol monomethyl ether acetate
SL-2: ethyl lactate
SL-3: propylene glycol monomethyl ether
SL-4: cyclopentanone
SL-5: cyclohexanone
SL-6: 2-methylcyclohexanone
SL-7: propylene carbonate

[Cracking at Thermal Flow Process]

ARC29a (produced by Brewer Science, Inc.) was uniformly coated to a thickness of 780 Å on a silicon wafer by using a spin coater (Mark 8, manufactured by Tokyo Electron Ltd.) and then dried under heating at 205° C. for 90 seconds to form an antireflective film. On this antireflective film, each positive resist composition obtained above was coated and dried under heating at 115° C. for 90 seconds to form a resist film of 800 Å.

This resist film was subjected to pattern exposure with ArF excimer laser light (wavelength: 193 nm, NA: 0.60, σ: 0.70) by using a micro-stepper manufactured by ISI through a halftone phase shifting mask having a transmittance of 6%. The exposure was performed in an exposure amount of giving a 150-nm hole pattern at a duty ratio of 1:10 with a mask dimension of 1,600 nm. After the exposure, the resist film was heated at 120° C. for 90 seconds, developed with an aqueous 2.38% by weight tetramethylammonium hydroxide (TMAH) solution, rinsed and then spin-dried to obtain a resist pattern.

The wafer having formed thereon the hole pattern was heated on a hot plate at 175° C. for 90 seconds and cracks generated on the resist surface were observed through an optical microscope. The sample was rated ○ when cracks were not observed, and rated × when cracks were observed.

[Dry Etching Resistance (DE Resistance)]

ARC29a (produced by Brewer Science, Inc.) was uniformly coated to a thickness of 780 Å on a silicon wafer by using a spin coater (Mark 8, manufactured by Tokyo Electron Ltd.) and then dried under heating at 205° C. for 90 seconds to form an antireflective film. On this antireflective film, each positive resist composition obtained above was coated and dried under heating at 115° C. for 90 seconds to form a resist film of 3,500 Å.

This resist film was etched by using UNITY (manufactured by Tokyo Electron Ltd.) and the decrease of film thickness for a bulk after 90 seconds was measured. The sample was rated ○ when the decrease of film thickness was less than 1,200 Å, rated Δ when from 1,200 to 1,500 Å, and rated × when more than 1,500 Å.

As seen from Tables 5 and 6, the composition of the present invention causes less generation of cracking at the thermal flow process and has good resistance against dry etching.

According to the present invention, a positive resist composition reduced in the generation of cracking at the thermal flow process and excellent in the dry etching resistance, and a pattern formation method using the composition can be provided.

What is claimed is:

1. A positive resist composition comprising:

(A) a resin capable of increasing its solubility in an alkali developer under action of an acid, wherein the resin contains a repeating unit originated in an acrylic acid ester derivative in an amount of 50 to 100 mol % based on all repeating units and wherein the resin has repeating units of at least one kind selected from repeating units represented by the following formula (IV) and repeating units having groups represented by the following formula (V-1), (V-2), (V-3) and (V-4); and repeating units represented by the following formula (AII), (B) a compound capable of generating an acid upon irradiation with actinic rays or radiation, wherein the compound (B) contains a triaryl-sulfonium salt compound and a phenacylsulfonium salt compound, and (C) a mixed organic solvent comprising at least one solvent selected from the group consisting of a propylene glycol monoalkyl ether carboxylate, an alkyl lactate and a linear ketone; and a cyclic ketone:

(IV)

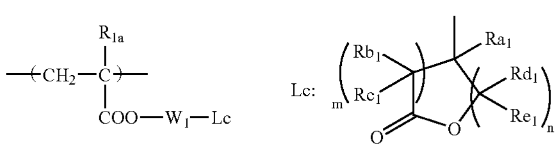

wherein $R_{1a}$ represents a hydrogen atom or a methyl group, $W_1$ represents a single bond or a divalent linking group, $Ra_1$, $Rb_1$, $Rc_1$, $Rd_1$ and $Re_1$ each independently represents a hydrogen atom or an alkyl group, m and n each independently represents an integer of 0 to 3, and m+n is from 2 to 6;

(V-1)

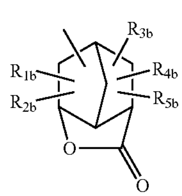

-continued (V-2)

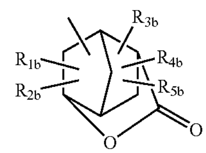

(V-3)

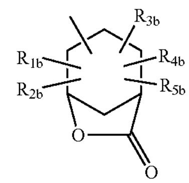

(V-4)

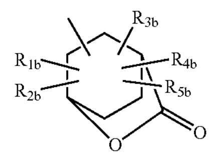

wherein $R_{1b}$ to $R_{5b}$ each independently represents a hydrogen atom, an alkyl group, a cycloalkyl group or an alkenyl group, and two of $R_{1b}$ to $R_{5b}$ may be combined with each other to form a ring;

(AII)

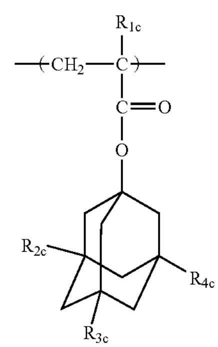

wherein $R_{1c}$ represents a hydrogen atom or a methyl group, and $R_{2c}$ to $R_{4c}$ each independently represents a hydrogen atom, a hydroxyl group, an alkoxy group, an acyloxy group or an alkyloxycarbonyloxy group, provided that one or two of $R_{2c}$ to $R_{4c}$ represents a hydroxyl group.

2. The composition according to claim 1, wherein the resin (A) contains a repeating unit originated in an acrylic acid ester derivative in an amount of 60 to 100 mol % based on all repeating units.

3. The positive resist composition according to claim 1, wherein in the resin (A), all repeating units are repeating units originated in an acrylic acid ester derivative.

4. The composition according to claim 1, wherein the cyclic ketone is contained in an amount 20 to 70% by weight based on the total amount of the organic solvent (C).

5. The composition according to claim 1, wherein the cyclic ketone is contained in an amount 30 to 60% by weight based on the total amount of the organic solvent (C).

6. The composition according to claim 1, wherein the resin (A) contains a repeating unit having an alkali-soluble group protected by a 1-adamantyl-1-alkyl group.

7. The composition according to claim 1, wherein the content of the repeating units represented by formula (IV) is from 20 to 70 mole % based on the total repeating units in the resin.

8. The composition according to claim 7, wherein the content of the repeating units represented by formula (IV) is from 25 to 60 mole % based on the total repeating units in the resin.

9. The composition according to claim 1, wherein the content of the repeating units represented by formulae (V-1) to (V-4) is from 20 to 70 mole % based on the total repeating units in the resin.

10. The composition according to claim 9, wherein the content of the repeating units represented by formulae (V-1) to (V-4) is from 25 to 60 mole % based on the total repeating units in the resin.

11. The composition according to claim 1, wherein the content of the repeating unit represented by formula (AII) is from 5 to 50 mole % based on the total repeating units in the resin.

12. The composition according to claim 11, wherein the content of the repeating unit represented by formula (AII) is from 10 to 40 mole % based on the total repeating units in the resin.

13. The composition according to claim 1, further comprising a nitrogen-containing basic compound.

14. The composition according to claim 1, further comprising at least one of fluorine-based and/or silicon-based surfactants.

15. A pattern formation method comprising steps of forming a resist film by using the positive resist composition claimed in claim 1, and exposing and developing said resist film.

* * * * *